United States Patent
Yasumoto et al.

(10) Patent No.: US 11,856,836 B2
(45) Date of Patent: Dec. 26, 2023

(54) SEMICONDUCTOR DEVICE COMPRISING ADHESIVE LAYER AND RESIN LAYER

(71) Applicant: Semiconductor Energy Laboratory Co., Ltd., Kanagawa-ken (JP)

(72) Inventors: Seiji Yasumoto, Tochigi (JP); Kayo Kumakura, Tochigi (JP); Yuka Sato, Tochigi (JP); Satoru Idojiri, Tochigi (JP); Hiroki Adachi, Tochigi (JP); Kenichi Okazaki, Tochigi (JP)

(73) Assignee: Semiconductor Energy Laboratory Co., Ltd.

( * ) Notice: Subject to any disclaimer, the term of this patent is extended or adjusted under 35 U.S.C. 154(b) by 26 days.

(21) Appl. No.: 17/479,329

(22) Filed: Sep. 20, 2021

(65) Prior Publication Data

US 2022/0013754 A1   Jan. 13, 2022

Related U.S. Application Data

(63) Continuation of application No. 16/493,104, filed as application No. PCT/IB2018/051417 on Mar. 6, 2018, now Pat. No. 11,133,491.

(30) Foreign Application Priority Data

Mar. 16, 2017 (JP) .................................. 2017-050894
May 18, 2017 (JP) .................................. 2017-098999

(51) Int. Cl.
*H01L 27/15* (2006.01)
*H10K 71/00* (2023.01)
(Continued)

(52) U.S. Cl.
CPC ......... *H10K 71/00* (2023.02); *H10K 50/8426* (2023.02); *H10K 71/40* (2023.02); *H10K 77/111* (2023.02)

(58) Field of Classification Search
CPC ...... H10K 71/00; H10K 71/111; H10K 71/40; H10K 50/8426
(Continued)

(56) References Cited

U.S. PATENT DOCUMENTS 6,586,081 B1   7/2003   Nishinaka et al.
7,179,519 B2   2/2007   Nishinaka et al.
(Continued)

FOREIGN PATENT DOCUMENTS

JP   2002-083966 A   3/2002
JP   2007-012917 A   1/2007
(Continued)

OTHER PUBLICATIONS

Indian Office Action (Application No. 201917037264) dated Feb. 2, 2022.
(Continued)

*Primary Examiner* — Phuc T Dang
(74) *Attorney, Agent, or Firm* — Husch Blackwell LLP

(57) ABSTRACT

A high-yield fabricating method of a semiconductor device including a peeling step is provided.
A peeling method includes a step of stacking and forming a first material layer and a second material layer over a substrate and a step of separating the first material layer and the second material layer from each other. The second material layer is formed over the substrate with the first material layer therebetween. The first material layer includes a first compound layer in contact with the second material layer and a second compound layer positioned closer to the substrate side than the first compound layer is. The first compound layer has the highest oxygen content among the layers included in the first material layer. The second compound layer has the highest nitrogen content among the layers included in the first material layer. The second mate-
(Continued)

rial layer includes a resin. In the step of separating, the first material layer and the second material layer are separated from each other by irradiation of an interface between the first material layer and the second material layer or the vicinity of the interface with light.

14 Claims, 43 Drawing Sheets

(51) Int. Cl.
  *H10K 50/842* (2023.01)
  *H10K 71/40* (2023.01)
  *H10K 77/10* (2023.01)
(58) Field of Classification Search
  USPC .......................................................... 257/79
  See application file for complete search history.

(56) References Cited

U.S. PATENT DOCUMENTS

| | | | |
|---|---|---|---|
| 7,521,383 | B2 | 4/2009 | Morisue et al. |
| 8,759,126 | B2 | 6/2014 | Kuranaga et al. |
| 8,963,171 | B2 | 2/2015 | Kuranaga et al. |
| 9,203,045 | B2 | 12/2015 | Ohsawa et al. |
| 9,246,011 | B2 | 1/2016 | Yamazaki et al. |
| 9,373,808 | B2 | 6/2016 | Ohsawa et al. |
| 9,397,001 | B2 | 7/2016 | Tanaka |
| 9,583,601 | B2 | 2/2017 | Yamazaki et al. |
| 9,623,637 | B2 | 4/2017 | Tanaka |
| 9,876,185 | B2 | 1/2018 | Ohsawa et al. |
| 9,997,737 | B2 * | 6/2018 | Watabe ............... H01L 51/0016 |
| 10,121,903 | B2 | 11/2018 | Yamazaki et al. |
| 2003/0057422 | A1 * | 3/2003 | Yamazaki ........... H01L 51/5246 257/79 |
| 2003/0178618 | A1 | 9/2003 | Murakami |
| 2007/0004233 | A1 | 1/2007 | Morisue et al. |
| 2007/0207571 | A1 | 9/2007 | Morisue et al. |
| 2010/0096633 | A1 * | 4/2010 | Hatano ............... H01L 51/5253 257/E33.056 |
| 2011/0260180 | A1 | 10/2011 | Kuranaga et al. |
| 2014/0084310 | A1 | 3/2014 | Miura et al. |
| 2014/0145168 | A1 | 5/2014 | Ohsawa et al. |
| 2014/0151686 | A1 | 6/2014 | Yamazaki et al. |
| 2015/0144909 | A1 | 5/2015 | Byun et al. |
| 2015/0344360 | A1 | 12/2015 | Tanaka |
| 2015/0380680 | A1 * | 12/2015 | Sakuishi ............. H01L 51/0013 438/26 |
| 2016/0071918 | A1 | 3/2016 | Shishido |
| 2016/0141397 | A1 | 5/2016 | Yamazaki et al. |
| 2016/0172244 | A1 | 6/2016 | Tanaka |
| 2017/0162718 | A1 | 6/2017 | Yamazaki et al. |
| 2017/0301860 | A1 | 10/2017 | Yamazaki et al. |
| 2018/0061638 | A1 | 3/2018 | Yamazaki et al. |

FOREIGN PATENT DOCUMENTS

| | | | |
|---|---|---|---|
| JP | 2007-264609 | A | 10/2007 |
| JP | 2011-227369 | A | 11/2011 |
| JP | 2013-239650 | A | 11/2013 |
| JP | 2014-175463 | A | 9/2014 |
| JP | 2014-197529 | A | 10/2014 |
| JP | 2014-197664 | A | 10/2014 |
| JP | 2015-223823 | A | 12/2015 |
| JP | 2016-005899 | A | 1/2016 |
| JP | 2016-115930 | A | 6/2016 |
| KR | 2000-0062841 | A | 10/2000 |
| KR | 2014-0039955 | A | 4/2014 |
| KR | 2015-0013734 | A | 2/2015 |
| TW | 201405693 | | 2/2014 |
| WO | WO 2013/172110 | A1 | 11/2013 |

OTHER PUBLICATIONS

International Search Report (Application No. PCT/IB2018/051417) dated Jun. 12, 2018.

Written Opinion (Application No. PCT/IB2018/051417) dated Jun. 12, 2018.

* cited by examiner

FIG. 1A
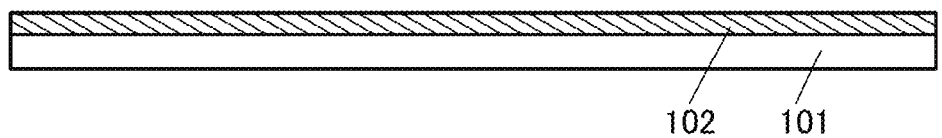
FIG. 1B
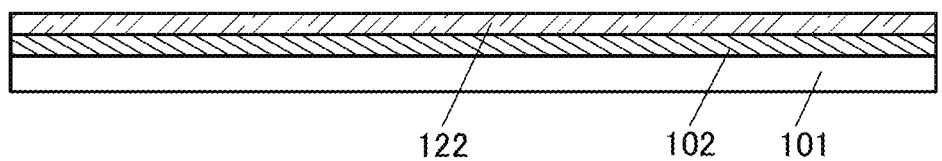
FIG. 1C1
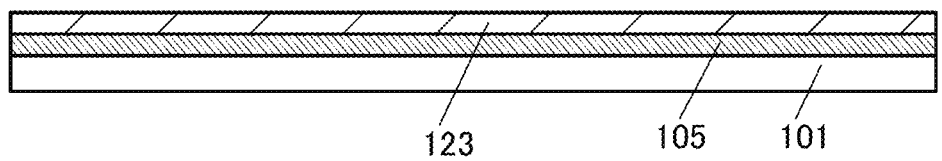
FIG. 1C2
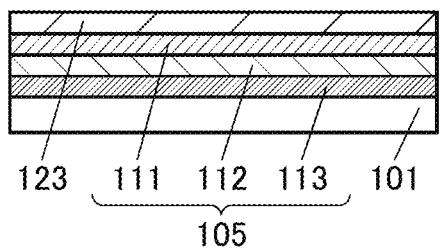
FIG. 1C3
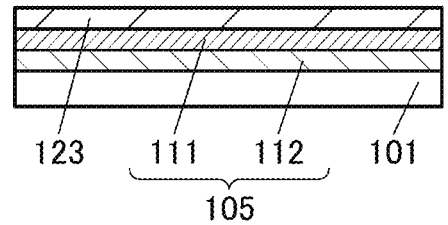

FIG. 2A
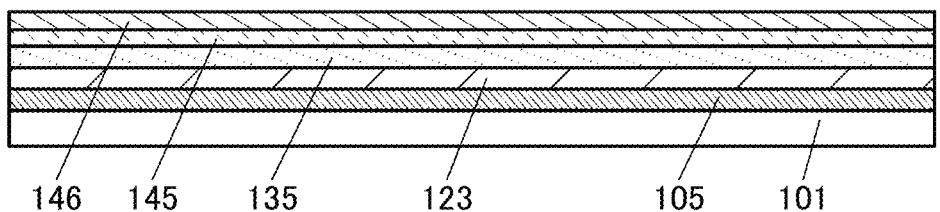
FIG. 2B
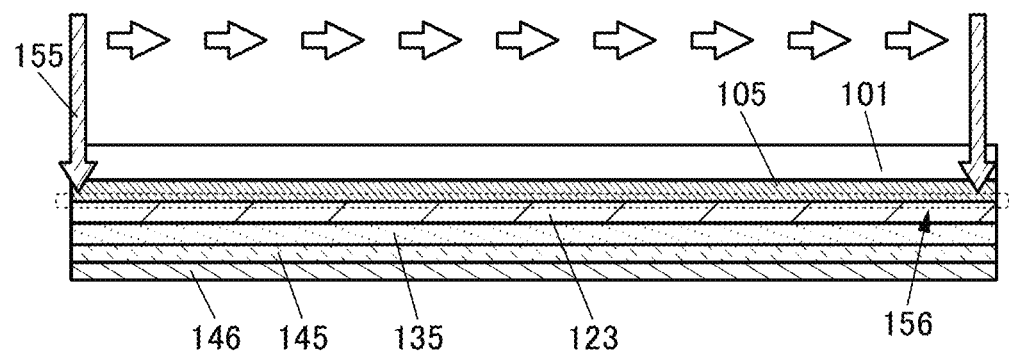
FIG. 2C1
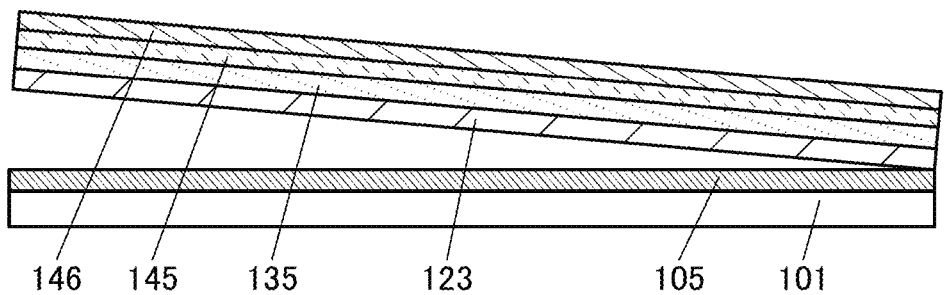
FIG. 2C2
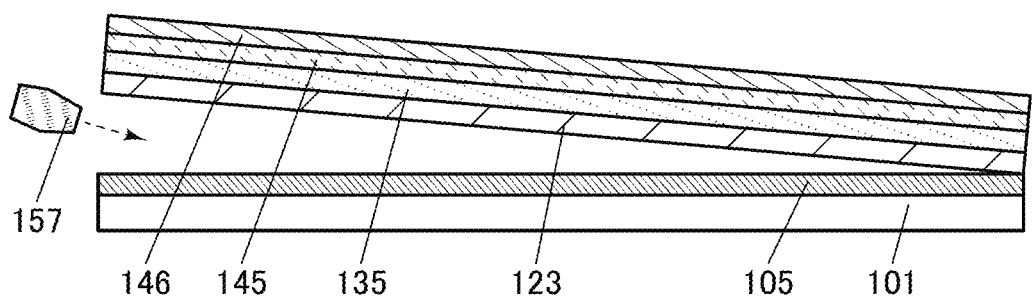

FIG. 4A
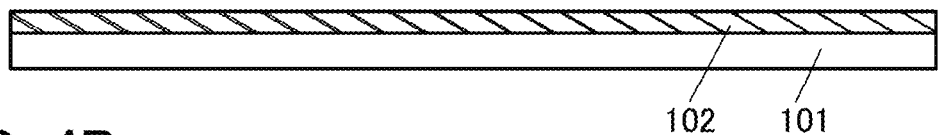
FIG. 4B
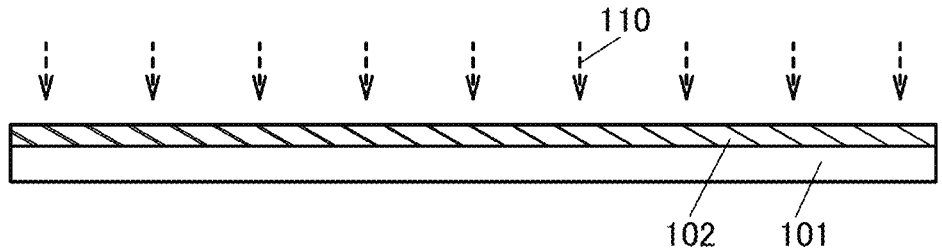
FIG. 4C
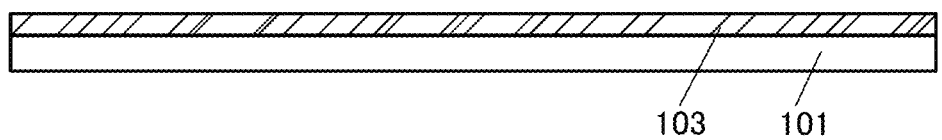
FIG. 4D
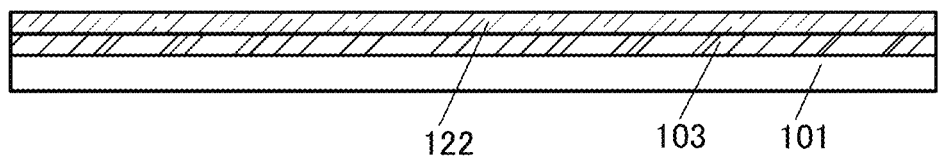
FIG. 4E1
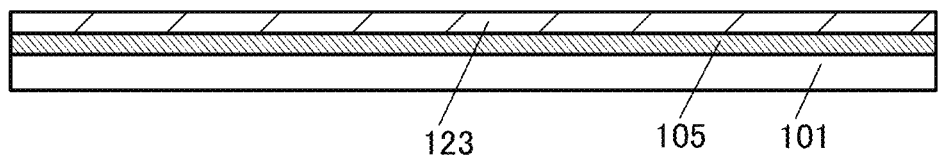
FIG. 4E2
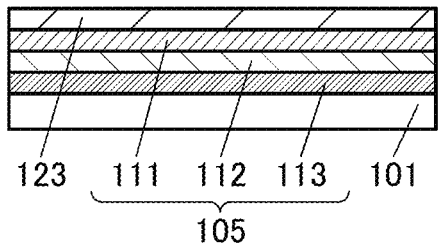
FIG. 4E3
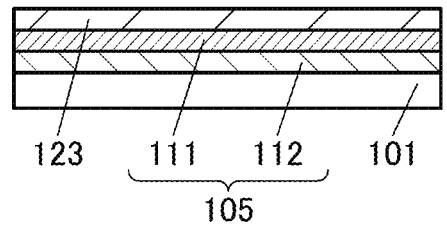

FIG. 5A
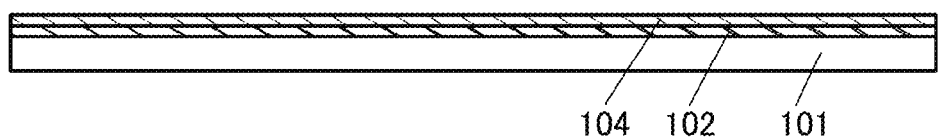
FIG. 5B
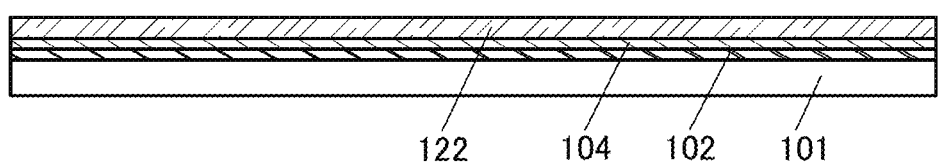
FIG. 5C1
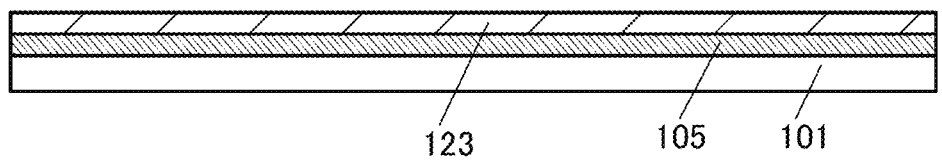
FIG. 5C2
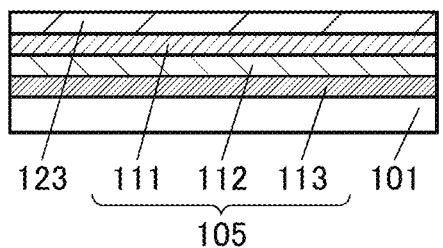
FIG. 5C3
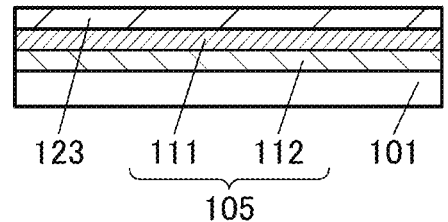

FIG. 6A
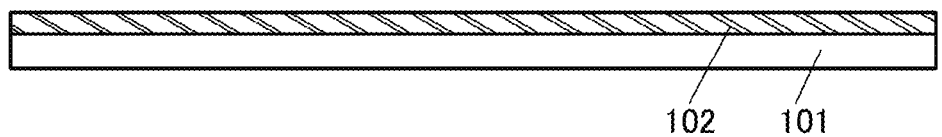
FIG. 6B1
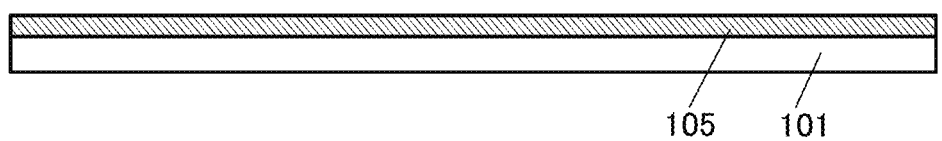
FIG. 6B2 　　　　　FIG. 6B3
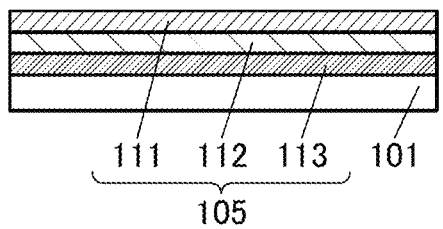 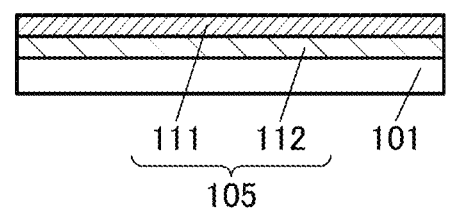
FIG. 6C
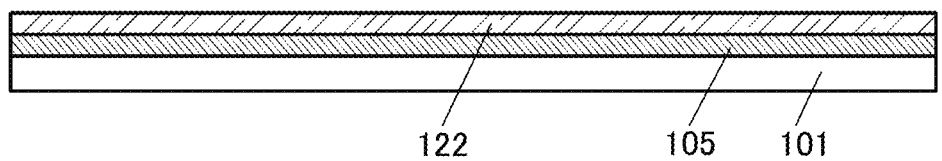
FIG. 6D1
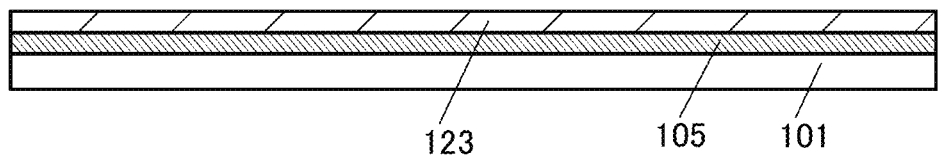
FIG. 6D2 　　　　　FIG. 6D3
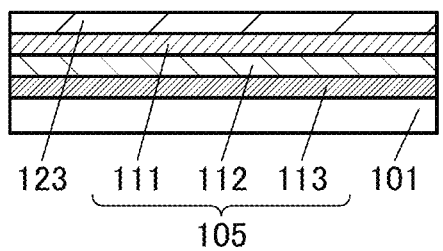 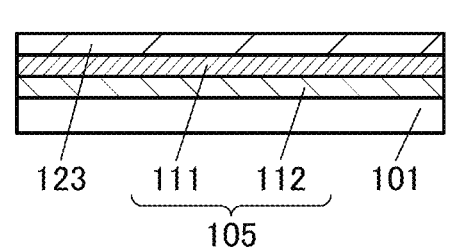

FIG. 7A1
FIG. 7A2
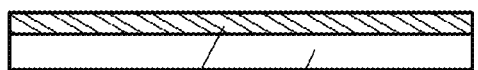
FIG. 7B1
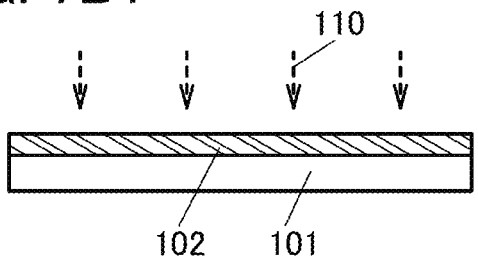
FIG. 7B2
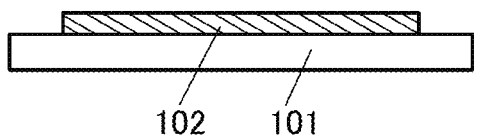
FIG. 7C1
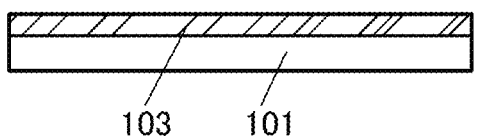
FIG. 7C2
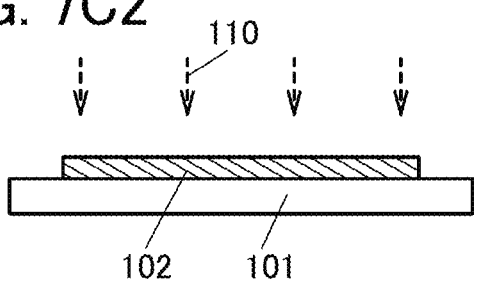
FIG. 7D1
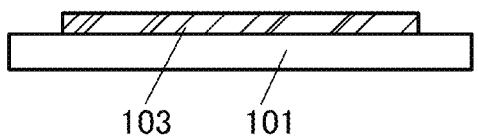
FIG. 7D2
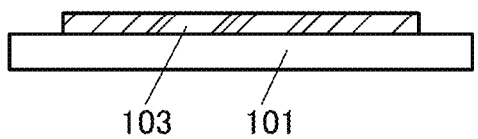
FIG. 7E
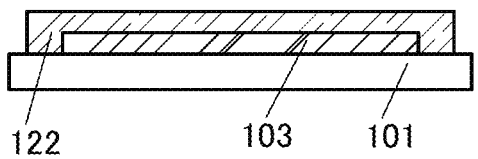
FIG. 7F
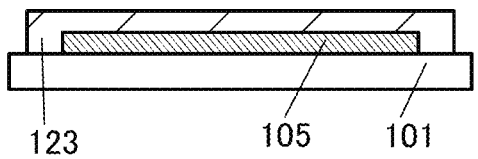

FIG. 12A
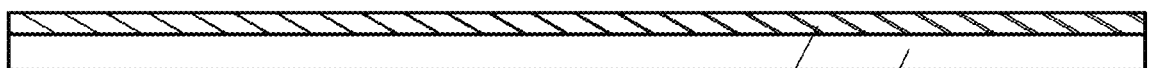
FIG. 12B
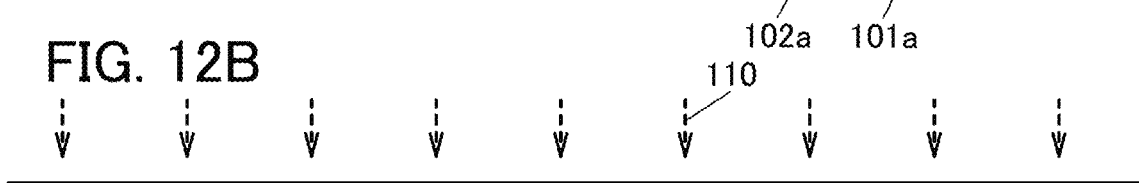
FIG. 12C
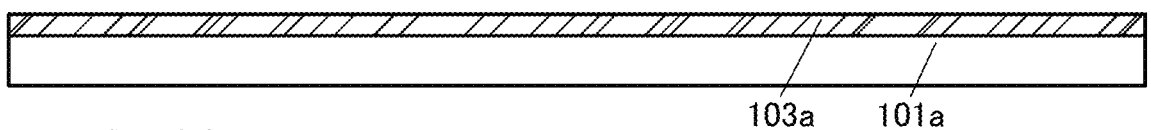
FIG. 12D
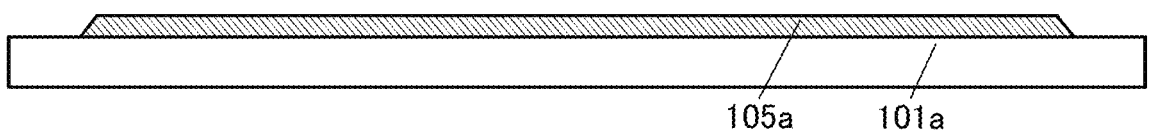
FIG. 12E
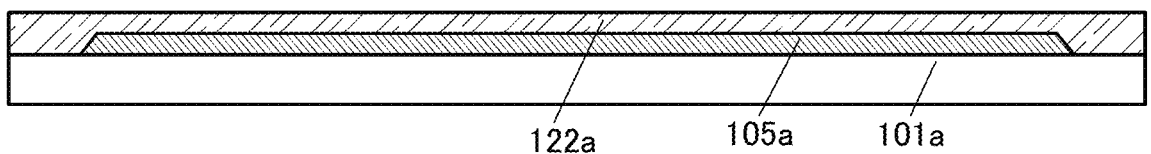
FIG. 12F1
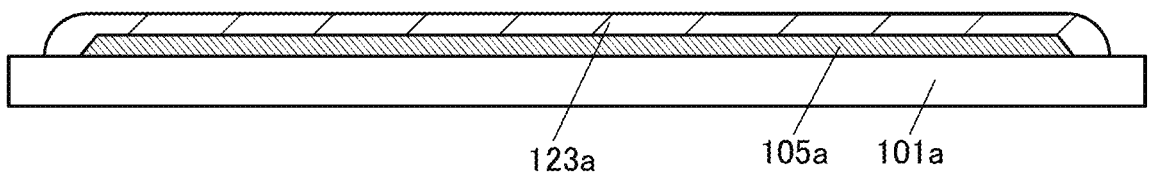
FIG. 12F2                    FIG. 12F3
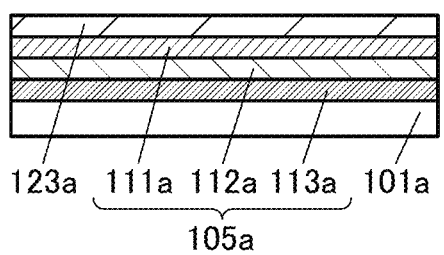        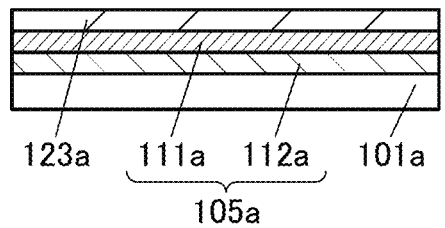

FIG. 36A1
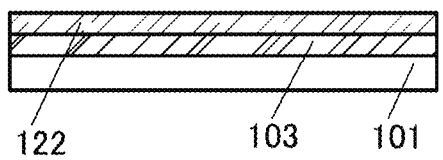
FIG. 36A2
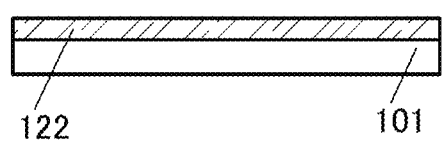
FIG. 36B1
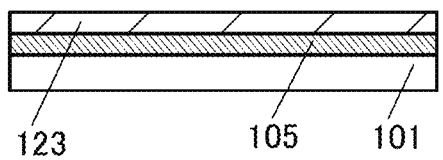
FIG. 36B2
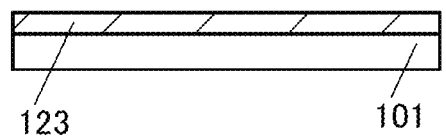
FIG. 36C1
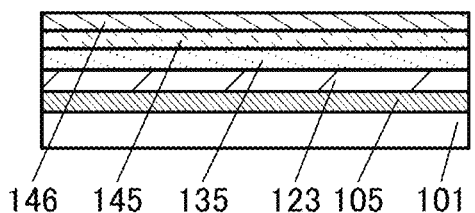
FIG. 36C2
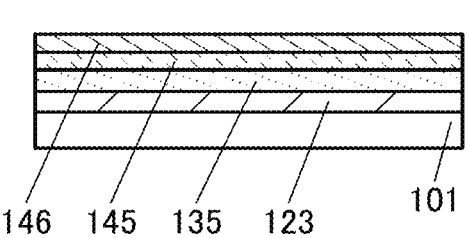
FIG. 36D1
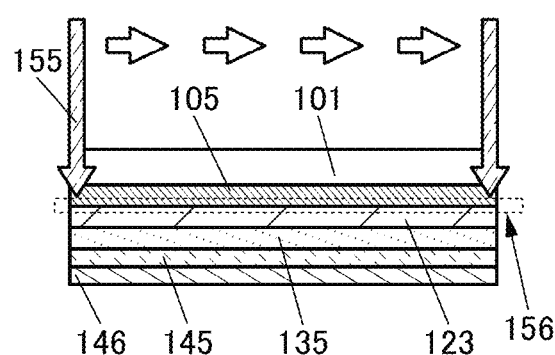
FIG. 36D2
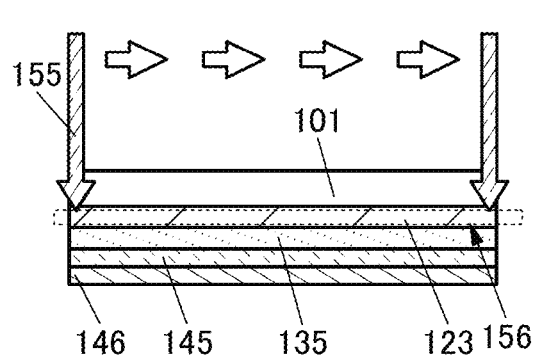
FIG. 36E1
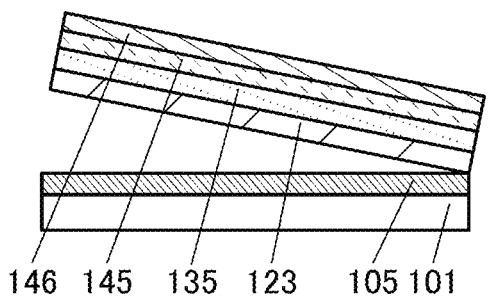
FIG. 36E2
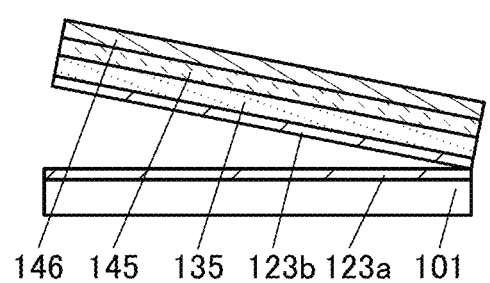

Sample G1
Formation substrate 101 side

Sample G1
Substrate 146 side

Comparative sample G2
Formation substrate 101 side

Comparative sample G2
Substrate 146 side

Before bending test
Bended portion

After bending test
Bended portion

SEMICONDUCTOR DEVICE COMPRISING ADHESIVE LAYER AND RESIN LAYER

This application is a continuation of copending U.S. application Ser. No. 16/493,104, filed on Sep. 11, 2019 (now U.S. Pat. No. 11,133,491 issued Sep. 28, 2021) which is a 371 of international application PCT/IB2018/051417 filed on Mar. 6, 2018 which are all incorporated herein by reference.

TECHNICAL FIELD

One embodiment of the present invention relates to a peeling method, a fabrication method of a semiconductor device, and a fabrication method of a display device. One embodiment of the present invention relates to a semiconductor device and a display device.

Note that one embodiment of the present invention is not limited to the above technical field. Examples of the technical field of one embodiment of the present invention include a semiconductor device, a display device, a light-emitting device, an electronic device, a lighting device, an input device (e.g., a touch sensor or the like), an input/output device (e.g., a touch panel or the like), a driving method thereof, and a manufacturing method thereof.

BACKGROUND ART

Display devices using organic electroluminescence (EL) elements or liquid crystal elements have been known. Other examples of display devices include a light-emitting device provided with a light-emitting element such as a light-emitting diode (LED), and electronic paper performing display with an electrophoretic method or the like.

The organic EL element has a basic structure in which a layer containing a light-emitting organic compound is provided between a pair of electrodes. When voltage is applied to the element, light emission from the light-emitting organic compound can be obtained. With the use of such an organic EL element, thin, lightweight, high-contrast, and low-power-consumption display devices can be achieved.

In addition, when a semiconductor element such as a transistor and a display element such as an organic EL element are formed over a substrate (a film) having flexibility, a flexible display device can be achieved.

Disclosed in Patent Document 1 is a method for fabricating a flexible display device in which a supporting substrate (a glass substrate) provided with a heat-resistant resin layer and electronic elements with a sacrificial layer therebetween is irradiated with laser light and the heat-resistant resin layer is peeled from the glass substrate.

PRIOR ART DOCUMENT

Patent Document

[Patent Document 1] Japanese Published Patent Application No. 2015-223823

SUMMARY OF THE INVENTION

Problems to be Solved by the Invention

An object of one embodiment of the present invention is to provide a novel peeling method, a novel fabrication method of a semiconductor device, or a novel fabrication method of a display device. An object of one embodiment of the present invention is to provide a peeling method, a fabrication method of a semiconductor device, or a fabrication method of a display device each having a low cost and a high mass productivity. An object of one embodiment of the present invention is to provide a high-yield peeling method. An object of one embodiment of the present invention is to fabricate a semiconductor device or a display device using a large-sized substrate. An object of one embodiment of the present invention is to fabricate a semiconductor device or a display device at low temperatures.

An object of one embodiment of the present invention is to provide a display device with low power consumption. An object of one embodiment of the present invention is to provide a display device with high reliability. An object of one embodiment of the present invention is to reduce the thickness or weight of a display device. An object of one embodiment of the present invention is to provide a display device having flexibility or a curved surface. An object of one embodiment of the present invention is to provide a display device less likely to be broken. An object of one embodiment of the present invention is to provide a novel display device, a novel input/output device, a novel electronic device, or the like.

Note that the descriptions of these objects do not disturb the existence of other objects. One embodiment of the present invention does not need to achieve all the objects. Other objects can be derived from the descriptions of the specification, the drawings, and the claims.

Means for Solving the Problems

One embodiment of the present invention is a method for fabricating a semiconductor device including a step of stacking and forming a first material layer and a second material layer over a substrate and a step of separating the first material layer and the second material layer from each other. The second material layer is formed over the substrate with the first material layer therebetween. The first material layer includes a first compound layer in contact with the second material layer and a second compound layer positioned closer to the substrate side than the first compound layer is. The first compound layer has the highest oxygen content among the layers included in the first material layer. The second compound layer has the highest nitrogen content among the layers included in the first material layer. The second material layer includes a resin. In the step of separating, the first material layer and the second material layer are separated from each other by irradiation of an interface between the first material layer and the second material layer or the vicinity of the interface with light.

One embodiment of the present invention is a method for fabricating a semiconductor device including a step of forming a first material layer over a substrate, a step of forming a second material layer over the first material layer, a step of heating the first material layer and the second material layer in a stacked state, and a step of separating the first material layer and the second material layer from each other. In the step of heating, a first compound layer in contact with the second material layer and a second compound layer positioned closer to the substrate side than the first compound layer is are formed in the first material layer. The first compound layer has the highest oxygen content among the layers included in the first material layer. The second compound layer has the highest nitrogen content among the layers included in the first material layer. The second material layer includes a resin. In the step of separating, the first material layer and the second material layer are separated from each other by irradiation of an interface between the first material layer and the second material layer or the vicinity of the interface with light.

One embodiment of the present invention includes a step of forming a first material layer over a substrate, a step of heating the first material layer at a first temperature, a step of forming a second material layer over the first material layer heated at the first temperature, a step of heating the first material layer and the second material layer in a stacked state at a second temperature, and a step of separating the first material layer and the second material layer from each other. The first temperature is higher than the second temperature. In the step of heating at the first temperature, the first compound layer in contact with the second material layer and the second compound layer positioned closer to the substrate side than the first compound layer is are formed in the first material layer. The first compound layer has the highest oxygen content among the layers included in the first material layer. The second compound layer has the highest nitrogen content among the layers included in the first material layer. The second material layer includes a resin. In the step of separating, the first material layer and the second material layer are separated from each other by irradiation of an interface between the first material layer and the second material layer or the vicinity of the interface with light.

The first material layer preferably includes a third compound layer positioned closer to the substrate side than the second compound layer is.

The light for the irradiation preferably has a wavelength of greater than or equal to 180 nm and less than or equal to 450 nm. The light for the irradiation preferably has a wavelength of 308 nm or around 308 nm. The irradiation with the light is preferably performed with the use of a laser apparatus. The irradiation with the light is preferably performed with the use of a linear laser apparatus. An energy density of the light is preferably greater than or equal to 300 $mJ/cm^2$ and less than or equal to 360 $mJ/cm^2$.

The absorptance of the light by a stacked-layer structure of the substrate, the first material layer, and the second material layer is preferably higher than or equal to 80% and lower than or equal to 100%.

The first material layer preferably includes one or more of titanium, molybdenum, aluminum, tungsten, silicon, indium, zinc, gallium, tantalum, and tin. For example, it is preferable that the first compound layer include titanium oxide and the second compound layer include titanium nitride or titanium oxynitride.

The second material layer preferably has a region with a thickness of greater than or equal to 0.1 μm and less than or equal to 5 μm. The second material layer preferably includes a polyimide resin or an acrylic resin. The second material layer preferably has an average transmittance of light in a wavelength range of greater than or equal to 450 nm and less than or equal to 700 nm of 70% or higher.

The step of separating is preferably performed while a liquid is fed to the separation interface. The liquid preferably includes water.

The method for fabricating a semiconductor device of one embodiment of the present invention preferably includes a step of performing plasma treatment on a surface of the first material layer and a step of processing the first material layer subjected to the plasma treatment in an island-like shape. The second material layer is preferably formed to cover an end portion of the first material layer processed into the island-like shape. In the plasma treatment, the surface of the first material layer is preferably exposed to an atmosphere including one or both of oxygen and water vapor.

One embodiment of the present invention is a semiconductor device including a substrate, an adhesive layer, a resin layer, and a functional layer that are stacked in this order. The functional layer includes a transistor. Titanium is detected in surface analysis of a surface of the resin layer on the adhesive layer side. The surface analysis is preferably performed by time-of-flight secondary ion mass spectrometry.

For example, it is preferable that the transistor include a metal oxide in a channel formation region and the resin layer include a polyimide resin. Alternatively, it is preferable that the transistor include a metal oxide in the channel formation region and the resin layer include an acrylic resin. Alternatively, it is preferable that the transistor include hydrogenated amorphous silicon in the channel formation region and the resin layer include a polyimide resin. Alternatively, it is preferable that the transistor include hydrogenated amorphous silicon in the channel formation region and the resin layer include an acrylic resin. Alternatively, it is preferable that the transistor include polysilicon in the channel formation region and the resin layer include a polyimide resin. The substrate preferably has flexibility. Alternatively, it is preferable that the transistor include polysilicon in the channel formation region and the resin layer include an acrylic resin. The substrate preferably has flexibility.

Effect of the Invention

According to one embodiment of the present invention, a novel peeling method, a novel fabricating method of a semiconductor device, or a novel fabricating method of a display device can be provided. According to one embodiment of the present invention, a peeling method, a fabrication method of a semiconductor device, or a fabrication method of a display device each having a low cost and a high mass productivity can be provided. According to one embodiment of the present invention, a high-yield peeling method can be provided. According to one embodiment of the present invention, a semiconductor device or a display device using a large-sized substrate can be fabricated. According to one embodiment of the present invention, a semiconductor device or a display device can be fabricated at low temperatures.

According to one embodiment of the present invention, a display device with low power consumption can be provided. According to one embodiment of the present invention, a highly reliable display device can be provided. According to one embodiment of the present invention, the thickness or weight of a display device can be reduced. According to one embodiment of the present invention, a display device having flexibility or a curved surface can be provided. According to one embodiment of the present invention, a display device less likely to be broken can be provided. According to one embodiment of the present invention, a novel display device, a novel input/output device, a novel electronic device, or the like can be provided.

Note that the description of these effects does not preclude the existence of other effects. One embodiment of the present invention does not need to have all the effects. Other effects can be derived from the descriptions of the specification, the drawings, and the claims.

BRIEF DESCRIPTION OF THE DRAWINGS

FIGS. 1A-1C3 are cross-sectional views illustrating an example of a fabrication method of a semiconductor device.

FIGS. 2A-2C2 are cross-sectional views illustrating an example of a fabrication method of a semiconductor device.

FIGS. 4A-4E3 are cross-sectional views illustrating an example of a fabrication method of a semiconductor device.

FIGS. 5A-5C3 are cross-sectional views illustrating an example of a fabrication method of a semiconductor device.

FIGS. 6A-6D3 are cross-sectional views illustrating an example of a fabrication method of a semiconductor device.

FIGS. 7A1-7F are cross-sectional views illustrating examples of a fabrication method of a semiconductor device.

FIGS. 12A-12F3 are cross-sectional views illustrating an example of a fabrication method of a light-emitting device.

FIGS. 36A1-36E2 are cross-sectional views illustrating fabrication methods of samples in Examples 7 and 8.

MODE FOR CARRYING OUT THE INVENTION

Figure 3A:
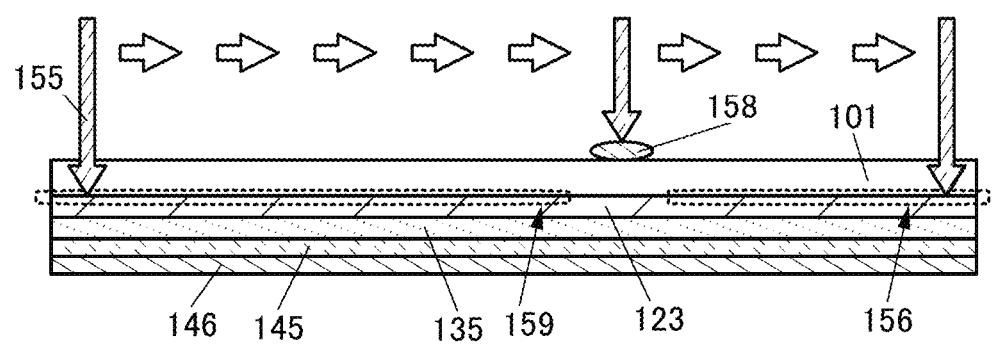
FIGS. 3A and 3B are cross-sectional views illustrating an example of a fabrication method of a semiconductor device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, similar functions are denoted by the same hatch pattern and are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". As another example, the term "insulating film" can be changed into the term "insulating layer".

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS FET can also be called a transistor including a metal oxide or an oxide semiconductor.

In this specification and the like, metal oxides containing nitrogen are also collectively referred to as a metal oxide in some cases. Moreover, a metal oxide containing nitrogen may be referred to as a metal oxynitride.

Embodiment 1

In this embodiment, a peeling method and a fabrication method of a semiconductor device that are embodiments of the present invention will be described with reference to FIG. 1 to FIG. 7.

<Peeling Method Overview>

In this embodiment, first, a first material layer and a second material layer are stacked over a substrate. Here, a metal compound layer is formed as the first material layer and a resin layer is formed as the second material layer. After that, the metal compound layer and the resin layer are separated from each other by light irradiation.

An interface between the metal compound layer and the resin layer or the vicinity thereof (also referred to as an interface or the vicinity of the interface) is preferably irradiated with the light. Furthermore, the inside of the metal compound layer may be irradiated with the light. Furthermore, the inside of the resin layer may be irradiated with the light. Note that in this specification and the like, "an interface between A and B or the vicinity thereof" and "an interface between A and B or the vicinity of the interface" each include at least the interface between A and B and also include a range from the interface between A and B to within 20% of the thickness of A or B.

The interface between the metal compound layer and the resin layer (as well as the inside of the metal compound layer and the inside of the resin layer) is heated by the light irradiation, and the adhesion (or adhesiveness) between the metal compound layer and the resin layer can be decreased. In addition, the metal compound layer and the resin layer can be separated from each other.

The metal compound layer preferably has a stacked-layer structure. The layers included in the stacked-layer structure preferably contain a common metal.

The metal compound layer preferably includes a first compound layer which is in contact with the resin layer and a second compound layer which is positioned closer to the substrate side than the first compound layer is. The first compound layer preferably has the highest oxygen content among the layers included in the metal compound layer. The second compound layer preferably has the highest nitrogen content among the layers included in the metal compound layer.

It is preferable that the metal compound layer further include a third compound layer that is closer to the substrate side than the second compound layer is. The third compound layer preferably contains oxygen and nitrogen.

It is considered that when such a metal compound layer including two or three layers is used, distortion is caused inside the metal compound layer, which facilitates separation between the metal compound layer and the resin layer. For example, the metal compound layer can have a structure in which a plurality of layers with different densities, stresses, or crystallinities are stacked.

Furthermore, when such a metal compound layer including two or three layers is used, the absorptance of the light by the metal compound layer sometimes increases. Furthermore, the absorption peak of the light can be formed at the interface between the metal compound layer and the resin layer or in the vicinity thereof in some cases. This probably facilitates division of the bond between the metal compound layer and the resin layer and separation between the metal compound layer and the resin layer.

Furthermore, the use of such a metal compound layer including two or three layers sometimes increases thermal conductivity in a film-plane direction (which can also be referred to as a direction substantially perpendicular to a film thickness direction, a direction substantially parallel to the formation surface of the metal compound layer, or the like). Here, when dust or the like is adhered to the light irradiation surface of the substrate, nonuniformity occurs in the light irradiation in some cases. Peeling might be more difficult in a region that has not been sufficiently irradiated with light than in the other regions. At this time, owing to the metal compound layer including a layer having high thermal conductivity in the film-plane direction, heat can be conducted to the region that has not been sufficiently irradiated with light and failure in peeling can be reduced.

For the metal compound layer, a layer that includes one or more of titanium, molybdenum, aluminum, tungsten, silicon, indium, zinc, gallium, tantalum, tin, hafnium, yttrium, zirconium, magnesium, lanthanum, cerium, neodymium, bismuth, and niobium can be used. The metal compound layer can contain a metal, an alloy, and a compound thereof (e.g., a metal oxide, a metal nitride, or a metal oxynitride). The metal compound layer preferably includes one or more of titanium, molybdenum, aluminum, tungsten, silicon, indium, zinc, gallium, tantalum, and tin.

For example, the first compound layer preferably includes titanium oxide ($TiO_a$ ($a>1$)). The second compound layer preferably includes titanium oxynitride ($TiO_bN_c$ ($b>0$, $c>0$)) or titanium nitride ($TiN_d$ ($d>0$)). The third compound layer preferably includes titanium oxide ($TiO_e$ ($0<e<a$)).

The resin layer preferably includes a polyimide resin or an acrylic resin, for example.

The proportion of an element in a layer can be analyzed by X-ray photoelectron spectroscopy (XPS), for example (hereinafter, referred to as XPS analysis). Specifically, depth-direction quantitative analysis can be performed by performing XPS analysis while a sample is etched (e.g., performing ion beam sputtering and XPS analysis alternately). In this specification and the like, a case where the analysis is performed from the first compound layer side (from the layer closest to the resin layer) is mainly described.

For example, the layers included in the metal compound layer can contain a common metal and can each include a region where the proportion of the metal is higher than or equal to 30 atomic % and lower than or equal to 70 atomic % in XPS analysis. It is particularly preferable that the proportion of the metal in the first compound layer be lower than that in the other layers.

The metal compound layer preferably includes, in the first compound layer, a region having the highest proportion of oxygen in XPS analysis. The first compound layer preferably includes a region in which the proportion of oxygen is higher than or equal to 40 atomic % and lower than or equal to 70 atomic % in XPS analysis.

The metal compound layer preferably includes, in the second compound layer, a region having the highest proportion of nitrogen in XPS analysis. The second compound layer preferably includes a region in which the proportion of nitrogen is higher than or equal to 10 atomic % and lower than or equal to 40 atomic % in XPS analysis.

The second compound layer preferably contains oxygen and nitrogen. Either of the proportion of oxygen and that of nitrogen may be higher in the second compound layer. For example, the second compound layer can include a region in which the proportion of oxygen is higher than or equal to 5 atomic % and lower than or equal to 60 atomic % in XPS analysis.

It is preferable that the third compound layer include a region in which the proportion of oxygen is lower than that in the first compound layer in XPS analysis. It is preferable that the third compound layer include a region in which the proportion of nitrogen is lower than that in the second compound layer in XPS analysis. Either of the proportion of a metal and that of oxygen may be higher in the third compound layer.

The first compound layer is preferably formed to have a sufficient thickness so that the surface state is made uniform. Specifically, the thickness of the first compound layer is preferably greater than or equal to 5 nm and less than or equal to 50 nm, further preferably greater than or equal to 10 nm and less than or equal to 30 nm. When the thickness of the first compound layer is less than 5 nm, the composition might be nonuniform and the yield of peeling sometimes decreases. Furthermore, although the thickness of the first compound layer can be larger than 50 nm, it is preferably smaller than or equal to 50 nm in which case the film formation time can be short. It is also suggested that when the first compound layer is too thick, the influence the second compound layer has on the peeling interface and the vicinity thereof is reduced. This also means that the thickness of the first compound layer is preferably within the above range.

The thickness of the second compound layer is not particularly limited and can be made thinner than the first compound layer, for example. For example, the second compound layer can have a thickness of greater than or equal to 5 nm and less than or equal to 15 nm.

The thickness of the third compound layer is not particularly limited. For example, the thickness of the third compound layer is preferably greater than or equal to 5 nm and less than or equal to 50 nm, further preferably greater than or equal to 10 nm and less than or equal to 30 nm. Although the thickness of the third compound layer can be greater than 50 nm, it is preferably less than or equal to 50 nm in which case the film formation time can be short.

In the case where the peeling method of this embodiment is employed, a metal contained in the metal compound layer might be detected by analyzing the surface of the resin layer exposed by peeling from the metal compound layer. For example, the surface of the resin layer can be analyzed by XPS, secondary ion mass spectrometry (SIMS), time-of-flight secondary ion mass spectrometry (ToF-SIMS), or the like. Specifically, in the case where a titanium compound is used for the metal compound layer, titanium can be detected from the surface of the resin layer.

Next, light irradiation will be described.

The light irradiation can be performed with a lamp, a laser apparatus, or the like.

The laser light irradiation is preferably performed with a linear laser apparatus. Laser apparatuses for the manufacturing lines for low temperature polysilicon (LTPS) and the like can be used, which enables effective use of the apparatuses.

The linear laser apparatus condenses light in a long rectangular shape (the light is shaped into a linear laser beam) so that the interface between the metal compound layer and the resin layer is irradiated with the light.

The irradiation light preferably has a wavelength of greater than or equal to 180 nm and less than or equal to 450 nm. Further preferably, the irradiation light preferably has a wavelength of 308 nm or around 308 nm.

In one embodiment of the present invention, it is preferable that the absorptance of laser light by the stacked-layer structure of the substrate, the first material layer (e.g., the metal compound layer), and the second material layer (e.g., the resin layer) be high. For example, the absorptance of light with a wavelength of 308 nm by the stacked-layer structure is preferably higher than or equal to 80% and lower than or equal to 100%, further preferably higher than or equal to 85% and lower than or equal to 100%. When most of the laser light is absorbed by the stacked-layer structure, the yield of peeling can be increased. Furthermore, a functional element can be inhibited from being irradiated with the laser light, so that a decrease in the reliability of the functional element can be suppressed.

The energy density of the light is preferably greater than or equal to 250 mJ/cm$^2$ and less than or equal to 400 mJ/cm$^2$, further preferably greater than or equal to 250 mJ/cm$^2$ and less than or equal to 360 mJ/cm$^2$.

In the case where the light irradiation is performed with a laser apparatus, the number of shots of laser light with which the same portion is irradiated can be greater than or equal to 1 shot and less than or equal to 50 shots, preferably greater than 1 shot and less than or equal to 10 shots, further preferably greater than 1 shot and less than or equal to 5 shots.

There are portions with low light intensity on both ends of the short axis of the beam. Accordingly, it is preferable that between one shot and the next shot be provided with a portion overlapping by greater than or equal to the width of the portion with low light intensity. Therefore, the number of laser light shots is preferably greater than or equal to 1.1 shots, further preferably greater than or equal to 1.25 shots.

Note that in this specification, the number of laser light shots refers to the number of times a point (a region) is irradiated with laser light, and is determined by a beam width, scanning speed, a frequency, an overlap percentage, or the like. Furthermore, there is an overlapping portion between a pulse and another pulse when a linear beam is moved in a scanning direction, i.e., between one shot and the next shot, and the overlapping ratio is referred to as an overlap percentage. Note that as the overlap percentage becomes closer to 100%, the number of shots is increased; as the overlap percentage becomes further from 100%, the number of shots is decreased; and as the scanning speed becomes higher, the number of shots is decreased.

That the number of shots of the laser light is 1.1 shots means that there is an overlap with a width of approximately one-tenth of the beam between two successive shots, and can mean that the overlap percentage is 10%. Similarly, 1.25 shots mean that there is an overlap with a width of approximately one-fourth of the beam between two successive shots, and can mean that the overlap percentage is 25%.

Here, the energy density of light used for irradiation in the laser crystallization step of LTPS is high, e.g., greater than or equal to 350 mJ/cm$^2$ and less than or equal to 400 mJ/cm$^2$. Furthermore, the number of laser shots needs to be large, e.g., greater than or equal to 10 shots and less than or equal to 100 shots.

Meanwhile, in one embodiment of the present invention, light irradiation for separating the metal compound layer and the resin layer from each other can be performed at a lower energy density or with a smaller number of shots than that used in the laser crystallization step. Accordingly, the number of substrates which can be treated by a laser apparatus can be increased. Furthermore, a reduction in the running costs of a laser apparatus such as a reduction in the frequency of maintenance of the laser apparatus is possible. Consequently, the fabrication costs of semiconductor devices and the like can be reduced.

Furthermore, since the light irradiation is performed at a lower energy density or with a smaller number of shots than that used in the laser crystallization step, damage to the substrate caused by the laser light irradiation can be reduced. Thus, the strength of the substrate is less likely to be reduced after the substrate is used once, and the substrate can be reused. Consequently, the costs can be reduced.

In this embodiment, the metal compound layer is placed between the substrate and the resin layer. With the use of the metal compound layer, in some cases, the light irradiation can be performed at a lower energy density or with a smaller number of shots than that in the case where the metal compound layer is not used.

If a foreign matter such as dust is adhered to the light irradiation surface of the substrate at the time of the light irradiation through the substrate, in some cases, nonuniformity occurs in the light irradiation and part with low peelability is generated, leading to a reduction in the yield of the step of separating the metal compound layer and the resin layer from each other. For that reason, it is preferable that the light irradiation surface be cleaned before or during the light irradiation. For example, the light irradiation surface of the substrate can be cleaned with an organic solvent such as acetone, water, or the like. Furthermore, the light irradiation may be performed while a gas is sprayed with an air knife. Thus, nonuniformity in the light irradiation can be reduced and the yield of the separation can be increased.

In the semiconductor device of this embodiment, the channel formation region of the transistor preferably includes a metal oxide. A metal oxide can function as an oxide semiconductor.

In the case where low temperature polysilicon (LTPS) is used for a channel formation region of a transistor, the resin layer is required to have heat resistance because a temperature of approximately 500° C. to 550° C. needs to be applied. Furthermore, in some cases, the resin layer is required to have a larger thickness to relieve the damage in a laser crystallization step.

In contrast, a transistor including a metal oxide in a channel formation region can be formed at a temperature lower than or equal to 350° C., or even lower than or equal to 300° C. Thus, the resin layer is not required to have high heat resistance. Accordingly, the upper temperature limit of the resin layer can be low, widening the range of choices for materials.

Furthermore, the transistor including a metal oxide in the channel formation region does not need a laser crystallization step. Furthermore, in this embodiment, the light irradiation can be performed at a lower energy density or a smaller number of shots than that under the condition used in the laser crystallization step. Furthermore, the resin layer is irradiated with the laser light without through the substrate in the laser crystallization step, whereas the resin layer is irradiated with the laser light through a formation substrate and a metal oxide layer in this embodiment. Since damage to the resin layer is low as described above, the resin layer can be thin. Since the resin layer is not required to have high heat resistance and can be thinned, the fabrication cost of a device can be expected to significantly fall. In addition, as compared with the case of using LTPS, the steps can be simplified, which is preferable.

Note that the semiconductor device of one embodiment of the present invention is not limited to the structure in which the transistor includes a metal oxide in the channel formation region. For example, in the semiconductor device of this embodiment, the transistor can include silicon in the channel formation region. As silicon, hydrogenated amorphous silicon (a-Si:H) or crystalline silicon can be used. As crystalline silicon, microcrystalline silicon, polycrystalline silicon, single crystal silicon, and the like can be given.

LTPS is preferably used for the channel formation region. Polycrystalline silicon, e.g., LTPS, can be formed at a lower temperature than single crystal silicon and has higher field effect mobility and higher reliability than amorphous silicon.

For the channel formation region, hydrogenated amorphous silicon is preferably used. As compared to crystalline silicon, hydrogenated amorphous silicon can be formed at low temperatures, has high productivity, and can be easily fabricated with the use of a large substrate.

The resin layer may have a thickness greater than or equal to 0.1 μm and less than or equal to 5 μm. When the resin layer is formed to be thin, the semiconductor device can be fabricated at low costs. In addition, the semiconductor device can be lightweight and thin. Furthermore, the semiconductor device can have higher flexibility.

The transmitting property with respect to visible light (also referred to as visible-light-transmitting property) of the resin layer is not particularly limited. For example, the resin layer may be a layer having a color or a transparent layer. When the resin layer is positioned on the display surface side of the display device and the resin layer is colored (has a color), a problem such as a reduced light extraction efficiency, a change in the color of the extracted light, or reduced display quality might occur.

The resin layer can be removed with a wet etching apparatus, a dry etching apparatus, an ashing apparatus, or the like. In particular, removing the resin layer by ashing using oxygen plasma is favorable.

In this embodiment, the metal compound layer is provided between the substrate and the resin layer. Since the metal compound layer has a function of absorbing light, the effect of light irradiation can be achieved even when the resin layer has low light absorptance. Accordingly, the resin layer having high visible-light transmittance can be used. Therefore, even when the resin layer is located on the display surface side of the display device, high display quality can be achieved. Moreover, a step of removing the resin layer which is colored (has a color) to enhance the display quality can be omitted. In addition, the range of choices for the material of the resin layer is widened.

The average value of the transmittance of light with a wavelength greater than or equal to 450 nm and less than or equal to 700 nm through the resin layer is preferably higher than or equal to 70% and lower than or equal to 100%, further preferably higher than or equal to 80% and lower than or equal to 100%, still further preferably higher than or equal to 90% and lower than or equal to 100%. The average value of the transmittance of light with a wavelength greater than or equal to 400 nm and less than or equal to 700 nm through the resin layer is preferably higher than or equal to 70% and lower than or equal to 100%, further preferably higher than or equal to 80% and lower than or equal to 100%, still further preferably higher than or equal to 90% and lower than or equal to 100%.

The resin layer preferably has a high transmitting property with respect to visible light, in which case the light extraction efficiency does not easily decrease even when the resin layer remains on the display surface side after peeling. An acrylic resin has a high transmitting property with respect to visible light and is thus suitable as a material for the resin layer. When the baking temperature of an acrylic resin is low, the transmitting property with respect to visible light can be high. The baking temperature of an acrylic resin is preferably higher than or equal to 200° C. and lower than or equal to 350° C., and further preferably higher than or equal to 250° C. and lower than or equal to 300° C.

In this embodiment, the transistor or the like is formed at a temperature lower than or equal to the upper temperature limit of the resin layer. The heat resistance of the resin layer can be evaluated by, for example, heat-induced weight loss percentage, specifically, 5% weight loss temperature. In the peeling method of this embodiment and the fabrication method of a semiconductor device of this embodiment, the maximum temperature in the process can be low. For example, in this embodiment, the 5% weight loss temperature of the resin layer can be higher than or equal to 200° C. and lower than or equal to 650° C., higher than or equal to 200° C. and lower than or equal to 500° C., higher than or equal to 200° C. and lower than or equal to 400° C., or higher than or equal to 200° C. and lower than or equal to 350° C. Thus, the range of choices for materials is widened. Note that the 5% weight loss temperature of the resin layer may be higher than 650° C.

Before or during the separation, a water-containing liquid is preferably fed to the separation interface. Water present at the separation interface further reduces adhesion or adhesiveness between the resin layer and the metal compound layer and can reduce the force required for the separation. Furthermore, feeding a water-containing liquid to the separation interface sometimes weakens or cuts a bond between the resin layer and the metal compound layer. A chemical bond with the liquid is utilized to cut a bond between the resin layer and the metal compound layer, which allows the separation to proceed. For example, in the case where a hydrogen bond is formed between the resin layer and the metal compound layer, it can be assumed that feeding the water-containing liquid forms a hydrogen bond between the water and the resin layer or the metal compound layer to cut the hydrogen bond between the resin layer and the metal compound layer.

The metal compound layer preferably has low surface tension and high wettability with respect to a water-containing liquid. In that case, the water-containing liquid can be distributed over the entire surface of the metal compound layer and can be easily fed to the separation interface. Distribution of the water over the entire metal compound layer leads to uniform peeling.

The contact angle between the metal compound layer and the water-containing liquid is preferably greater than 0° and less than or equal to 60°, further preferably greater than 0° and less than or equal to 50°. Note that when the wettability with respect to the water-containing liquid is extremely high (e.g., when the contact angle is approximately 20° or less), it is sometimes difficult to obtain an accurate value of the contact angle. The higher the wettability of the metal compound layer with respect to the water-containing liquid, the better; therefore, the wettability with respect to the water-containing liquid may be high enough to prevent an accurate value of the contact angle from being obtained.

The water-containing liquid present at the separation interface can inhibit an adverse effect of static electricity that is caused at the time of separation on a functional element (e.g., breakage of a semiconductor element due to static electricity). Furthermore, static electricity on a surface of the functional layer which is exposed by the separation may be removed with an ionizer or the like.

In the case where a liquid is fed to the separation interface, the surface of the functional layer which is exposed by the separation may be dried.

A peeling method will be specifically described below.

In this embodiment, a semiconductor device including a transistor will be described as an example. The semiconductor device can be a flexible device by using a flexible material for a substrate. Note that one embodiment of the present invention is not limited to the semiconductor device and can be applied to a variety of devices such as a semiconductor device using a different functional element, a light-emitting device, a display device, and an input/output device.

Note that thin films (e.g., insulating films, semiconductor films, or conductive films) included in any of a variety of devices can be formed by a sputtering method, a chemical vapor deposition (CVD) method, a vacuum evaporation method, a pulsed laser deposition (PLD) method, an atomic layer deposition (ALD) method, or the like. As the CVD method, a plasma-enhanced chemical vapor deposition (PECVD) method or a thermal CVD method may be used. As an example of the thermal CVD method, a metal organic chemical vapor deposition (MOCVD) method may be used.

The thin films (e.g., insulating films, semiconductor films, or conductive films) included in any of a variety of devices can be formed by a method such as spin coating, dipping, spray coating, ink-jetting, dispensing, screen printing, offset printing, a doctor knife, slit coating, roll coating, curtain coating, or knife coating.

When the thin films included in any of a variety of devices are processed, a lithography method or the like can be used for the processing. Alternatively, island-shaped thin films may be formed by a film formation method using a shadow mask. Alternatively, a nanoimprinting method, a sandblasting method, a lift-off method, or the like may be used for the processing of the thin films. As a photolithography method, there are a method in which a resist mask is formed over a thin film to be processed, the thin film is processed by etching or the like, and the resist mask is removed, and a method in which a photosensitive thin film is formed, and then exposed to light and developed to be processed into a desired shape.

In the case of using light in the lithography method, any of an i-line (a wavelength of 365 nm), a g-line (a wavelength of 436 nm), and an h-line (a wavelength of 405 nm), or combined light of any of them can be used for light exposure. Besides, ultraviolet light, KrF laser light, ArF laser light, or the like can be used. Furthermore, light exposure may be performed by liquid immersion light exposure technique. Furthermore, as the light used for the light exposure, extreme ultra-violet light (EUV) or X-rays may be used. Furthermore, instead of the light used for the light exposure, an electron beam can also be used. It is preferable to use extreme ultra-violet light, X-rays, or an electron beam because extremely minute processing can be performed. Note that in the case of performing light exposure by scanning of a beam such as an electron beam, a photomask is not needed.

For etching of thin films, a dry etching method, a wet etching method, a sandblast method, or the like can be used.

<Peeling Method Example 1>

Here, a peeling method is described which includes a step of forming a first material layer over a substrate; a step of forming a second material layer over the first material layer; a step of heating the first material layer and the second material layer in a stacked state; and a step of separating the first material layer and the second material layer from each other. The case where a semiconductor device including a transistor is fabricated by the peeling method is described as an example here. In the heating step, the first compound layer which is in contact with the second material layer and the second compound layer which is positioned closer to the substrate side than the first compound layer is are formed in the first material layer. The heating step can also serve as a step of curing the second material layer. Thus, the number of steps in manufacturing the semiconductor device can be reduced, and manufacturing cost can be reduced.

First, a metal layer 102 is formed over a formation substrate 101 (FIG. 1(A)). The metal layer 102 is a layer to be a metal compound layer 105 later.

The formation substrate 101 has rigidity high enough for easy transfer and has heat resistance to the temperature applied in the fabrication process. Examples of a material that can be used for the formation substrate 101 include glass, quartz, ceramics, sapphire, a resin, a semiconductor, a metal, and an alloy. Examples of the glass include alkali-free glass, barium borosilicate glass, and aluminoborosilicate glass.

For the metal layer 102, a variety of metals and alloys can be used, for example. For the metal layer 102, a layer that includes one or more of titanium, molybdenum, aluminum, tungsten, silicon, indium, zinc, gallium, tantalum, tin, hafnium, yttrium, zirconium, magnesium, lanthanum, cerium, neodymium, bismuth, and niobium can be used. The metal layer 102 preferably includes one or more of titanium, molybdenum, aluminum, tungsten, silicon, indium, zinc, gallium, tantalum, and tin.

The metal layer 102 further preferably has a thickness of greater than or equal to 10 nm and less than or equal to 100 nm, and still further preferably greater than or equal to 10 nm and less than or equal to 50 nm. By forming the metal layer 102 with a thickness of greater than or equal to 10 nm, a decrease in the yield of peeling can be suppressed. In addition, the thickness of the metal layer 102 is preferably less than or equal to 100 nm, further preferably less than or equal to 50 nm, in which case the film formation time can be short.

There is no particular limitation on a method for forming the metal layer 102. For example, the metal layer 102 can be formed by a sputtering method, a plasma-enhanced CVD method, an evaporation method, a sol-gel method, an electrophoretic method, a spray method, or the like.

Next, a first layer 122 is formed over the metal layer 102 (FIG. 1(B)). The first layer 122 is a layer to be a resin layer 123 later.

FIG. 1(B) illustrates an example in which the first layer 122 is formed over the entire surface of the metal layer 102 by a coating method. One embodiment of the present invention is not limited to this example and a printing method or the like may be employed to form the first layer 122. The first layer 122 having an island-like shape, the first layer 122 having an opening or an unevenness shape, or the like may be formed over the metal layer 102.

A variety of resin materials (including resin precursors) can be used to form the first layer 122.

The first layer 122 is preferably formed using a thermosetting material.

The first layer 122 may be formed using a material with photosensitivity or a material without photosensitivity (also called a non-photosensitive material).

When a photosensitive material is used, the resin layer 123 can be formed to have a desired shape by removing part of the first layer 122 by a lithography method using light.

The first layer 122 is preferably formed using a material containing a polyimide resin, a polyimide resin precursor, or an acrylic resin. The first layer 122 can be formed using, for example, a material containing a polyimide resin and a solvent, a material containing a polyamic acid and a solvent, a material containing an acrylic resin and a solvent, or the like. Note that a material containing a polyimide resin or a polyimide resin precursor is preferably used for the first layer 122, in which case the heat resistance can be relatively high. Meanwhile, a material containing an acrylic resin is preferably used for the first layer 122, in which case the transmitting property with respect to visible light can be high. A polyimide resin and an acrylic resin are each a material suitably used for a planarization film or the like of various kinds of devices such as a semiconductor device and a display device; thus, the film formation apparatus and the material can be shared. Thus, another apparatus and another material are not needed for achieving the structure of one embodiment of the present invention. Since the first layer 122 does not need a special material and can be formed using a resin material used for various kinds of devices such as a semiconductor device and a display device as described above, the cost can be reduced.

Other examples of resin materials which can be used to form the first layer 122 include an epoxy resin, a polyamide resin, a polyimide-amide resin, a siloxane resin, a benzocyclobutene-based resin, a phenol resin, and precursors of these resins.

The first layer 122 is preferably formed with a spin coater. With the use of a spin coating method, a thin film can be uniformly formed over a large-sized substrate.

The first layer 122 is preferably formed using a solution having a viscosity greater than or equal to 5 cP and less than 500 cP, further preferably greater than or equal to 5 cP and less than 100 cP, still further preferably greater than or equal to 10 cP and less than or equal to 50 cP. As the viscosity of the solution is lower, application is performed more easily. In addition, as the viscosity of the solution is lower, inclusion of air bubbles can be reduced more; thus, a high-quality film can be formed.

Alternatively, the first layer 122 can be formed by dipping, spray coating, ink-jetting, dispensing, screen printing, offset printing, a doctor knife, slit coating, roll coating, curtain coating, or knife coating, for example.

Next, heat treatment is performed in the state where the metal layer 102 and the first layer 122 are stacked, so that the metal compound layer 105 and the resin layer 123 are formed (FIG. 1(C1)).

By heating the metal layer 102, the metal compound layer 105 is formed. By heating the first layer 122, the resin layer 123 is formed.

Structure examples of the metal compound layer 105 are illustrated in FIGS. 1(C2) and 1(C3). The metal compound layer 105 illustrated in FIG. 1(C2) has a three-layer structure, and the metal compound layer 105 illustrated in FIG. 1(C3) has a two-layer structure. The metal compound layer 105 illustrated in FIGS. 1(C2) and 1(C3) includes a first compound layer 111 which is in contact with the resin layer 123 and a second compound layer 112 which is positioned closer to the formation substrate 101 side than the first compound layer 111 is. As illustrated in FIG. 1(C2), the metal compound layer 105 can further include a third compound layer 113 which is positioned closer to the formation substrate 101 side than the second compound layer 112 is. The metal compound layer 105 may have a stacked-layer structure of four or more layers.

The structure of the metal compound layer 105 can be checked by cross-sectional observation, or analysis in a depth direction (also referred to as a thickness direction). For example, the number of layers stacked, thickness, and the like of the metal compound layer 105 can be checked by cross-sectional observation using a scanning transmission electron microscope (STEM: scanning transmission electron microscopy), a transmission electron microscope (TEM), or the like. As described above, the proportion of an element in each layer can be checked by XPS. Alternatively, high-resolution TEM-energy dispersive X-ray spectroscopy (EDX) or the like can also be used.

The first compound layer 111 preferably has the highest oxygen content among the layers included in the metal compound layer 105. The second compound layer 112 preferably has the highest nitrogen content among the layers included in the metal compound layer 105. The third compound layer 113 preferably contains oxygen and nitrogen. The above description can also be referred to for the details of the layers.

The metal compound layer 105 preferably has a thickness of, for example, greater than or equal to 10 nm and less than or equal to 100 nm, further preferably greater than or equal to 10 nm and less than or equal to 50 nm. Note that in the case where the metal compound layer 105 is formed using the metal layer 102, the completed metal compound layer 105 is sometimes thicker than the formed metal layer 102.

The heat treatment can be performed while a gas containing one or more of oxygen, nitrogen, and a rare gas (e.g., argon) is supplied into a chamber of a heating apparatus, for example. Alternatively, the heat treatment can be performed in an air atmosphere with the use of a chamber of a heating apparatus, a hot plate, or the like.

The heat treatment is preferably performed while a nitrogen gas is supplied. In that case, nitrogen can be sufficiently contained in the metal compound layer 105.

When heating is performed in an air atmosphere or performed while a gas containing oxygen is supplied, the resin layer 123 is sometimes colored by oxidation to have a decreased transmitting property with respect to visible light. This also means that heating is preferably performed while a nitrogen gas is supplied. In that case, the heating atmosphere can contain less oxygen than an air atmosphere; thus, oxidation of the resin layer 123 can be inhibited and the resin layer 123 can have an increased transmitting property with respect to visible light.

By the heat treatment, gas components to be released (e.g., hydrogen, water, or the like) in the resin layer 123 can be reduced. In particular, the heating is preferably performed at a temperature higher than or equal to the formation temperature of each layer formed over the resin layer 123. Thus, a gas released from the resin layer 123 in the fabrication process of the transistor can be significantly reduced.

For example, in the case where the formation temperature of the transistor is lower than or equal to 350° C., a film to be the resin layer 123 is preferably heated at a temperature higher than or equal to 350° C. and lower than or equal to 450° C., further preferably higher than or equal to 350° C. and lower than or equal to 400° C., still further preferably higher than or equal to 350° C. and lower than or equal to 375° C. Thus, a gas released from the resin layer 123 in the fabrication process of the transistor can be significantly reduced.

The temperature of the heat treatment is preferably set to lower than or equal to the maximum temperature in fabricating the transistor. When the temperature of the heat treatment is set to lower than or equal to the maximum temperature in fabricating the transistor, a manufacturing apparatus for the fabrication process of the transistor, for example, can also be utilized, which can reduce additional capital investment and the like. As a result, the semiconductor device with reduced production costs can be obtained. When the formation temperature of the transistor is lower than or equal to 350° C., for example, the temperature of the heat treatment is preferably lower than or equal to 350° C.

The maximum temperature in fabricating the transistor is preferably equal to the temperature of the heat treatment, in which case it is possible to prevent the heat treatment from increasing the maximum temperature in fabricating the semiconductor device and it is also possible to reduce the gas components to be released in the resin layer 123.

Even when the heating temperature is relatively low, increasing the treatment time sometimes achieves separability equivalent to that under a condition with a higher heating temperature. It is thus preferable to increase the treatment time when the heating temperature cannot be increased owing to the structure of the heating apparatus.

The duration of the heat treatment is preferably longer than or equal to five minutes and shorter than or equal to 24 hours, further preferably longer than or equal to 30 minutes and shorter than or equal to 12 hours, still further preferably longer than or equal to one hour and shorter than or equal to six hours, for example. Note that the duration of the heat treatment is not limited thereto. For example, the duration of the heat treatment may be shorter than five minutes in the case where the heat treatment is performed by a rapid thermal annealing (RTA) method.

As the heating apparatus, it is possible to use a variety of apparatuses such as an electric furnace and an apparatus for heating an object by heat conduction or heat radiation from a heating element such as a resistance heating element. For example, an RTA apparatus such as a gas rapid thermal anneal (GRTA) apparatus or a lamp rapid thermal anneal (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment by using a high-temperature gas. With an RTA apparatus, the treatment time can be shortened and thus the RTA apparatus is preferred for mass production. Furthermore, the heat treatment may be performed using an in-line heating apparatus.

Note that the heat treatment sometimes changes the thickness of the resin layer 123 from the thickness of the first layer 122. For example, in some cases, the volume decreases when the solvent that was contained in the first layer 122 is removed or when the density increases with proceeding curing, which makes the thickness of the resin layer 123 smaller than that of the first layer 122.

Before the heat treatment, heat treatment (also referred to as pre-baking treatment) for removing the solvent contained in the first layer 122 may be performed. The temperature of the pre-baking treatment can be set as appropriate according to the material that is used. For example, it can be higher than or equal to 50° C. and lower than or equal to 180° C., higher than or equal to 80° C. and lower than or equal to 150° C., or higher than or equal to 90° C. and lower than or equal to 120° C. Alternatively, the heat treatment may double as the pre-baking treatment, and the solvent contained in the first layer 122 may be removed by the heat treatment.

The resin layer 123 has flexibility. The formation substrate 101 has lower flexibility than the resin layer 123 does.

The resin layer 123 preferably has a thickness greater than or equal to 0.01 μm and less than 10 μm, further preferably greater than or equal to 0.1 μm and less than or equal to 5 μm, still further preferably greater than or equal to 0.5 μm and less than or equal to 3 μm. By forming the resin layer thin, the semiconductor device can be fabricated at low costs. Furthermore, the semiconductor device can be lightweight and thin. Furthermore, the semiconductor device can have higher flexibility. With a solution having low viscosity, the resin layer 123 having a small thickness can be easily formed. Note that the thickness of the resin layer 123 is not limited thereto, and may be greater than or equal to 10 μm. For example, the resin layer 123 may have a thickness greater than or equal to 10 µm and less than or equal to 200 µm. The resin layer 123 having a thickness greater than or equal to 10 µm is favorable because the rigidity of the semiconductor device can be increased.

The resin layer 123 preferably has a thermal expansion coefficient greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. The lower the thermal expansion coefficient of the resin layer 123 is, the more the generation of a crack in a layer included in a transistor or the like and breakage of a transistor or the like which are caused owing to the heating can be prevented.

Next, a functional layer 135 is formed over the resin layer 123 (FIG. 2(A)).

For the functional layer 135, for example, an insulating layer and a functional element can be provided. Examples of the functional element include semiconductor elements such as a transistor; light-emitting elements such as an inorganic EL element, an organic EL element, and a light-emitting diode (LED); display elements such as a liquid crystal element, an electrophoretic element, and a display element using micro electromechanical systems (MEMS); and a sensor element.

The functional layer 135 preferably includes an insulating layer. The insulating layer preferably has a function of blocking hydrogen, oxygen, and water that are released from the metal compound layer 105, the resin layer 123, and the like in a later heating step.

The functional layer 135 preferably includes, for example, a silicon nitride film, a silicon oxynitride film, or a silicon nitride oxide film. For example, a silicon nitride film is formed by a plasma-enhanced CVD method using a film formation gas containing a silane gas, a hydrogen gas, and an ammonia ($NH_3$) gas. There are no particular limitations on the thickness of the insulating layer. The thickness can be, for example, greater than or equal to 50 nm and less than or equal to 600 nm, preferably greater than or equal to 100 nm and less than or equal to 300 nm.

Note that in this specification and the like, "silicon oxynitride" is a material that contains more oxygen than nitrogen in its composition. Moreover, in this specification and the like, "silicon nitride oxide" is a material that contains more nitrogen than oxygen in its composition.

Next, a protective layer is formed over the functional layer 135. The protective layer is a layer positioned on the outermost surface of the semiconductor device. The protective layer preferably includes an organic insulating film because it is possible to prevent the surface of the semiconductor device from being damaged or cracked.

FIG. 2(A) illustrates an example in which a substrate 146 is bonded onto the functional layer 135, with the use of an adhesive layer 145.

For the adhesive layer 145, a variety of curable adhesives such as a reactive curable adhesive, a thermosetting adhesive, an anaerobic adhesive, and a photocurable adhesive such as an ultraviolet curable adhesive can be used. Furthermore, an adhesive sheet or the like may be used.

For the substrate 146, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like can be used. For the substrate 146, a variety of materials such as glass, quartz, a resin, a metal, an alloy, and a semiconductor that are thin enough to be flexible may be used.

Next, the irradiation with laser light 155 is performed (FIG. 2(B)). The laser light 155 is, for example, a linear laser beam with which scanning is performed from the left side to the right side in FIG. 2(B), and the major axis is perpendicular to the scanning direction and the incident direction (from top to bottom). In the laser apparatus, the stack is placed with the formation substrate 101 being on the upper side. The stack is irradiated with the laser light 155 from the upper side of the stack (the formation substrate 101).

An interface between the metal compound layer 105 and the resin layer 123 or the vicinity thereof is preferably irradiated with the laser light 155 through the formation substrate 101 (see a processing region 156 in FIG. 2(B)). Furthermore, the inside of the metal compound layer 105 may be irradiated with the laser light 155 or the inside of the resin layer 123 may be irradiated with the laser light 155.

The metal compound layer 105 absorbs the laser light 155. The resin layer 123 may absorb the laser light 155.

The absorptance of the laser light 155 by the stacked-layer structure of the formation substrate 101 and the metal compound layer 105 is preferably higher than or equal to 50% and lower than or equal to 100%, further preferably higher than or equal to 75% and lower than or equal to 100%, still further preferably higher than or equal to 80% and lower than or equal to 100%. Most of the laser light 155 is absorbed by the stacked-layer structure, so that separation can be surely performed at the interface between the metal compound layer 105 and the resin layer 123. Furthermore, damage to the resin layer 123 due to light can be reduced.

The irradiation with the laser light 155 reduces adhesion or adhesiveness between the metal compound layer 105 and the resin layer 123. The resin layer 123 is embrittled by the irradiation with the laser light 155 in some cases.

As the laser light 155, light having a wavelength at which at least part of the laser light 155 is transmitted through the formation substrate 101 and absorbed by the metal compound layer 105 is selected and used. The laser light 155 is preferably light in a wavelength range from visible light to ultraviolet light. For example, light with a wavelength greater than or equal to 180 nm and less than or equal to 450 nm, preferably greater than or equal to 200 nm and less than or equal to 400 nm, further preferably greater than or equal to 250 nm and less than or equal to 350 nm, can be used.

The laser light 155 preferably has energy that is higher than the energy gap of the metal compound layer 105. For example, the energy gap of titanium oxide is approximately 3.2 eV. Thus, in the case where titanium oxide is used for the metal compound layer 105, light preferably has energy higher than 3.2 eV.

In particular, an excimer laser having a wavelength of 308 nm is preferably used because the productivity is high. The excimer laser is preferable because the excimer laser is used also for laser crystallization of LTPS, so that the existing LTPS manufacturing line apparatus can also be used and new capital investment is not necessary. The energy of the light with a wavelength of 308 nm is approximately 4.0 eV. That is, in the case where titanium oxide is used for the metal compound layer 105, an excimer laser with a wavelength of 308 nm is favorable. Furthermore, a solid-state UV laser (also referred to as a semiconductor UV laser), such as a UV laser having a wavelength of 355 nm which is the third harmonic of an Nd:YAG laser, may be used. A solid-state laser is preferable because the solid-state laser does not use a gas and thus the running costs can be reduced compared with those of an excimer laser. Furthermore, a pulsed laser such as a picosecond laser may be used.

In the case where linear laser light is used as the laser light 155, by relatively moving the formation substrate 101 and a light source, scanning with the laser light 155 is performed and the irradiation with the laser light 155 is performed across a region where separation is desirably caused.

Here, when a foreign matter 158 such as dust is adhered to the light irradiation surface of the formation substrate 101 as illustrated in FIG. 3(A), nonuniformity occurs in the light irradiation in some cases. FIG. 3(A) illustrates a comparative example where the resin layer 123 is formed over and in contact with the formation substrate 101. In FIG. 3(A), a region 159 irradiated with light is discontinuous in a portion directly below the foreign matter 158, at an interface between the formation substrate 101 and the resin layer 123 or in the vicinity thereof. That portion has lower peelability than the other portions, and thus, there is a concern that the yield of the step of separating the formation substrate 101 and the resin layer 123 is lowered.

Figure 3B:
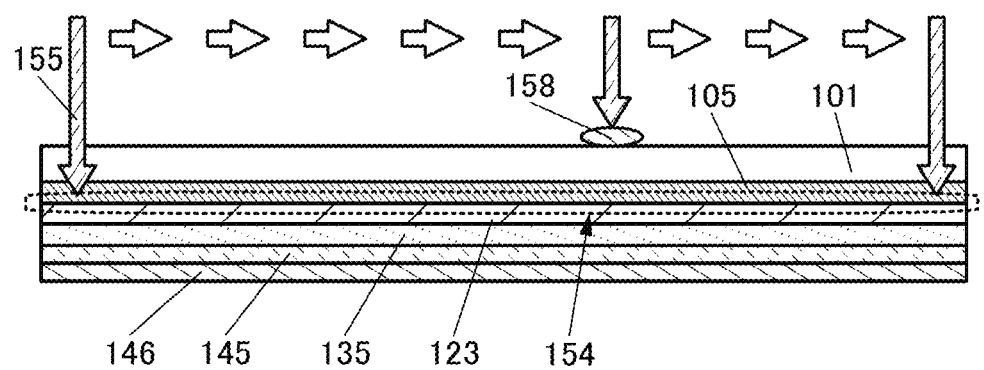

Meanwhile, in this embodiment, the metal compound layer 105 is formed between the formation substrate 101 and the resin layer 123. The metal compound layer 105 preferably includes a layer having high thermal conductivity. For example, in the case where the metal compound layer 105 illustrated in FIG. 3(B) has high thermal conductivity, heat is uniformly conducted to the entire metal compound layer 105 even when the metal compound layer 105 is partly heated. Therefore, even when the foreign matter 158 is adhered to the light irradiation surface of the formation substrate 101, heat is transferred to a portion of the metal compound layer 105 that is shielded by the foreign matter 158, so that formation of a portion having low peelability can be inhibited. As illustrated in FIG. 3(B), at the interface between the metal compound layer 105 and the resin layer 123 or in the vicinity thereof, a heated region 154 is formed on an entire surface including a portion directly below the foreign matter 158. Note that the heated region 154 is formed in the metal compound layer 105 in some cases.

At the interface between the metal compound layer 105 and the resin layer 123 or in the vicinity thereof, a region which is not irradiated with light may be provided in one place or a plurality of places. The areas of the regions which are not irradiated with light are not particularly limited and are each greater than or equal to 1 $\mu m^2$ and less than or equal to 1 $cm^2$, for example. The area of the region which is not irradiated with light may be less than or equal to 1 $\mu m^2$ or greater than or equal to 1 $cm^2$ in some cases.

Then, the formation substrate 101 and the resin layer 123 are separated from each other. Since the adhesion or adhesiveness between the metal compound layer 105 and the resin layer 123 is low, the separation occurs at the interface between the metal compound layer 105 and the resin layer 123 (FIG. 2(C1)). Furthermore, the separation occurs in the embrittled resin layer 123 in some cases.

The formation substrate 101 and the resin layer 123 can be separated from each other by applying a perpendicular tensile force to the resin layer 123, for example. Specifically, part of a top surface of the substrate 146 is suctioned and pulled up, whereby the resin layer 123 can be peeled from the formation substrate 101.

Here, the separation can be performed easily when a water-containing liquid such as water or an aqueous solution is added to the separation interface and the liquid penetrates into the separation interface. Furthermore, an adverse effect of static electricity caused during the separation on the functional element such as a transistor (e.g., breakage of a semiconductor element by static electricity) can be suppressed. FIG. 2(C2) illustrates an example in which a liquid is fed to the separation interface with a liquid feeding mechanism 157.

As the liquid to be fed, water (preferably pure water), a neutral, alkaline, or acidic aqueous solution, and an aqueous solution in which a salt is dissolved can be given. Furthermore, ethanol, acetone, and the like can be given. Furthermore, a variety of organic solvents may also be used.

Before the separation, a separation trigger may be formed by separating part of the resin layer 123 from the formation substrate 101. For example, the separation trigger may be formed by inserting a sharp instrument such as a knife between the formation substrate 101 and the resin layer 123. Alternatively, the separation trigger may be formed by cutting the resin layer 123 from the substrate 146 side with a sharp instrument. Alternatively, the separation trigger may be formed by a method using a laser, such as a laser ablation method.

In this embodiment, the metal compound layer 105 and the resin layer 123 are stacked and irradiated with light. As a result, the adhesion or adhesiveness between the metal compound layer 105 and the resin layer 123 can be lowered. Accordingly, the formation substrate 101 and the resin layer 123 can be easily separated from each other.

The use of the peeling method of this embodiment makes it possible to provide a fabrication method of a semiconductor device or a peeling method each having a low cost and a high mass productivity. For example, since the formation substrate 101 (e.g., a glass substrate) or a stack including the formation substrate 101 and the metal compound layer 105 can be repeatedly used multiple times in the peeling method of this embodiment, the production costs can be reduced.

In the peeling method of this embodiment, the metal compound layer 105 and the resin layer 123 that can be easily separated from each other by light irradiation are used, so that the peeling can be performed with a high yield. Furthermore, the heating step for forming (curing) the resin layer 123 forms the metal compound layer 105 at the same time and thus, an increase in the number of steps can be suppressed.

<Peeling Method Example 2>

In Peeling method example 1, the metal layer 102 was heated to form the metal compound layer 105. In this Peeling method example 2, the method is mainly described in which at least part of the metal layer 102 is oxidized to form a layer 103 containing a metal oxide and the layer 103 containing a metal oxide is heated to form the metal compound layer 105. The formation of the layer 103 containing a metal oxide enables reducing the force required for peeling and increasing the yield of peeling.

In the following peeling method example, steps similar to those in Peeling method example 1 are not described in detail.

First, the metal layer 102 is formed over the formation substrate 101 (FIG. 4(A)).

Next, at least part of the metal layer 102 is oxidized. FIG. 4(B) illustrates an example in which a surface of the metal layer 102 is irradiated with plasma 110. Thus, the layer 103 containing a metal oxide is formed (FIG. 4(C)).

The layer 103 containing a metal oxide includes a metal oxide. As examples of the metal oxide, titanium oxide ($TiO_x$), molybdenum oxide, aluminum oxide, tungsten oxide, indium tin oxide containing silicon (ITSO), indium zinc oxide, an In—Ga—Zn oxide, and the like can be given.

Besides, as the metal oxide, indium oxide, indium oxide containing titanium, indium oxide containing tungsten, indium tin oxide (ITO), ITO containing titanium, indium zinc oxide containing tungsten, zinc oxide (ZnO), ZnO containing gallium, hafnium oxide, yttrium oxide, zirconium oxide, gallium oxide, tantalum oxide, magnesium oxide, lanthanum oxide, cerium oxide, neodymium oxide, tin oxide, bismuth oxide, titanate, tantalate, niobate, and the like can be given.

In this Peeling method example 2, oxygen is introduced into the metal layer 102 after formation of the metal layer 102, to form the layer 103 containing a metal oxide. At this time, only the surface of the metal layer 102 or the entire metal layer 102 is oxidized. In the former case, the introduction of oxygen into the metal layer 102 forms a structure in which a metal layer and a metal oxide layer are stacked.

The oxidation of the metal layer 102 can be performed by heating the metal layer 102 in an oxygen-containing atmosphere. It is preferable that the metal layer 102 be heated while an oxygen-containing gas is supplied. The temperature at which the metal layer 102 is heated is preferably higher than or equal to 100° C. and lower than or equal to 500° C., further preferably higher than or equal to 100° C. and lower than or equal to 450° C., still further preferably higher than or equal to 100° C. and lower than or equal to 400° C., yet still further preferably higher than or equal to 100° C. and lower than or equal to 350° C.

The temperature at which the metal layer 102 is heated is preferably set to lower than or equal to the maximum temperature in fabricating the transistor. In that case, the maximum temperature in fabricating the semiconductor device can be prevented from increasing. When the temperature at which the metal layer is heated is set to lower than or equal to the maximum temperature in fabricating the transistor, a manufacturing apparatus for the fabricating process of the transistor, for example, can also be utilized, which can reduce additional capital investment and the like. As a result, the semiconductor device with reduced production costs can be obtained. When the formation temperature of the transistor is lower than or equal to 350° C., for example, the temperature of the heat treatment is preferably lower than or equal to 350° C.

Alternatively, the metal layer 102 can be oxidized by performing radical treatment on the surface of the metal layer 102. In the radical treatment, the surface of the metal layer 102 is preferably exposed to an atmosphere containing at least one of an oxygen radical and a hydroxy radical. For example, plasma treatment is preferably performed in an atmosphere containing one or both of oxygen and water vapor ($H_2O$).

The force required for separating the metal compound layer 105 and the resin layer 123 from each other can be reduced when hydrogen, oxygen, a hydrogen radical (H*), an oxygen radical (O*), a hydroxy radical (OH*), or the like is contained on the surface of the metal compound layer 105 or in the metal compound layer 105, which will be described in detail in Embodiment 2.

Performing radical treatment or plasma treatment on the surface of the metal layer 102 to oxidize the metal layer 102 eliminates the need for a step of heating the metal layer 102 at high temperatures. Accordingly, the maximum temperature in fabricating the semiconductor device can be prevented from increasing.

Alternatively, the layer 103 containing a metal oxide may be formed by forming a metal oxide film over the metal layer 102. For example, a metal oxide film is formed by a sputtering method while an oxygen-containing gas is supplied, whereby the layer 103 containing a metal oxide can be formed. Note that a metal oxide film may be formed directly on the formation substrate 101 without forming the metal layer 102. Also in the case where the layer 103 containing a metal oxide is formed by formation of the metal oxide film, a surface of the layer 103 containing a metal oxide is preferably subjected to radical treatment. In the radical treatment, the surface of the layer 103 containing a metal oxide is preferably exposed to an atmosphere containing at least one kind among an oxygen radical, a hydrogen radical, and a hydroxy radical. For example, plasma treatment is preferably performed in an atmosphere containing one or more of oxygen, hydrogen, and water vapor ($H_2O$).

As other introduction methods of oxygen, hydrogen, water, or the like, an ion implantation method, an ion doping method, a plasma immersion ion implantation method, and the like can be used.

The layer 103 containing a metal oxide preferably has a thickness of, for example, greater than or equal to 10 nm and less than or equal to 100 nm, further preferably greater than or equal to 10 nm and less than or equal to 50 nm. Note that in the case where the layer 103 containing a metal oxide is formed using the metal layer 102, the completed layer 103 containing a metal oxide is sometimes thicker than the formed metal layer 102.

The layer 103 containing a metal oxide preferably contains titanium oxide or tungsten oxide. Titanium oxide is preferably used because the cost can be lower than that when tungsten oxide is used.

Next, the first layer 122 is formed over the layer 103 containing a metal oxide (FIG. 4(D)).

Next, heat treatment is performed in the state where the layer 103 containing a metal oxide and the first layer 122 are stacked, so that the metal compound layer 105 and the resin layer 123 are formed (FIG. 4(E1)).

By heating the layer 103 containing a metal oxide, the metal compound layer 105 is formed. By heating the first layer 122, the resin layer 123 is formed.

Structure examples of the metal compound layer 105 are illustrated in FIGS. 4(E2) and 4(E3). The metal compound layer 105 illustrated in FIG. 4(E2) has a three-layer structure, and the metal compound layer 105 illustrated in FIG. 4(E3) has a two-layer structure. The metal compound layer 105 illustrated in FIGS. 4(E2) and 4(E3) includes the first compound layer 111 which is in contact with the resin layer 123 and the second compound layer 112 which is positioned closer to the formation substrate 101 side than the first compound layer 111 is. As illustrated in FIG. 4(E2), the metal compound layer 105 can further include the third compound layer 113 which is positioned closer to the formation substrate 101 side than the second compound layer 112 is.

For the following steps, the step in FIG. 2(A) and the subsequent steps in Peeling method example 1 can be referred to.

As described above, hydrogen, oxygen, a hydrogen radical (H*), an oxygen radical (O*), a hydroxy radical (OH*), and the like are contained on the surface of the metal compound layer 105 or in the metal compound layer 105 in Peeling method example 2. This can reduce the force required for separating the metal compound layer 105 and the resin layer 123 from each other.

<Peeling Method Example 3>

In Peeling method example 1, the metal layer 102 was heated to form the metal compound layer 105. In this Peeling method example 3, the method is mainly described in which the metal compound layer 105 is formed by heating the metal layer 102 and a metal nitride layer 104 in a stacked state.

First, the metal layer 102 is formed over the formation substrate 101, and the metal nitride layer 104 is formed over the metal layer 102 (FIG. 5(A)).

The metal layer 102 and the metal nitride layer 104 are preferably formed using a common metal. The metal layer 102 and the metal nitride layer 104 can be formed by, for example, a sputtering method. For example, the metal layer 102 can be formed using an argon gas as a process gas. For example, the metal nitride layer 104 can be formed using a nitrogen gas as a process gas.

Next, the first layer 122 is formed over the metal nitride layer 104 (FIG. 5(B)).

Note that before the first layer 122 is formed, plasma treatment may be performed on the metal nitride layer 104 to form a layer containing a metal oxide. For example, a surface side of the metal nitride layer 104 may be oxidized to form a structure in which the metal layer 102, the metal nitride layer 104, and a metal oxide layer are stacked from the formation substrate 101 side. The stacked-layer structure can be regarded as a layer containing a metal oxide.

Next, heat treatment is performed in the state where the metal layer 102, the metal nitride layer 104, and the first layer 122 are stacked, so that the metal compound layer 105 and the resin layer 123 are formed (FIG. 5(C1)).

By heating the metal layer 102 and the metal nitride layer 104, the metal compound layer 105 is formed. By heating the first layer 122, the resin layer 123 is formed.

Structure examples of the metal compound layer 105 are illustrated in FIGS. 5(C2) and 5(C3). The metal compound layer 105 illustrated in FIG. 5(C2) has a three-layer structure, and the metal compound layer 105 illustrated in FIG. 5(C3) has a two-layer structure. The metal compound layer 105 illustrated in FIGS. 5(C2) and 5(C3) includes the first compound layer 111 which is in contact with the resin layer 123 and the second compound layer 112 which is positioned closer to the formation substrate 101 side than the first compound layer 111 is. As illustrated in FIG. 5(C2), the metal compound layer 105 can further include the third compound layer 113 which is positioned closer to the formation substrate 101 side than the second compound layer 112 is.

For the following steps, the step in FIG. 2(A) and the subsequent steps in Peeling method example 1 can be referred to.

As described above, the layer formed between the formation substrate 101 and the resin layer 123 (the first layer 122) can be formed using any of a variety of materials including metals.

<Peeling Method Example 4>

Here, a peeling method is described which includes a step of forming a first material layer over a substrate; a step of heating the first material layer at a first temperature; a step of forming a second material layer over the first material layer heated at the first temperature; a step of heating the first material layer and the second material layer in a stacked state at a second temperature; and a step of separating the first material layer and the second material layer from each other. Here, the first temperature is higher than the second temperature. By heating at the first temperature, a first compound layer and a second compound layer that is positioned closer to the substrate side than the first compound layer is are formed in the first material layer. Heating the first material layer at a sufficiently high temperature can increase the peelability between the first material layer and the second material layer. Meanwhile, the second temperature can be lower than the first temperature. Thus, high heat resistance is not required for the material for the second material layer and the range of choices for the material is wide. When the temperature at which the second material layer is heated is low, the transmitting property with respect to visible light is less likely to decrease. When two heating steps at different temperatures are performed in this manner, both high peelability and a high visible-light-transmitting property of the second material layer can be achieved.

First, the metal layer 102 is formed over the formation substrate 101 (FIG. 6(A)).

Next, the metal layer 102 is heated at the first temperature to form the metal compound layer 105 (FIG. 6(B1)).

The first temperature is preferably higher than or equal to 200° C. and lower than or equal to 500° C., further preferably higher than or equal to 200° C. and lower than or equal to 450° C., for example.

Structure examples of the metal compound layer 105 are illustrated in FIGS. 6(B2) and 6(B3). The metal compound layer 105 illustrated in FIG. 6(B2) has a three-layer structure, and the metal compound layer 105 illustrated in FIG. 6(B3) has a two-layer structure. The metal compound layer 105 illustrated in FIGS. 6(B2) and 6(B3) includes the first compound layer 111 and the second compound layer 112 which is positioned closer to the formation substrate 101 side than the first compound layer 111 is. As illustrated in FIG. 6(B2), the metal compound layer 105 can further include the third compound layer 113 which is positioned closer to the formation substrate 101 side than the second compound layer 112 is.

Next, the first layer 122 is formed over the metal compound layer 105 (FIG. 6(C)).

Next, heat treatment is performed at the second temperature in a state where the metal compound layer 105 and the first layer 122 are stacked. By heating the first layer 122, the resin layer 123 is formed (FIG. 6(D1)).

The second temperature is preferably higher than or equal to 100° C. and lower than or equal to 450° C., further preferably higher than or equal to 100° C. and lower than or equal to 400° C., still further preferably higher than or equal to 100° C. and lower than or equal to 350° C., for example.

Structure examples of the metal compound layer 105 are illustrated in FIGS. 6(D2) and 6(D3). The structures of the metal compound layer 105 are similar to those in FIGS. 6(B2) and 6(B3).

Objects of heating after formation of the first layer 122 include to remove the solvent from the first layer 122 (pre-baking treatment) and to cure the first layer 122 (post-baking treatment). These can be performed at a temperature lower than that of the heat treatment for forming the metal compound layer 105. That is, the second temperature can be lower than the first temperature.

The temperature at which the first layer 122 (the resin layer 123) are heated can be low; thus, a material having low heat resistance can be used for the first layer 122 and the range of choices for the material can be widened. In addition, coloring of the resin layer 123 can be inhibited.

The condition of the heat treatment at the first temperature and that of the heat treatment at the second temperature can be set independently of each other. For example, not only the temperature but also the atmosphere, the kind of the gas, the time, or the like may be varied.

Note that it is preferable that the heat treatment at the first temperature and the heat treatment at the second treatment be each performed under a nitrogen atmosphere or with a nitrogen gas supplied. Thus, nitrogen can be sufficiently contained in the metal compound layer 105. Moreover, oxidation of the resin layer 123 can be suppressed and a high visible-light-transmitting property can be maintained.

For the following steps, the step in FIG. 2(A) and the subsequent steps in Peeling method example 1 can be referred to.

As described above, in one embodiment of the present invention, the maximum temperature applied to the resin layer 123 can be low and the metal compound layer 105 and the resin layer 123 can be easily separated from each other. Thus, the yield of peeling can be increased while the visible-light-transmitting property of the resin layer 123 is maintained.

<Peeling Method Example 5>

In Peeling method example 5, the timing of surface treatment and processing of the metal layer 102 is mainly described. In the case where both surface treatment and processing are performed on the metal layer 102, there are two possible methods: a method in which the processing is performed after the surface treatment (Process 1) and a method in which the surface treatment is performed after the processing (Process 2).

Process 1 is described with reference to FIGS. 7(A1), 7(B1), 7(C1), 7(D1), 7(E), and 7(F). Process 2 is described with reference to FIGS. 7(A2), 7(B2), 7(C2), 7(D2), 7(E), and 7(F).

First, in each process, the metal layer 102 is formed over the formation substrate 101 (FIGS. 7(A1) and 7(A2)).

Next, in Process 1, the metal layer 102 is irradiated with the plasma 110 as illustrated in FIG. 7(B1), whereby the layer 103 containing a metal oxide that is illustrated in FIG. 7(C1) is formed. Then, the layer 103 containing a metal oxide is processed into an island-like shape (FIG. 7(D1)).

Meanwhile, in Process 2, the metal layer 102 is processed into an island-like shape as illustrated in FIG. 7(B2). Then, the island-shaped metal layer 102 is irradiated with the plasma 110 (FIG. 7(C2)), whereby the island-shaped layer 103 containing a metal oxide is formed (FIG. 7(D2)).

The peeling method of this embodiment can be conducted through either Process 1 or Process 2. It is particularly preferable to use Process 1 since the force required for peeling can be reduced as compared to that in Process 2. This is probably because the discharging conditions during the plasma treatment are different between before and after the processing of the metal layer 102 into an island-like shape, leading to a difference in the oxidation state of the surface of the metal layer 102. In other words, it can be considered that the metal layer 102 can be oxidized more uniformly and the force required for the peeling can be smaller in the case where the metal layer 102 is oxidized before the metal layer 102 is processed into an island-like shape (in a state before the metal layer 102 is patterned).

The description of Peeling method example 2 and Embodiment 2 can be referred to for the surface treatment such as the plasma treatment.

As a method for processing the metal layer 102 or the layer 103 containing a metal oxide, dry etching, wet etching, or the like can be used.

Then, in each process, the first layer 122 is formed over the island-shaped layer 103 containing a metal oxide (FIG. 7(E)).

Then, heat treatment is performed in a state where the layer 103 containing a metal oxide and the first layer 122 are stacked, whereby the metal compound layer 105 and the resin layer 123 are formed (FIG. 7(F)). Examples of the structure of the metal compound layer 105 at the time of FIG. 7(F) include the two-layer structure and the three-layer structure illustrated in FIGS. 4(E2) and 4(E3).

For the following steps, the step in FIG. 2(A) and the subsequent steps in Peeling method example 1 can be referred to.

Here, depending on the structure of the functional layer 135 formed over the resin layer 123, the adhesion between the functional layer 135 and the metal compound layer 105 might be low. Low adhesion between the functional layer 135 and the metal compound layer 105 causes film separation (also referred to as peeling) in a fabrication process of a semiconductor device, which brings a problem of a decrease in yield. For example, film separation is sometimes observed in the case where a titanium oxide film is used as the layer (the first compound layer) closest to the resin layer 123 side in the metal compound layer 105 and an inorganic insulating film such as a silicon oxide film or a silicon oxynitride film is used as the layer closest to the resin layer 123 side in the functional layer 135.

Therefore, as illustrated in FIG. 7(F), the resin layer 123 preferably covers an end portion of the island-shaped metal compound layer 105. In that case, a portion having low adhesion can be prevented from being generated in the stacked-layer structure, so that film separation can be reduced. As a result, the yield in the fabrication process of the semiconductor device can be improved. Furthermore, since there is no need to consider the adhesion between the functional layer 135 and the metal compound layer 105 or the like, the range of choices for the materials used for the functional layer 135 and the metal compound layer 105 can be widened.

As described above, in one embodiment of the present invention, formation of an interface having low adhesion can be prevented and the metal compound layer 105 and the resin layer 123 can be separated from each other at desired timing. Thus, film separation during the process can be prevented, so that the yield can be improved.

As described in this embodiment, the metal compound layer and the resin layer that are stacked are irradiated with light, whereby the metal compound layer and the resin layer can be separated from each other. With the use of this method, after the functional layer is formed over the formation substrate with the metal compound layer and the resin layer provided therebetween, the functional layer can be peeled from the formation substrate and transferred to another substrate. For example, a functional layer which is formed over a formation substrate having high heat resistance can be transferred to a substrate having low heat resistance, and the fabrication temperature of the functional layer is not limited by the substrate having low heat resistance. In the case where the functional layer is transferred to a substrate or the like which is more lightweight, thin, or flexible than the formation substrate, a variety of devices such as a semiconductor device, a light-emitting device, and a display device can be made more lightweight, thin, and flexible.

This embodiment can be combined with the other embodiments and examples as appropriate. Moreover, in this specification, in the case where a plurality of structure examples are shown in one embodiment, the structure examples can be combined as appropriate.

Embodiment 2

An example of the principle of separation of the metal compound layer and the resin layer from each other is described in this embodiment with reference to FIG. 8 to FIG. 11.

First, the effect that $H_2O$ impairs adhesion between a metal compound layer 20 and a resin layer 23 (hereinafter referred to as an impairing effect) is described with reference to FIG. 8 and FIG. 9.

Figure 8:
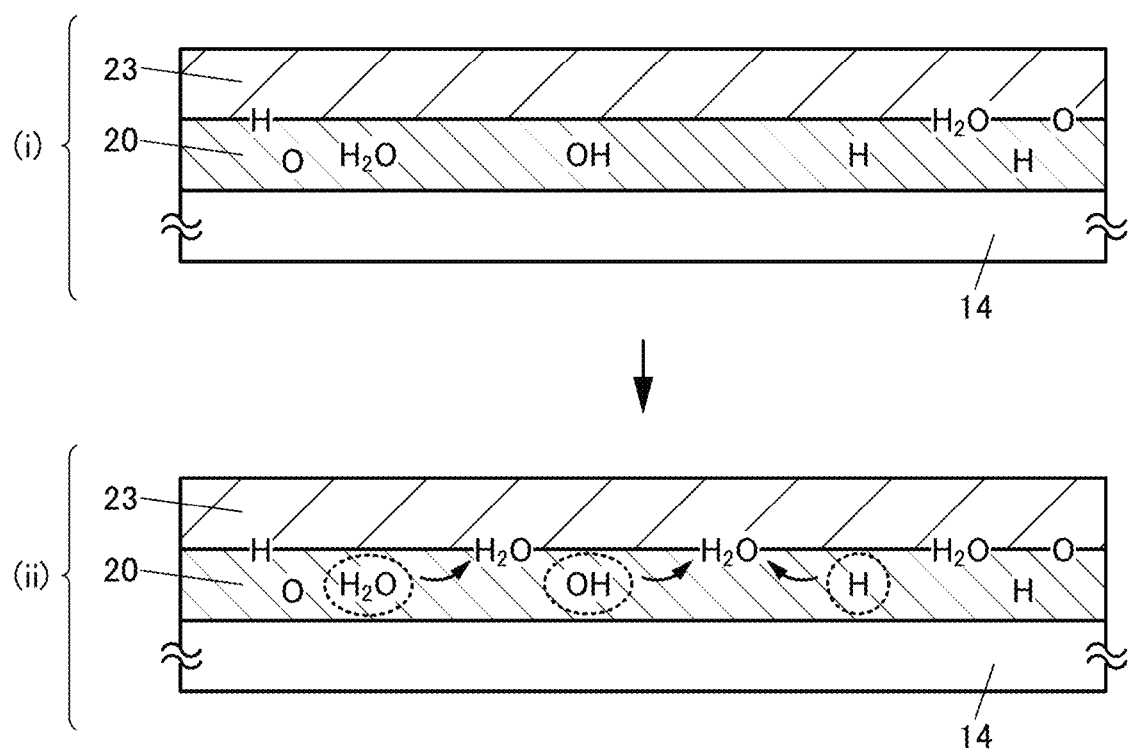
FIG. 8 are schematic diagrams illustrating an example of a peeling method.

In FIG. 8, the metal compound layer 20 is provided over a formation substrate 14 and the resin layer 23 is provided over the metal compound layer 20.

At an interface between the metal compound layer 20 and the resin layer 23 and/or in the metal compound layer 20, one or more of $H_2O$, hydrogen (H), oxygen (O), a hydroxyl group (OH), a hydrogen radical (H*), an oxygen radical (O*), and a hydroxy radical (OH*) are present. These can be supplied by at least one of the steps involved in formation of the metal compound layer 105 (a formation step of a metal layer, a metal nitride layer, a layer containing a metal oxide, or a metal compound layer, plasma treatment, heat treatment, and the like). In an example of Step (i) in FIG. 8, $H_2O$, H, O, and the like are present both at the interface between the metal compound layer 20 and the resin layer 23 and in the metal compound layer 20.

H, O, $H_2O$, and the like supplied to the interface between the metal compound layer 20 and the resin layer 23 and into the metal compound layer 20 are sometimes separated out as $H_2O$ at the interface by a step (e.g., heating at 350° C.) in which the resin layer 23 (e.g., a polyimide resin, an acrylic resin, or the like) is solidified (goes solid or is cured). In that case, $H_2O$ separated out at the interface between the metal compound layer 20 and the resin layer 23 might impair the adhesion between the metal compound layer 20 and the resin layer 23. In other words, $H_2O$ separated out at the interface between the metal compound layer 20 and the resin layer 23 has an effect of impairing adhesion (an impairing effect). In an example of Step (ii) in FIG. 8, $H_2O$ in the metal compound layer 20 is separated out at the interface between the metal compound layer 20 and the resin layer 23. Furthermore, in the example of Step (ii) in FIG. 8, hydrogen and a hydroxyl group (OH) in the metal compound layer 20 are separated out as $H_2O$ at the interface between the metal compound layer 20 and the resin layer 23.

Next, a stack including the formation substrate 14, the metal compound layer 20, and the resin layer 23 is irradiated with light. In an example of Step (iii) in FIG. 9, the stack is placed with the formation substrate 14 positioned on the upper side. In Step (iii) in FIG. 9, the stack is moved by a transfer mechanism (not illustrated) in a direction shown by an arrow in the drawing; thus, the light irradiation is performed from the right side to the left side in the drawing. The interface between the metal compound layer 20 and the resin layer 23 or the vicinity thereof is irradiated with the light through the formation substrate 14. Here, an example of using linear laser light is shown. In the example of Step (iii) and Step (iv) in FIG. 9, a processing region 27 is irradiated with a linear beam 26 through the formation substrate 14. The interface between the metal compound layer 20 and the resin layer 23 (as well as the inside of the metal compound layer 20 and the inside of the resin layer 23) is heated by the light irradiation. Furthermore, by the light irradiation, $H_2O$ present at the interface between the metal compound layer 20 and the resin layer 23 is vaporized (evaporated) instantaneously at high energy and ablation occurs.

Figure 9:
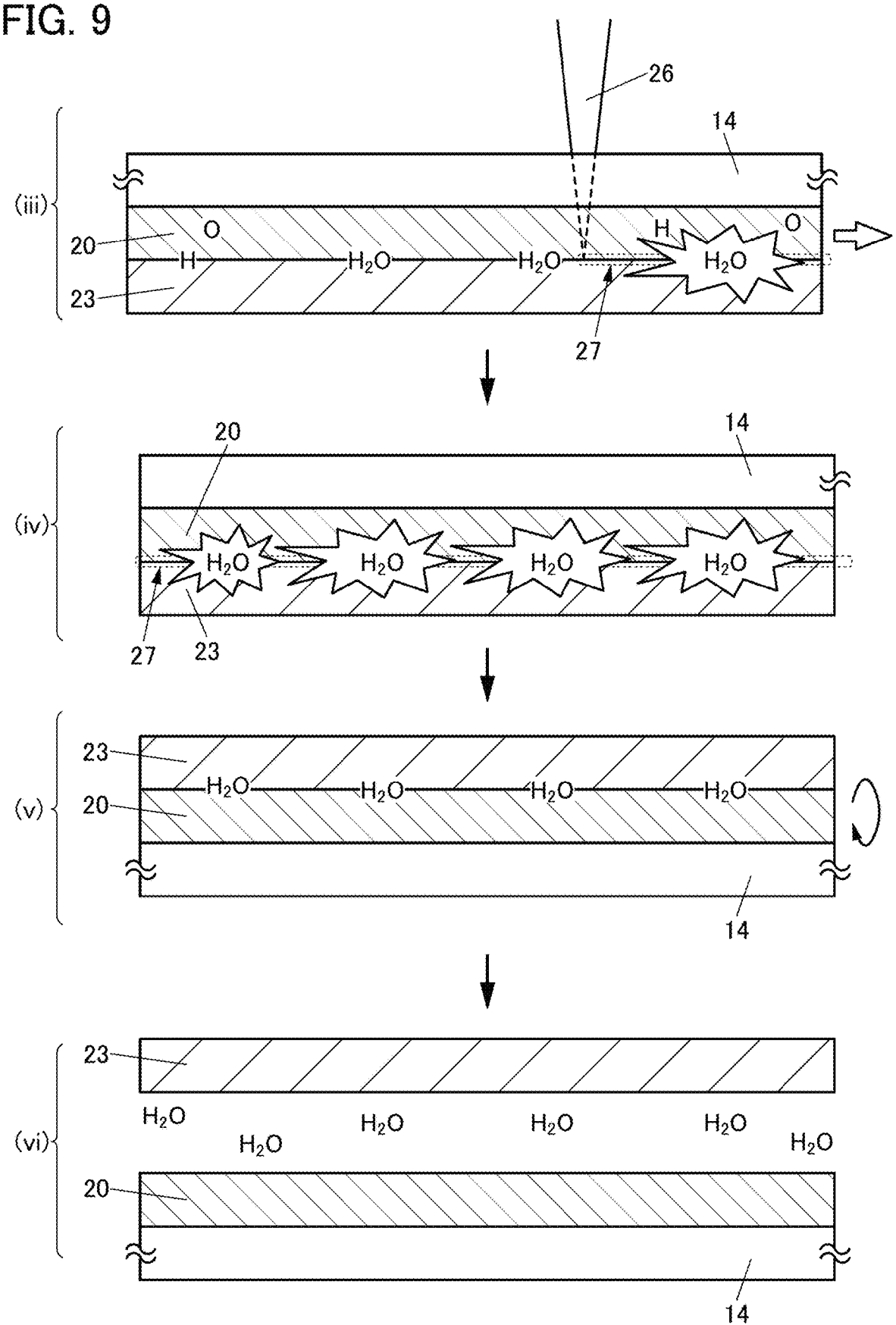
FIG. 9 are schematic diagrams illustrating an example of a peeling method.

In an example of Step (v) in FIG. 9, the stack is reversed upside down. In an example of Step (vi) in FIG. 9, the metal compound layer 20 and the resin layer 23 are separated from each other. $H_2O$ becomes water vapor by light irradiation to have an expanded volume. As a result, the adhesion between the metal compound layer 20 and the resin layer 23 is reduced, which allows for the separation between the metal compound layer 20 and the resin layer 23.

Next, a bond between the metal compound layer 20 and the resin layer 23 is described with reference to FIG. 10.

Figure 10:
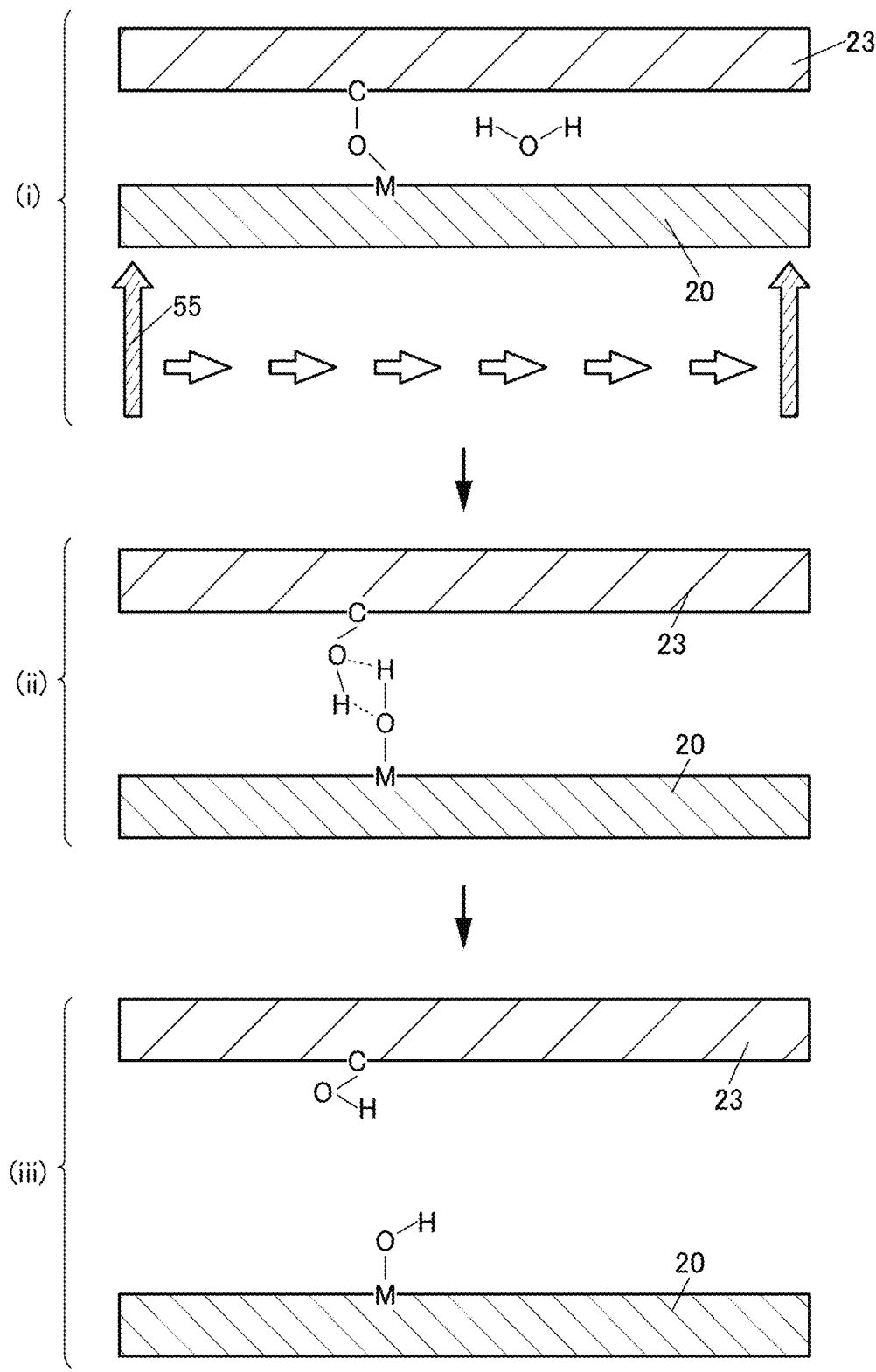
FIG. 10 are schematic diagrams illustrating an example of a peeling method.

In FIG. 10, the metal compound layer 20 and the resin layer 23 are stacked.

A bond is probably formed between the metal compound layer 20 and the resin layer 23. Specifically, a chemical bond such as a covalent bond, an ionic bond, or a hydrogen bond is formed between the metal compound layer 20 and the resin layer 23.

In an example of Step (i) in FIG. 10, a metal M of the metal compound layer 20 and carbon C of the resin layer 23 are bonded through oxygen O.

The stacked-layer structure of the metal compound layer 20 and the resin layer 23 is irradiated with laser light 55 (see FIG. 10). Here, an example of using linear laser light is shown. By relatively moving the substrate and a light source, scanning with the laser light 55 is performed and the irradiation with the laser light 55 is performed across a region where separation is desirably caused.

The light irradiation heats the interface between the metal compound layer 20 and the resin layer 23 (as well as the inside of the metal compound layer 20 and the inside of the resin layer 23) and causes a reaction represented by Formula (1) (see below and FIG. 10). The light irradiation allows $H_2O$ (water vapor) to cut the metal M-oxygen O-carbon C bond. Then, the bond between the metal compound layer 20 and the resin layer 23 is changed into a hydrogen bond.

$$M\text{-}O\text{---}C + H_2O \rightarrow M\text{-}OH + C\text{---}OH \qquad (1)$$

In an example of Step (ii) in FIG. 10, the metal M of the metal compound layer 20 and the oxygen O are bonded and the carbon C of the resin layer 23 and another oxygen O are bonded. The two oxygens form covalent bonds with the respective hydrogens. Furthermore, the two oxygens each form a hydrogen bond with the hydrogen bonded to the other oxygen.

A hydrogen bond is much weaker than a covalent bond and thus can be easily cut. Furthermore, water is evaporated by energy of the light irradiation to be water vapor. At this time, a hydrogen bond between the metal compound layer 20 and the resin layer 23 can be cut by expansion force in some cases. Thus, the metal compound layer 20 and the resin layer 23 can be easily separated from each other.

In an example of Step (iii) in FIG. 10, the oxygen and the hydrogen that have been hydrogen-bonded are detached from each other and the metal compound layer 20 and the resin layer 23 are separated from each other. The metal M of the metal compound layer 20 and the oxygen O are bonded and the carbon C of the resin layer 23 and another oxygen O are bonded. The two oxygens form covalent bonds with the respective hydrogens.

As described above, irradiating the stacked-layer structure of the metal compound layer 20 and the resin layer 23 with light allows $H_2O$ to change a strong bond between the metal compound layer 20 and the resin layer 23 into a hydrogen bond, which is a weak bond. This can reduce the force required for the separation between the metal compound layer 20 and the resin layer 23. Furthermore, the metal compound layer 20 and the resin layer 23 can be separated from each other by expansion of $H_2O$ due to energy of the light irradiation.

Next, $H_2O$ that is involved in the above impairing effect and the reaction represented by Formula (1) above is described.

H₂O is sometimes present in the metal compound layer 20, in the resin layer 23, and at the interface between the metal compound layer 20 and the resin layer 23, for example.

In addition, hydrogen (H), oxygen (O), a hydroxyl group (OH), a hydrogen radical (H*), an oxygen radical (O*), a hydroxy radical (OH*), and the like present in the metal compound layer 20, in the resin layer 23, and at the interface between the metal compound layer 20 and the resin layer 23, for example, are sometimes changed into H₂O by heating.

One or more of H₂O, hydrogen (H), oxygen (O), a hydroxyl group (OH), a hydrogen radical (H*), an oxygen radical (O*), and a hydroxy radical (OH*) are preferably added into the metal compound layer 20, to a surface of the metal compound layer 20 (the surface in contact with the resin layer 23), or to the interface between the metal compound layer 20 and the resin layer 23.

Note that the above impairing effect and the reaction represented by Formula (1) above are sometimes caused at the same time in the peeling method of this embodiment. It is estimated that in that case, the adhesion between the metal compound layer 20 and the resin layer 23 can be further reduced, or in other words, peelability between the metal compound layer 20 and the resin layer 23 can be further increased.

It is preferable that large amounts of H₂O, hydrogen (H), oxygen (O), hydroxyl groups (OH), hydrogen radicals (H*), oxygen radicals (O*), hydroxy radicals (OH*), and the like be present in the metal compound layer 20, in the resin layer 23, and at the interface between the metal compound layer 20 and the resin layer 23, for example. A larger amount of H₂O, which contributes to the reaction, promotes the reaction and can further reduce the force required for the separation.

For example, during the formation of the metal compound layer 20, large amounts of H₂O, hydrogen, oxygen, hydroxyl groups, hydrogen radicals (H*), oxygen radicals (O*), hydroxy radicals (OH*), and the like are preferably contained in the metal compound layer 20 or on the surface of the metal compound layer 20.

Specifically, it is preferable that one or both of the metal layer 102 and the metal nitride layer 104 described in Embodiment 1 be formed and radical treatment be performed. In the radical treatment, the surface of the metal layer 102 or the metal nitride layer 104 is preferably exposed to an atmosphere containing at least one of an oxygen radical and a hydroxy radical. For example, plasma treatment is preferably performed in an atmosphere containing one or both of oxygen and water vapor (1420). Note that the object on which the radical treatment is performed is not limited to the metal layer and the metal nitride layer, and can be a layer containing a metal compound such as a metal oxide or a metal oxynitride. In the radical treatment, the surface of the object is preferably exposed to an atmosphere containing at least one kind among an oxygen radical, a hydrogen radical, and a hydroxy radical. For example, plasma treatment is preferably performed in an atmosphere containing one or more of oxygen, hydrogen, and water vapor (1420).

The radical treatment can be performed with a plasma generation apparatus or an ozone generation apparatus.

For example, oxygen plasma treatment, hydrogen plasma treatment, water plasma treatment, ozone treatment, or the like can be performed. Oxygen plasma treatment can be performed by generating plasma in an oxygen-containing atmosphere. Hydrogen plasma treatment can be performed by generating plasma in a hydrogen-containing atmosphere. Water plasma treatment can be performed by generating plasma in an atmosphere containing water vapor (1420). In particular, water plasma treatment is preferable because it makes a large amount of moisture be contained on the surface of the metal compound layer 20 or in the metal compound layer 20.

Plasma treatment may be performed in an atmosphere containing two or more kinds among oxygen, hydrogen, water (water vapor), and an inert gas (typically, argon). Examples of the plasma treatment include plasma treatment in an atmosphere containing oxygen and hydrogen, plasma treatment in an atmosphere containing oxygen and water, plasma treatment in an atmosphere containing water and argon, plasma treatment in an atmosphere containing oxygen and argon, and plasma treatment in an atmosphere containing oxygen, water, and argon. The use of an argon gas for one of gasses of the plasma treatment is favorable because the metal layer or the metal compound layer 20 can be damaged during the plasma treatment.

Two or more kinds of plasma treatment may be performed sequentially without exposure to the air. For example, water plasma treatment may be performed after argon plasma treatment is performed.

Figure 11:
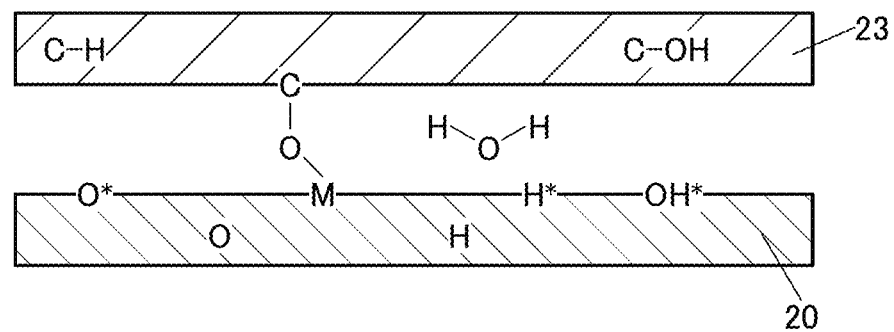
FIG. 11 is a schematic diagram illustrating an example of an interface between a metal compound layer and a resin layer.

Thus, hydrogen, oxygen, a hydrogen radical (H*), an oxygen radical (O*), a hydroxy radical (OH*), and the like can be contained on the surface of the metal compound layer 20 or in the metal compound layer 20 as illustrated in FIG. 11. Furthermore, in the example illustrated in FIG. 11, the resin layer 23 contains hydrogen H which is bonded to carbon C (C—H) and a hydroxyl group OH which is bonded to carbon C (C—OH). These are probably changed into H₂O by being heated by heat treatment or light irradiation.

As described above, the force required for separating the metal compound layer and the resin layer from each other can be reduced when hydrogen, oxygen, a hydrogen radical (H*), an oxygen radical (O*), a hydroxy radical (OH*), or the like is contained on the surface of the metal compound layer or in the metal compound layer.

This embodiment can be combined with the other embodiments and examples as appropriate.

Embodiment 3

In this embodiment, a fabrication method of a light-emitting device and a fabrication method of a display device are described with reference to FIG. 12 to FIG. 20. Furthermore, manufacturing apparatuses for fabricating these devices are described with reference to FIG. 21 and FIG. 22.

In this embodiment, the case of using Peeling method example 4 described in Embodiment 1 is mainly described. Peeling method example 4 has a feature in that the maximum temperature applied to the second material layer can be lower than the maximum temperature applied to the first material layer. When the maximum temperature applied to the second material layer is lower, the second material layer can maintain a higher visible-light-transmitting property. Therefore, even when the second material layer remains on the side where light is extracted (a light-emitting surface or a display surface), the light extraction efficiency is less likely to decrease, which is preferable.

Note that portions similar to those in the peeling method described in Embodiment 1 are not described here in detail.

[Fabrication Method Example 1]

In this Fabrication method example 1, a light-emitting device including an organic EL element is described as an example. The light-emitting device can be a flexible device by using a flexible material for a substrate.

First, a metal layer 102a is formed over a formation substrate 101a (FIG. 12(A)).

Next, at least part of the metal layer 102a is oxidized. FIG. 12(B) illustrates an example in which a surface of the metal layer 102a is irradiated with the plasma 110. Thus, a layer 103a containing a metal oxide is formed (FIG. 12(C)).

Next, the layer 103a containing a metal oxide is heated at the first temperature, whereby a metal compound layer 105a is formed. Note that the layer 103a containing a metal oxide is processed into an island-like shape before being heated at the first temperature. Alternatively, heating at the first temperature is followed by processing of the metal compound layer 105a into an island-like shape. In this manner, the island-shaped metal compound layer 105a is formed (FIG. 12(D)).

By heating the layer 103a containing a metal oxide at the first temperature, the first compound layer and the second compound layer that is positioned closer to the substrate side than the first compound layer is are formed in the metal compound layer 105a. Heating the layer 103a containing a metal oxide at a sufficiently high temperature can increase the peelability between the layer 103a containing a metal oxide and a resin layer 123a.

Next, a first layer 122a is formed over the metal compound layer 105a (FIG. 12(E)). Then, the first layer 122a is processed into an island-like shape. In this embodiment, the island-shaped first layer 122a is formed to cover an end portion of the metal compound layer 105a.

The first layer 122a is preferably processed by a photolithography method. Pre-baking treatment is performed after formation of the first layer 122a, and then light exposure is performed using a photomask. Then, development treatment is performed, whereby an unnecessary portion can be removed.

Note that the first layer 122a (which is to be the resin layer 123a later) is not necessarily in the form of a single island and may be in the form of a plurality of islands or a shape having an opening, for example. In addition, an unevenness shape may be formed on the surface of the first layer 122a (which is to be the resin layer 123a later) by a light exposure technique using a half-tone mask or a gray-tone mask, a multiple light exposure technique, or the like.

The resin layer 123a with a desired shape can be formed in such a manner that a mask such as a resist mask or a hard mask is formed over the first layer 122a or the resin layer 123a and etching is performed. This method is particularly suitable for the case of using a non-photosensitive material.

For example, an inorganic film is formed over the resin layer 123a, and a resist mask is formed over the inorganic film. After the inorganic film is etched with the use of the resist mask, the resin layer 123a can be etched using the inorganic film as a hard mask.

As an inorganic film that can be used as the hard mask, a variety of inorganic insulating films, metal films and alloy films that can be used for a conductive layer, and the like can be given.

It is preferable that the mask with an extremely small thickness can be formed and the mask can be removed concurrently with the etching, in which case a step of removing the mask can be eliminated.

Next, heat treatment is performed at the second temperature in a state where the metal compound layer 105a and the first layer 122a are stacked. By heating the island-shaped first layer 122a, the first layer 122a is cured and the resin layer 123a having an island-like shape is formed (FIG. 12(F1)). The second temperature can be lower than the first temperature. Thus, the resin layer 123a with a high visible-light-transmitting property can be formed.

Structure examples of the metal compound layer 105a are illustrated in FIGS. 12(F2) and 12(F3). The metal compound layer 105a illustrated in FIG. 12(F2) has a three-layer structure, and the metal compound layer 105a illustrated in FIG. 12(F3) has a two-layer structure. The metal compound layer 105a illustrated in FIGS. 12(F2) and 12(F3) includes a first compound layer 111a in contact with the resin layer 123a and a second compound layer 112a that is positioned closer to the formation substrate 101a side than the first compound layer 111a is. As illustrated in FIG. 12(F2), the metal compound layer 105a can further include a third compound layer 113a that is positioned closer to the formation substrate 101a side than the second compound layer 112a is.

Next, components of the light-emitting device are sequentially formed. Specifically, an insulating layer 167 is formed over the resin layer 123a, a conductive layer 171, an auxiliary wiring 172, a conductive layer 173, an insulating layer 178, and a light-emitting element 160 are formed over the insulating layer 167, and an insulating layer 165 is formed over the light-emitting element 160. Then, a substrate 175 is bonded with the use of an adhesive layer 174 (FIG. 13(A)).

The temperature applied to the resin layer 123a is preferably lower than or equal to the second temperature in the fabrication process of the components of the light-emitting device. Accordingly, the high visible-light-transmitting property of the resin layer 123a can be maintained and the light extraction efficiency of the light-emitting device can be increased. Furthermore, a gas released from the resin layer 123a can be reduced, and the reliability of the light-emitting device can be increased.

The insulating layer 167 can be used as a barrier layer that prevents diffusion of impurities contained in the resin layer 123a to the light-emitting element 160 formed later. For example, the insulating layer 167 preferably prevents moisture and the like contained in the resin layer 123a from diffusing to the light-emitting element 160 when the resin layer 123a is heated. Thus, the insulating layer 167 preferably has a high barrier property.

As the insulating layer 167, for example, an inorganic insulating film such as a silicon nitride film, a silicon oxynitride film, a silicon oxide film, a silicon nitride oxide film, an aluminum oxide film, or an aluminum nitride film can be used. Moreover, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Furthermore, a stack of two or more of the above insulating films may also be used. It is particularly preferable that a silicon nitride film be formed over the resin layer 123a and a silicon oxide film be formed over the silicon nitride film.

An inorganic insulating film is preferably formed at high temperatures because the film can have higher density and a higher barrier property as the film formation temperature is higher.

The substrate temperature during the formation of the insulating layer 167 is preferably higher than or equal to room temperature (25° C.) and lower than or equal to 350° C., further preferably higher than or equal to 100° C. and lower than or equal to 300° C.

The light-emitting element 160 may be of top-emission type, bottom-emission type, or dual-emission type. A conductive film that transmits visible light is used for the electrode on the side where light is extracted. Moreover, a conductive film that reflects visible light is preferably used for the electrode on the side where light is not extracted.

Figure 13A:
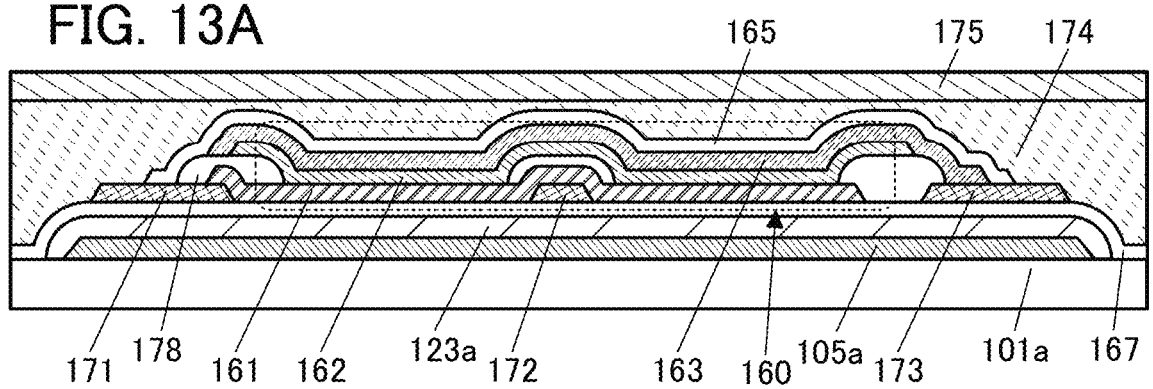
FIGS. 13A-13C are cross-sectional views illustrating an example of a fabrication method of a light-emitting device.

The light-emitting element 160 illustrated in FIG. 13(A) is a bottom-emission light-emitting element. A first electrode 161 is an electrode on the side where light is extracted, and transmits visible light. A second electrode 163 is an electrode on the side where light is not extracted, and reflects visible light.

Either a low molecular compound or a high molecular compound can be used for an EL layer 162, and an inorganic compound may also be included.

The first electrode 161 and the second electrode 163 can each be formed by an evaporation method, a sputtering method, or the like.

The conductive layer 171 and the conductive layer 173 each function as an external connection electrode. The conductive layer 171 is electrically connected to the first electrode 161. The conductive layer 171 is electrically insulated from the second electrode 163 by the insulating layer 178. The conductive layer 173 is electrically connected to the second electrode 163. The conductive layer 173 is electrically insulated from the first electrode 161 by the insulating layer 178.

The conductive film that transmits visible light has a higher resistivity than a metal film or the like in some cases. For this reason, the auxiliary wiring 172 in contact with the first electrode 161 is preferably provided. The auxiliary wiring 172 can be formed using the same material and the same process as those of the conductive layer 171 and the conductive layer 173. A metal material having a low resistivity is preferably used for the auxiliary wiring 172.

The insulating layer 165 functions as a protective layer that prevents diffusion of impurities such as water to the light-emitting element 160. The light-emitting element 160 is sealed with the insulating layer 165. After the second electrode 163 is formed, the insulating layer 165 is preferably formed without exposure to the air.

The insulating layer 165 preferably includes an inorganic insulating film with a high barrier property that can be used as the insulating layer 167. Furthermore, a stack of an inorganic insulating film and an organic insulating film may also be used.

The insulating layer 165 can be formed by an ALD method, a sputtering method, or the like. An ALD method and a sputtering method are preferable because low-temperature film formation is possible. Using an ALD method is preferable because the coverage with the insulating layer 165 becomes favorable.

For the adhesive layer 174, the description of the adhesive layer 145 can be referred to.

For the substrate 175, the description of the substrate 146 can be referred to.

Figure 13B:
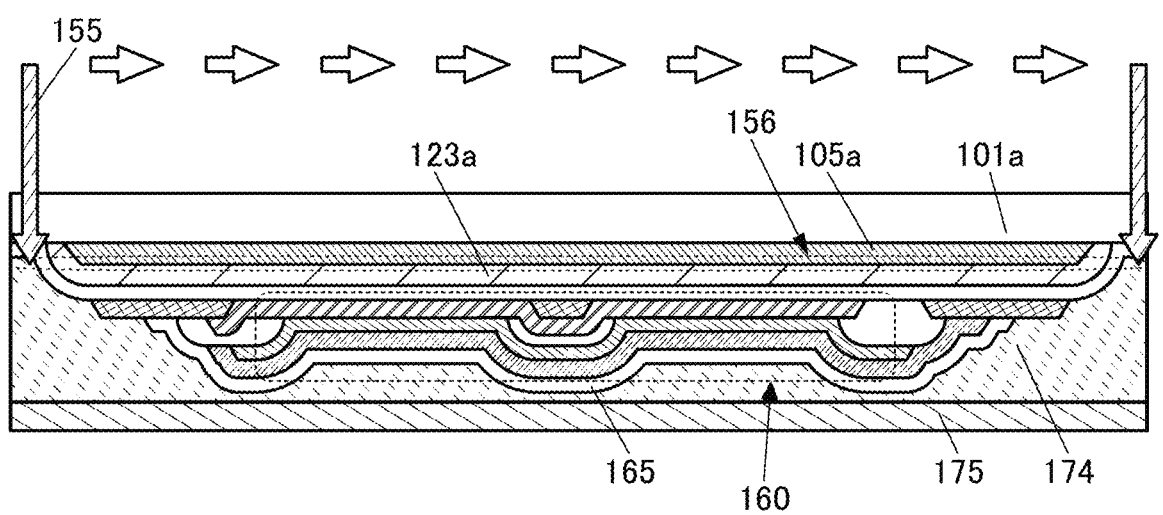

Next, the irradiation with the laser light 155 is performed (FIG. 13(B)). In the laser apparatus, the stack is placed with the formation substrate 101a being on the upper side. The stack is irradiated with the laser light 155 from the upper side of the stack (the formation substrate 101a).

Figure 13C:
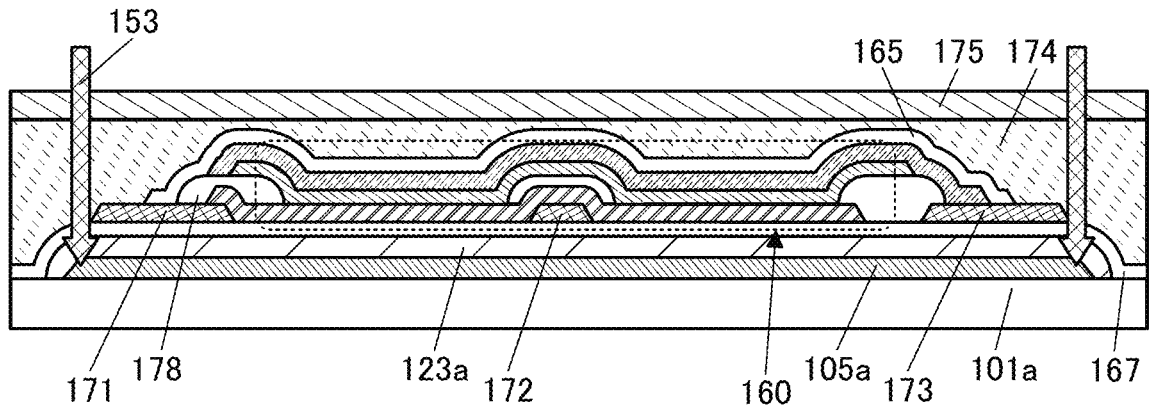

Next, a separation trigger is formed in the resin layer 123a (FIG. 13(C)). For example, a sharp instrument 153, e.g., a knife, is inserted from the substrate 175 side into a portion located inward from an end portion of the resin layer 123a to make a cut in a frame-like shape. This is suitable for the case where a resin is used for the substrate 175. Alternatively, the resin layer 123a may be irradiated with laser light in a frame-like shape.

In this Fabrication method example 1, the metal compound layer 105a and the resin layer 123a are provided in an island-like shape. The portion where these layers are not provided over the formation substrate 101a (the portion where the substrate 101a and the insulating layer 167 are in contact with each other) has high adhesion even after the irradiation with the laser light 155 is performed. Therefore, unintentional peeling of the resin layer 123a from the metal compound layer 105a can be inhibited. In addition, the formation of the separation trigger enables the metal compound layer 105a and the resin layer 123a to be separated from each other at desired timing. Accordingly, the timing of the separation can be controlled and the force required for the separation is small. This can increase the yield of the separation process and that of the fabrication process of the light-emitting device.

Figure 14A:
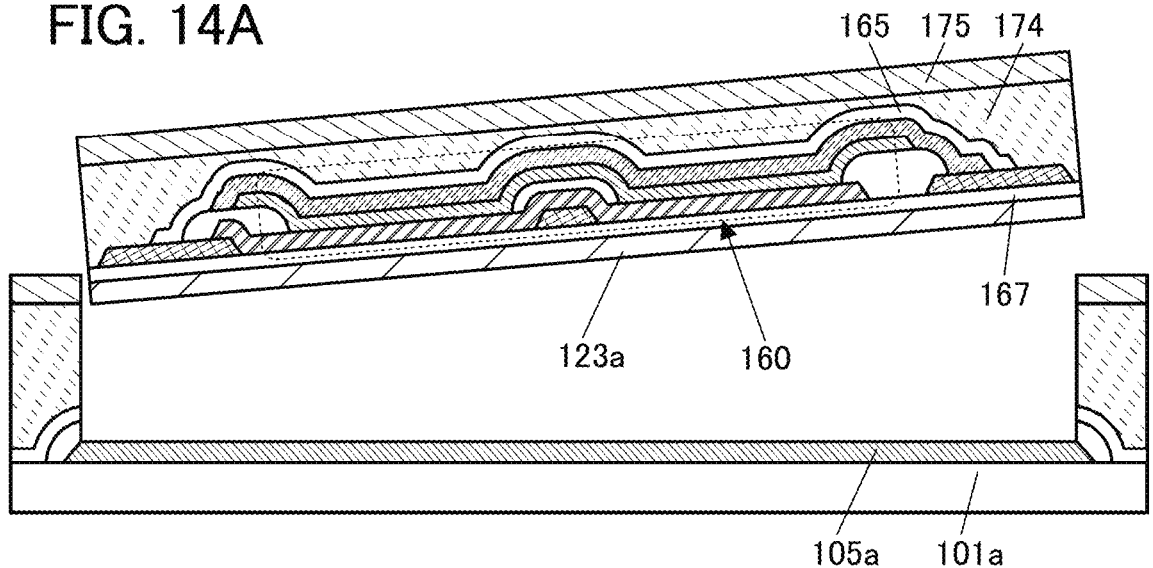
FIGS. 14A-14C are cross-sectional views illustrating an example of a fabrication method of a light-emitting device.

Then, the metal compound layer 105a and the resin layer 123a are separated from each other (FIG. 14(A)). As illustrated in FIG. 14(A), separation occurs at an interface between the metal compound layer 105a and the resin layer 123a.

Figure 14B:
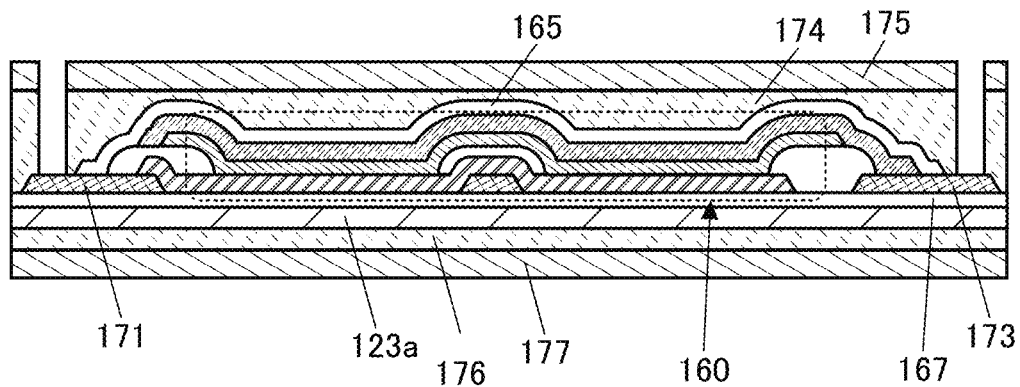

After that, a substrate 177 is bonded to the exposed resin layer 123a with an adhesive layer 176 (FIG. 14(B)). As illustrated in FIG. 14(B), an opening reaching the conductive layer 171 and an opening reaching the conductive layer 173 are formed in the substrate 175 and the adhesive layer 174, so that the conductive layer 171 and the conductive layer 173 are exposed.

Figure 14C:
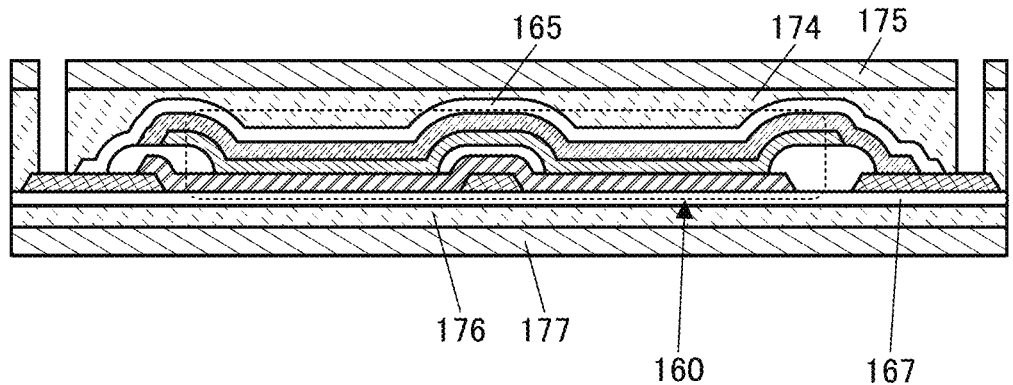

Note that it is also possible to remove the resin layer 123a and bond the substrate 177 to the insulating layer 167 with the use of the adhesive layer 176 as illustrated in FIG. 14(C). For example, the resin layer 123a can be removed by ashing using oxygen plasma. By removing the resin layer 123a, the thickness of the light-emitting device can be reduced and the flexibility can be increased.

As described above, in this Fabrication method example 1, the resin layer 123a can have a high visible-light-transmitting property. Therefore, even when the resin layer 123a remains on the side where the light emitted by the light-emitting element 160 is extracted, the light extraction efficiency is less likely to decrease. Therefore, even when the resin layer 123a is not removed, a light-emitting device with high light extraction efficiency can be fabricated. Therefore, the fabrication process of the light-emitting device can be simplified.

In this embodiment, the resin layer 123a does not need to be provided to have a large thickness. The thickness of the resin layer 123a can be, for example, greater than or equal to 0.1 µm and less than or equal to 5 µm, or even greater than or equal to 0.1 µm and less than or equal to 3 µm. Therefore, a highly flexible light-emitting device can be fabricated even when the resin layer 123a is not removed. This makes it possible to omit the step of removing the resin layer 123a, which is also preferable.

The adhesive layer 176 and the substrate 177 preferably have a high transmitting property with respect to the light emitted by the light-emitting element 160.

The substrate 177 can function as a supporting substrate of the light-emitting device. A film is preferably used as the substrate 177, and a resin film is particularly preferably used. In that case, the light-emitting device can be reduced in weight and thickness. Furthermore, the light-emitting device using a film substrate is less likely to be broken than that in the case of using glass, a metal, or the like. In addition, the light-emitting device can have higher flexibility.

For the adhesive layer 176, the material that can be used for the adhesive layer 174 can be used. The material that can be used for the substrate 175 can be used for the substrate 177.

As described above, in this embodiment, the formation substrate can be peeled with the use of a resin layer having a high visible-light-transmitting property. Therefore, even when the resin layer is not removed, a light-emitting device with high light extraction efficiency can be fabricated. Furthermore, since a thin resin layer can be used, a highly flexible light-emitting device can be fabricated.

[Fabrication Method Example 2]

In this Fabrication method example 2, a display device that includes a transistor and an organic EL element (also referred to as an active matrix organic EL display device) will be described as an example. Furthermore, in this Fabrication method example 2, a display device that includes a transistor, an organic EL element, and a sensor element (also referred to as an input/output device or a touch panel; hereinafter referred to as a touch panel) will also be described. These display devices can each be a flexible device by using a flexible material for a substrate.

In this Fabrication method example 2, components on one substrate side of the display device are formed over the formation substrate 101a, and components on the other substrate side of the display device are formed over a formation substrate 101b. These components are formed over the formation substrate with a metal compound layer and a resin layer provided therebetween. Thus, these components can be peeled from the formation substrate and transferred to a flexible substrate.

First, as in Fabrication method example 1, the steps of FIGS. 12(A) to 12(F) are performed to form a stack of the metal compound layer 105a and the resin layer 123a over the formation substrate 101a.

Next, the components on one substrate side of the display device are sequentially formed. Since the resin layer 123a is a layer which has a high visible-light-transmitting property, it is preferable that components positioned on the display surface side be formed over the resin layer 123a. Specifically, an insulating layer 191 is formed over the resin layer 123a, and a coloring layer 197 and a light-blocking layer 198 are formed over the insulating layer 191 (FIG. 15(A)). In addition, an overcoat or the like may be formed.

In the fabrication process of the components of the display device, the temperature applied to the resin layer 123a is preferably lower than or equal to the second temperature. Accordingly, the resin layer 123a can maintain a high visible-light-transmitting property, which can increase the light extraction efficiency of the display device. Furthermore, a gas released from the resin layer 123a can be inhibited, and the reliability of the display device can be increased.

For the insulating layer 191, the description of the insulating layer 167 can be referred to.

A color filter or the like can be used as the coloring layer 197. The coloring layer 197 is placed to overlap with a display region of the light-emitting element 160.

A black matrix or the like can be used as the light-blocking layer 198. The light-blocking layer 198 is placed to overlap with an insulating layer 209.

Figure 15A:
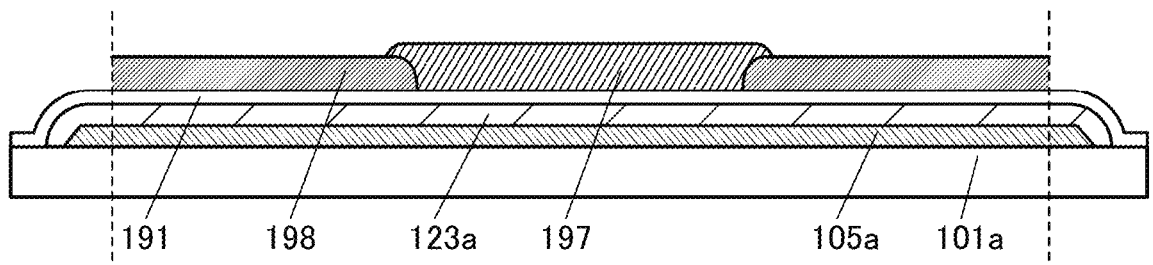
FIGS. 15A and 15B are cross-sectional views illustrating an example of a fabrication method of a display device.
Figure 15B:
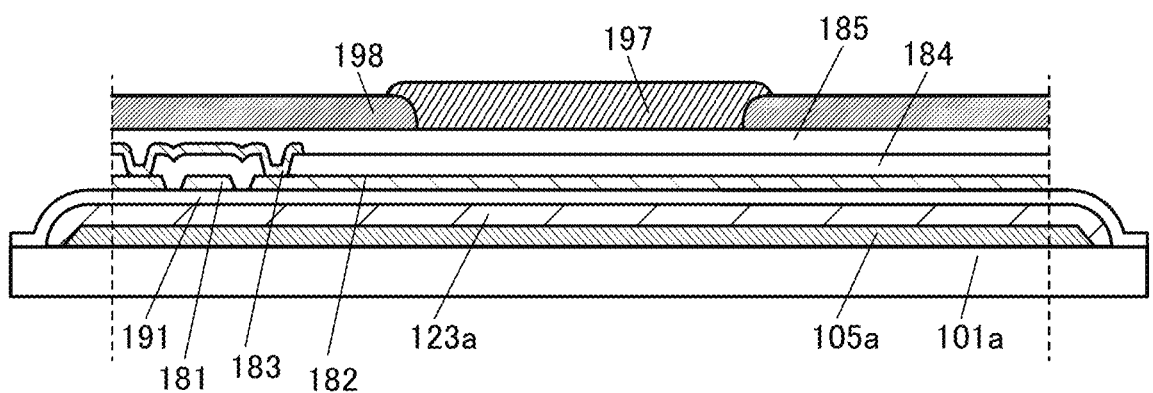

In the case where a touch panel is formed, a sensor element is formed over the insulating layer 191, and the coloring layer 197 and the light-blocking layer 198 are formed over the sensor element (FIG. 15(B)).

Any of a variety of sensors that can sense the proximity or touch of a sensing target such as a finger can be used as a touch sensor.

As the touch sensor, for example, a capacitive touch sensor can be used. Examples of the capacitive type include a surface capacitive type and a projected capacitive type. Examples of the projected capacitive type include a self-capacitive type and a mutual-capacitive type. The use of a mutual-capacitive touch sensor is preferred because multiple points can be sensed simultaneously.

The sensor element illustrated in FIG. 15(B) includes a conductive layer 181 and conductive layers 182. An insulating layer 184 is provided over the conductive layer 181 and the conductive layers 182, and a conductive layer 183 is provided over the insulating layer 184. The conductive layer 183 electrically connects the two conductive layers 182 between which one conductive layer 181 is positioned. An insulating layer 185 is provided over the conductive layer 183, and the coloring layer 197 and the light-blocking layer 198 are provided over the insulating layer 185. Since the conductive layer 181 and the conductive layers 182 overlap with the display region of the display device, the conductive layer 181 and the conductive layers 182 are formed using a material having a high transmitting property with respect to visible light.

Figure 16A:
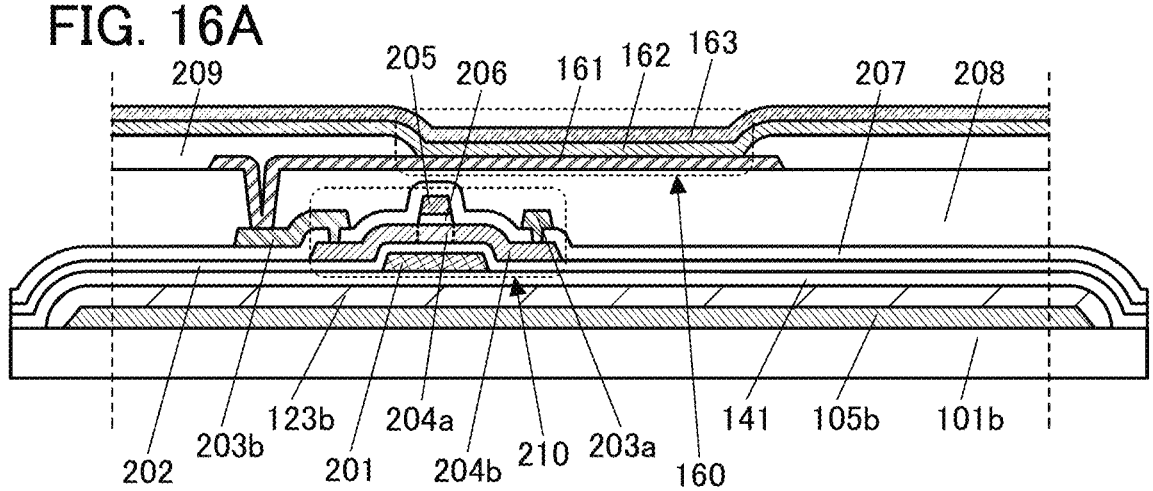
FIGS. 16A-16D are cross-sectional views illustrating an example of a fabrication method of a display device.

As illustrated in FIG. 16(A), a stack of a metal compound layer 105b and a resin layer 123b is formed over the formation substrate 101b. The metal compound layer 105b and the resin layer 123b can be formed by any one of or a combination of the methods described in Embodiment 1 as examples. For example, fabrication methods similar to those of the metal compound layer 105a and the resin layer 123a may be employed.

As described in Peeling method examples 1 to 3 in Embodiment 1, for example, the metal compound layer 105b and the resin layer 123b may be formed by performing heat treatment once. The resin layer 123b is not positioned on the light extraction side of the display device and thus may have a low visible-light-transmitting property.

For example, it is preferable that an acrylic resin be used for the resin layer 123a and a polyimide resin be used for the resin layer 123b. An acrylic resin has a higher visible-light-transmitting property than a polyimide resin and thus is suitable as a material for the resin layer 123a positioned on the light extraction side. A polyimide resin has higher heat resistance than an acrylic resin; thus, a transistor and the like can be formed over a polyimide resin at a relatively high temperature. Thus, a highly reliable transistor can be fabricated, which is preferable.

Next, the components on the other substrate side of the display device are sequentially formed. Specifically, an insulating layer 141 is formed over the resin layer 123b, and a transistor 210, an insulating layer 208, the insulating layer 209, and the light-emitting element 160 are formed over the insulating layer 141 (FIG. 16(A)).

For the insulating layer 141, the description of the insulating layer 167 can be referred to.

Here, transistors that can be used in the display device are described.

There is no particular limitation on the structure of the transistor included in the display device. For example, a planar transistor may be used, a staggered transistor may be used, or an inverted staggered transistor may be used. In addition, a top-gate transistor or a bottom-gate transistor may be used. Alternatively, gate electrodes may be provided above and below a channel.

FIG. 16(A) illustrates the case where a top-gate transistor whose semiconductor layer includes a metal oxide is formed as the transistor 210. A metal oxide can function as an oxide semiconductor.

An oxide semiconductor is preferably used as the semiconductor of the transistor. A semiconductor material having a wider bandgap and a lower carrier density than silicon is preferably used because the off-state current of the transistor can be reduced.

The transistor 210 includes a conductive layer 201, an insulating layer 202, a conductive layer 203a, a conductive layer 203b, a semiconductor layer, a conductive layer 205, an insulating layer 206, and an insulating layer 207. The conductive layer 201 functions as a gate. The conductive layer 205 functions as a back gate. The insulating layer 202 and the insulating layer 206 function as gate insulating layers. The semiconductor layer includes a channel region 204a and a pair of low-resistance regions 204b. The channel region 204a overlaps with the conductive layer 205 with the insulating layer 206 positioned therebetween. The channel region 204a overlaps with the conductive layer 201 with the insulating layer 202 positioned therebetween. The conductive layer 203a is electrically connected to one of the pair of low-resistance regions 204b through an opening in the insulating layer 207. Similarly, the conductive layer 203b is electrically connected to the other of the pair of low-resistance regions 204b. Any of a variety of inorganic insulating films can be used for the insulating layer 202, the insulating layer 206, and the insulating layer 207. Specifically, an oxide insulating film is suitable for the insulating films which are included in the insulating layer 202 and the insulating layer 206 and are in contact with the channel region 204a, and a nitride insulating film is suitable for the insulating layer 207.

The structure in which the semiconductor layer where a channel is formed is provided between two gates is used for the transistor 210. The two gates are preferably connected to each other and supplied with the same signal to operate the transistor. Such a transistor can have higher field-effect mobility and thus have a higher on-state current than other transistors. Consequently, a circuit capable of high-speed operation can be fabricated. Furthermore, the area occupied by a circuit portion can be reduced. The use of the transistor having a high on-state current can reduce signal delay in wirings and can suppress display unevenness even if the number of wirings is increased when a display device is increased in size or resolution. Alternatively, by supplying a potential for controlling the threshold voltage to one of the two gates and a potential for driving to the other, the threshold voltage of the transistor can be controlled.

For the conductive layers included in the display device, a single-layer structure or a stacked-layer structure of any of metals such as aluminum, titanium, chromium, nickel, copper, yttrium, zirconium, molybdenum, silver, tantalum, and tungsten or an alloy containing any of these metals as its main component can be used. Alternatively, a light-transmitting conductive material such as indium oxide, ITO, indium oxide containing tungsten, indium zinc oxide containing tungsten, indium oxide containing titanium, ITO containing titanium, indium zinc oxide, ZnO, ZnO containing gallium, or ITO containing silicon may be used. Furthermore, a semiconductor such as an oxide semiconductor or polycrystalline silicon whose resistance is lowered by containing an impurity element, for example, or silicide such as nickel silicide may be used. Furthermore, a film containing graphene can also be used. The film containing graphene can be formed, for example, by reducing a film containing graphene oxide. Furthermore, a semiconductor such as an oxide semiconductor containing an impurity element may also be used. Alternatively, the conductive layers may be formed using a conductive paste of silver, carbon, copper, or the like or a conductive polymer such as polythiophene. A conductive paste is preferable because it is inexpensive. A conductive polymer is preferable because it is easily applied.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide preferably contains at least indium or zinc. In particular, the metal oxide preferably contains indium and zinc. The metal oxide will be described in detail in Embodiment 4.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

Figure 16B:
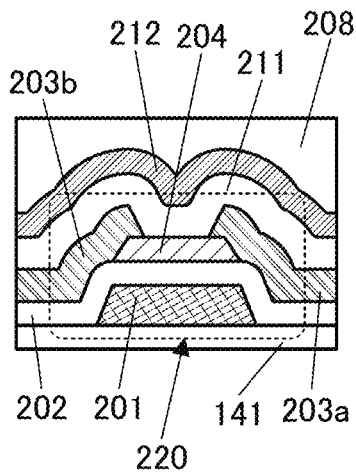
Figure 16C:
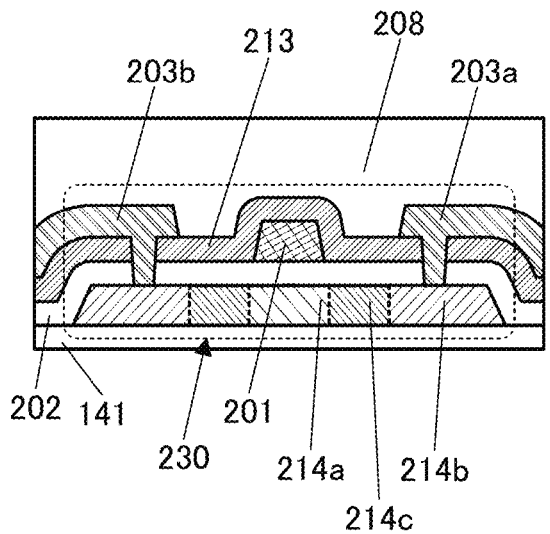
Figure 16D:
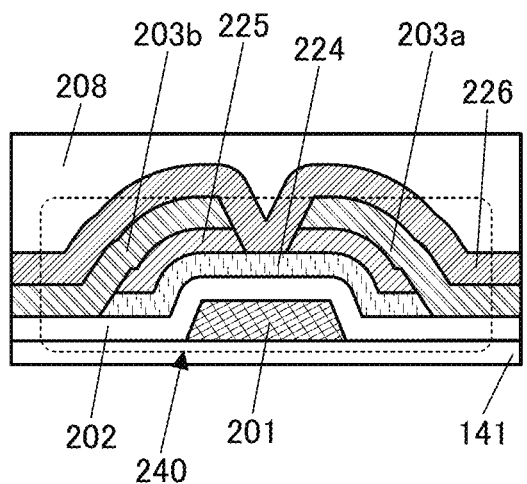

FIGS. 16(B) to 16(D) illustrate other structure examples of transistors.

A transistor 220 illustrated in FIG. 16(B) is a bottom-gate transistor including a metal oxide in a semiconductor layer 204.

The transistor 220 includes the conductive layer 201, the insulating layer 202, the conductive layer 203a, the conductive layer 203b, and the semiconductor layer 204. The conductive layer 201 functions as a gate. The insulating layer 202 functions as a gate insulating layer. The semiconductor layer 204 overlaps with the conductive layer 201 with the insulating layer 202 therebetween. The conductive layer 203a and the conductive layer 203b are each electrically connected to the semiconductor layer 204. The transistor 220 is preferably covered with an insulating layer 211 and an insulating layer 212. Any of a variety of inorganic insulating films can be used for the insulating layer 211 and the insulating layer 212. Specifically, an oxide insulating film is suitable for the insulating layer 211, and a nitride insulating film is suitable for the insulating layer 212.

A transistor 230 illustrated in FIG. 16(C) is a top-gate transistor including LTPS in its semiconductor layer.

The transistor 230 includes the conductive layer 201, the insulating layer 202, the conductive layer 203a, the conductive layer 203b, a semiconductor layer, and an insulating layer 213. The conductive layer 201 functions as a gate. The insulating layer 202 functions as a gate insulating layer. The semiconductor layer includes a channel region 214a and a pair of low-resistance regions 214b. The semiconductor layer may further include a lightly doped drain (LDD) region. FIG. 16(C) shows an example in which an LDD region 214c is provided between the channel region 214a and the low-resistance region 214b. The channel region 214a overlaps with the conductive layer 201 with the insulating layer 202 provided therebetween. The conductive layer 203a is electrically connected to one of the pair of low-resistance regions 214b through an opening provided in the insulating layer 202 and the insulating layer 213. In a similar manner, the conductive layer 203b is electrically connected to the other of the pair of low-resistance regions 214b. Any of a variety of inorganic insulating films can be used for the insulating layer 213. Specifically, a nitride insulating film is suitable for the insulating layer 213.

A transistor 240 illustrated in FIG. 16(D) shows a bottom-gate transistor containing hydrogenated amorphous silicon in a semiconductor layer 224.

The transistor 240 includes the conductive layer 201, the insulating layer 202, the conductive layer 203a, the conductive layer 203b, an impurity semiconductor layer 225, and the semiconductor layer 224. The conductive layer 201 functions as a gate. The insulating layer 202 functions as a gate insulating layer. The semiconductor layer 224 overlaps with the conductive layer 201 with the insulating layer 202 therebetween. The conductive layer 203a and the conductive layer 203b are electrically connected to the semiconductor layer 224 through the impurity semiconductor layer 225. The transistor 240 is preferably covered with an insulating layer 226. Any of a variety of inorganic insulating films can be used for the insulating layer 226. Specifically, a nitride insulating film is suitable for the insulating layer 226.

Next, the components formed over the transistor 210 will be described.

The insulating layer 208 is formed over the transistor 210. An opening reaching the conductive layer 203b is formed in the insulating layer 208. The insulating layer 208 is a layer having a surface where the light-emitting element 160 formed later is to be formed, and thus preferably functions as a planarization layer. Any of a variety of organic insulating films and a variety of inorganic insulating films can be used for the insulating layer 208.

The light-emitting element 160 illustrated in FIG. 16(A) is a top-emission light-emitting element. The first electrode 161 is an electrode on the side where light is not extracted, and reflects visible light. The second electrode 163 is an electrode on the side where light is extracted, and transmits visible light. An end portion of the first electrode 161 is covered with the insulating layer 209. Any of a variety of organic insulating films and a variety of inorganic insulating films can be used for the insulating layer 209. The first electrode 161 is electrically connected to the conductive layer 203b through an opening provided in the insulating layer 208. Thus, the transistor 210 and the light-emitting element 160 can be electrically connected to each other.

The EL layer 162 can be formed by an evaporation method, a coating method, a printing method, a discharge method, or the like. In the case where the EL layer 162 is separately formed for each individual pixel, it can be formed by an evaporation method using a shadow mask such as a metal mask, an ink-jet method, or the like. In the case of not separately forming the EL layer 162 for each individual pixel, an evaporation method not using a metal mask can be used.

Figure 17A:
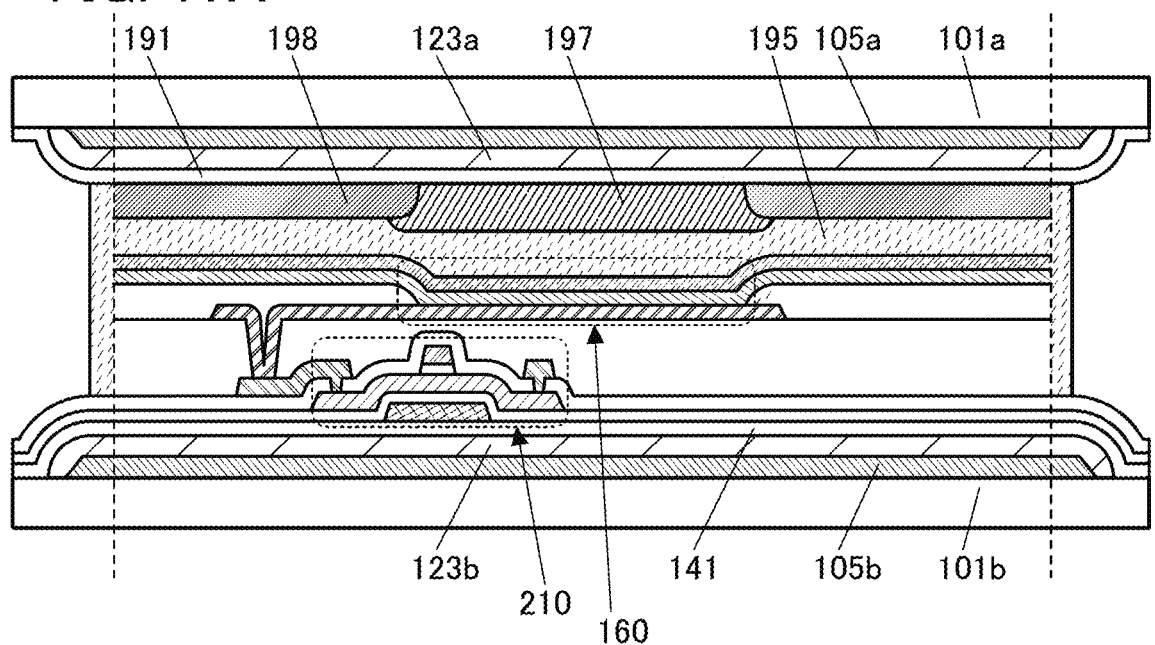
FIGS. 17A and 17B are cross-sectional views illustrating an example of a fabrication method of a display device.

Then, with the use of an adhesive layer 195, the surface of the formation substrate 101b where the transistor 210 and the like are formed and the surface of the formation substrate 101a where the coloring layer 197 and the like are formed are bonded to each other (FIG. 17(A)).

Figure 17B:
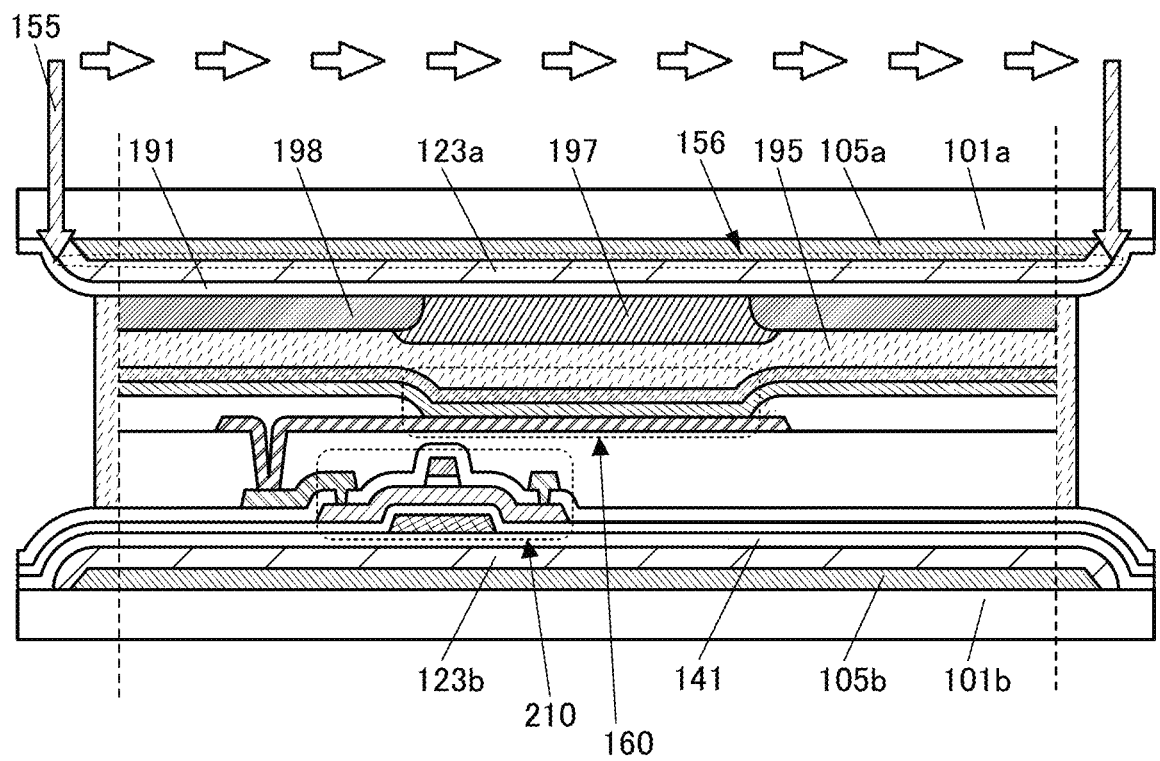

Next, irradiation with the laser light 155 is performed (FIG. 17(B)).

Either the formation substrate 101a or the formation substrate 101b may be separated first. In this example, separation of the formation substrate 101a precedes that of the formation substrate 101b.

The interface between the metal compound layer 105a and the resin layer 123a or the vicinity thereof is preferably irradiated with the laser light 155 through the formation substrate 101a. Furthermore, the inside of the metal compound layer 105a may be irradiated with the laser light 155 or the inside of the resin layer 123a may be irradiated with the laser light 155.

Most of the laser light 155 is absorbed by three layers, i.e., the formation substrate, the metal compound layer, and the resin layer, on the side where the irradiation with the laser light 155 is performed. For that reason, with single irradiation with the laser light 155, only one of adhesion between the metal compound layer 105a and the resin layer 123a and adhesion between the metal compound layer 105b and the resin layer 123b can be lowered. The timing of separation can be different between the formation substrate 101a and the formation substrate 101b; therefore, the formation substrate 101a and the formation substrate 101b can be separated in different steps. This can increase the yield of the separation process and that of the fabrication process of the display device.

Figure 18A:
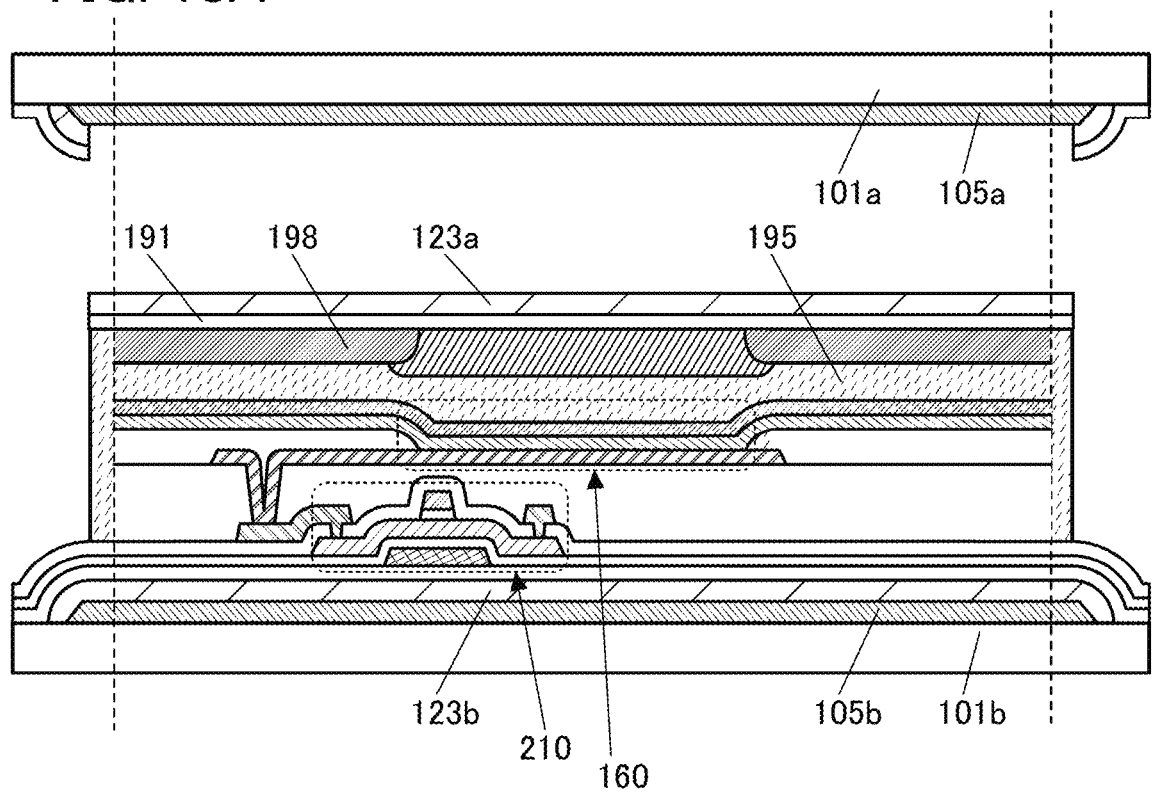
FIGS. 18A and 18B are cross-sectional views illustrating an example of a fabrication method of a display device.

Then, the formation substrate 101a and the resin layer 123a are separated from each other (FIG. 18(A)). Note that a separation trigger may be formed.

Figure 18B:
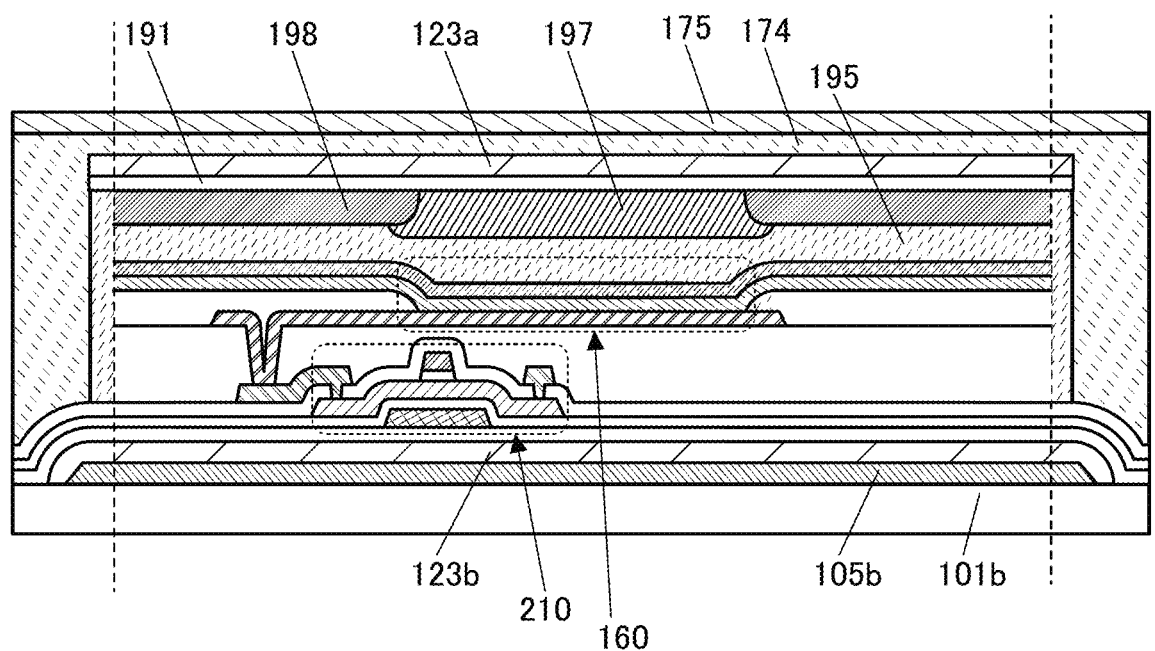

Next, the substrate 175 and the resin layer 123a that is exposed by being separated from the formation substrate 101a are bonded to each other using the adhesive layer 174 (FIG. 18(B)).

As described above, in this Fabrication method example 2, the resin layer 123a can have a high visible-light-transmitting property. Accordingly, light extraction efficiency is less likely to decrease even when the resin layer 123a remains on the side where the light emitted by the light-emitting element 160 is extracted. Therefore, even when the resin layer 123a is not removed, a light-emitting device with high light extraction efficiency can be fabricated. Therefore, the fabrication process of the light-emitting device can be simplified. Note that the resin layer 123a may be removed and the insulating layer 191 and the substrate 175 may be adhered to each other.

The adhesive layer 174 and the substrate 175 preferably have a high transmitting property with respect to the light emitted by the light-emitting element 160.

Figure 19A:
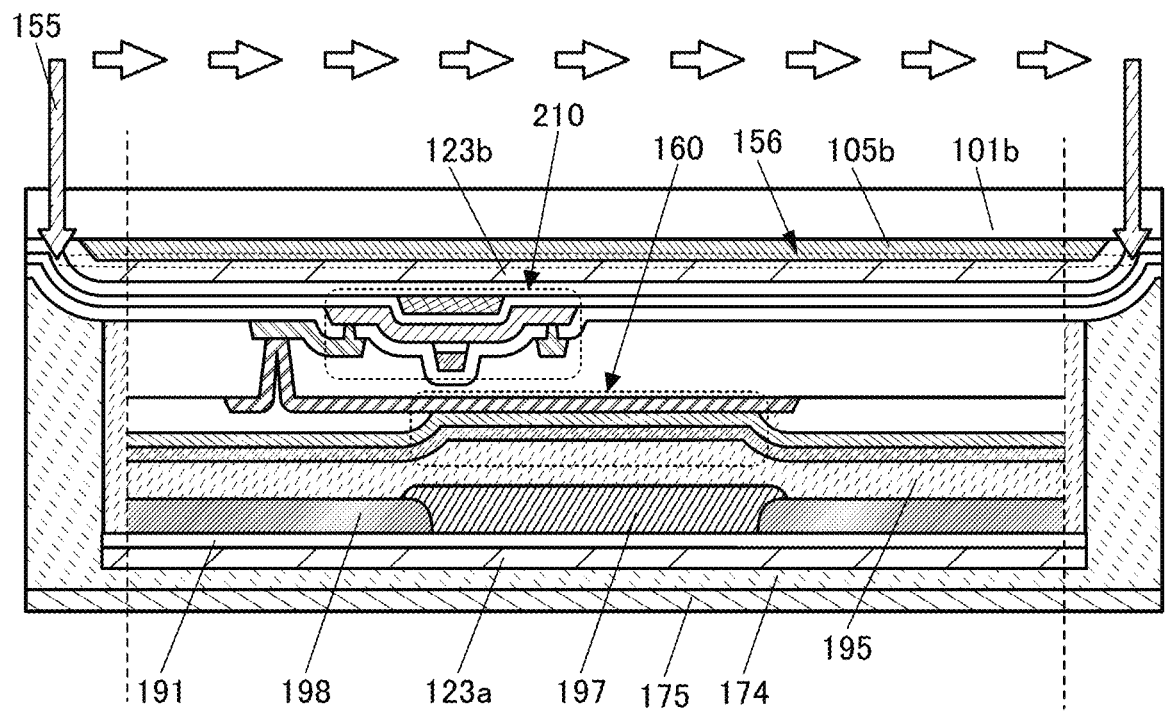
FIGS. 19A and 19B are cross-sectional views illustrating an example of a fabrication method of a display device.

Next, the irradiation with the laser light 155 is performed (FIG. 19(A)). An interface between the metal compound layer 105b and the resin layer 123b or the vicinity thereof is preferably irradiated with the laser light 155 through the formation substrate 101b. Furthermore, the inside of the metal compound layer 105b may be irradiated with the laser light 155 or the inside of the resin layer 123b may be irradiated with the laser light 155.

Figure 19B:
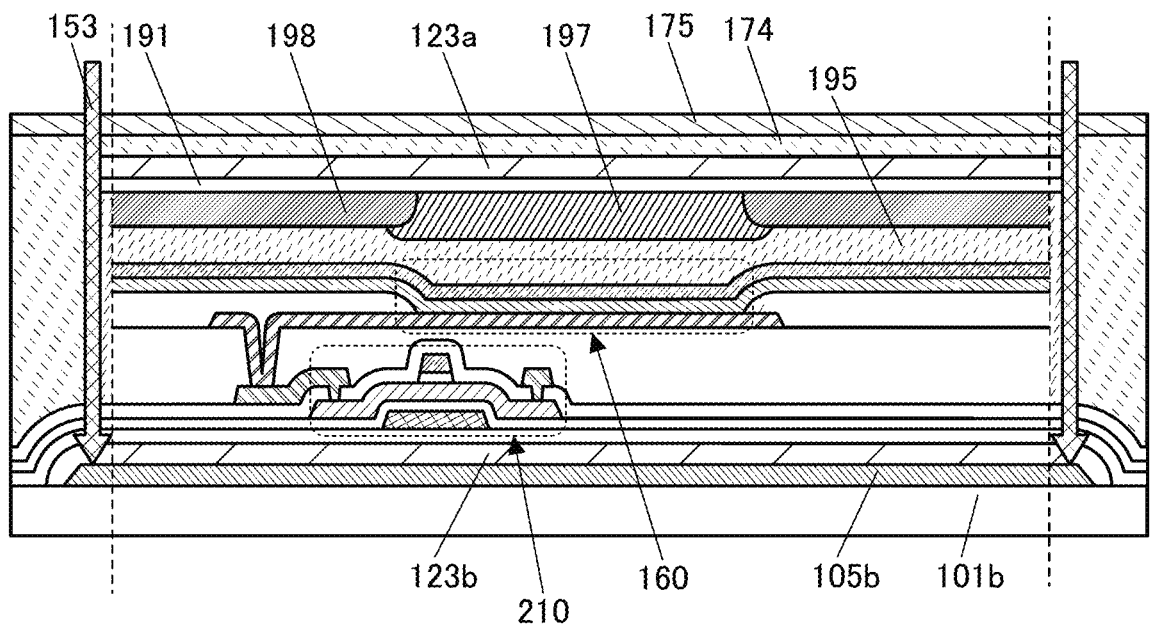

Next, a separation trigger is formed in the resin layer 123b (FIG. 19(B)). In FIG. 19(B), the sharp instrument 153, e.g., a knife, is inserted from the substrate 175 side into a portion located inward from an end portion of the resin layer 123b to make a cut in a frame-like shape.

The formation of the separation trigger enables the formation substrate 101b and the resin layer 123b to be separated from each other at desired timing. Accordingly, the timing of the separation can be controlled and the force required for the separation is small. This can increase the yield of the separation process and that of the fabrication process of the display device.

Figure 20A:
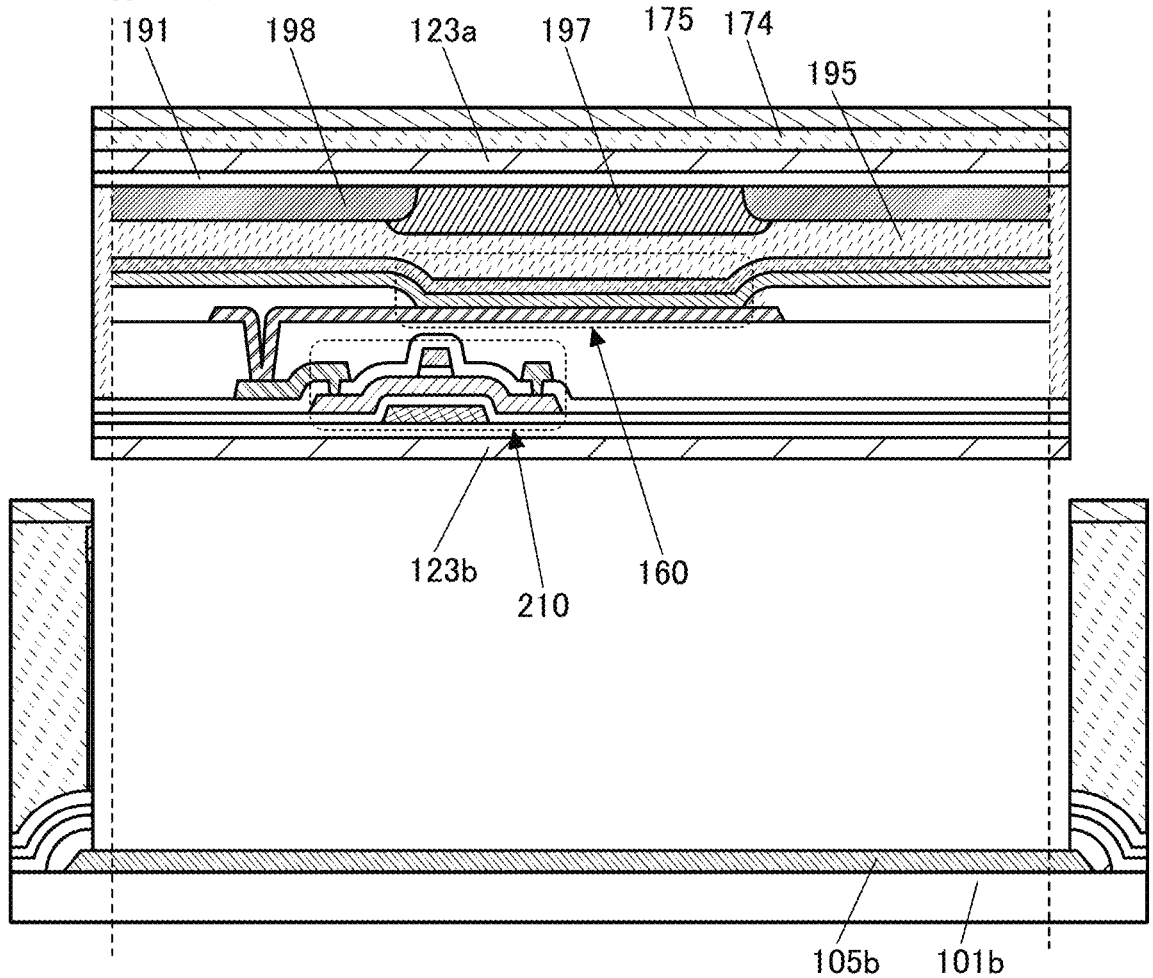
FIGS. 20A and 20B are cross-sectional views illustrating an example of a fabrication method of a display device.

Then, the formation substrate 101b and the resin layer 123b are separated from each other (FIG. 20(A)).

Figure 20B:
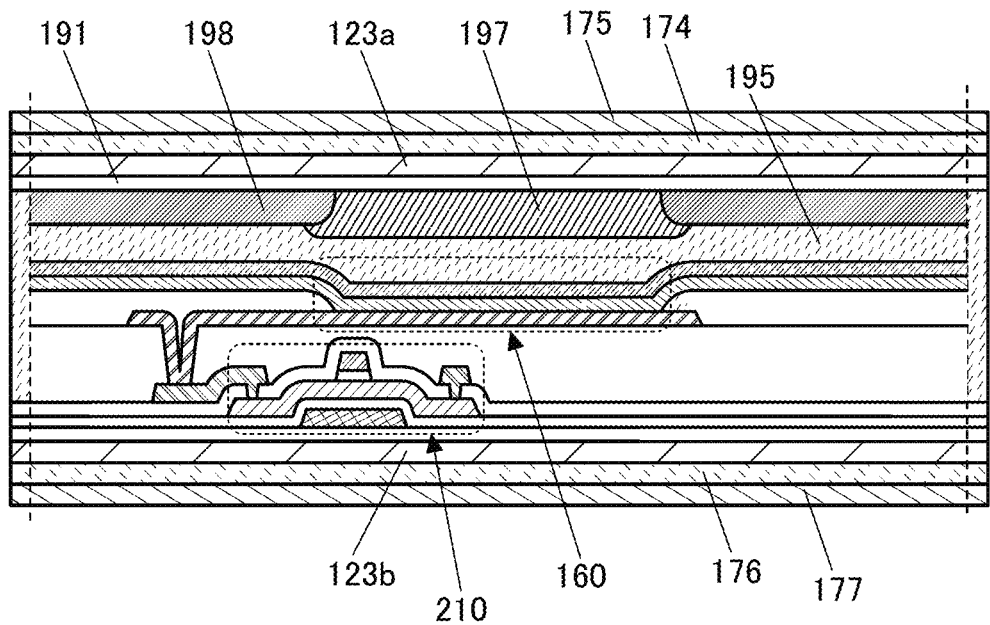

Next, the substrate 177 and the resin layer 123b that is exposed by being separated from the formation substrate 101b are bonded to each other using the adhesive layer 176 (FIG. 20(B)).

The resin layer 123b, the adhesive layer 176, and the substrate 177 are positioned on the side opposite to the side where the light emitted by the light-emitting element 160 is extracted; thus, their visible-light-transmitting properties do not matter.

In Fabrication method example 2, the peeling method of one embodiment of the present invention is conducted twice to fabricate the display device. In one embodiment of the present invention, each of the functional elements and the like included in the display device is formed over the formation substrate; thus, even in the case where a high-resolution display device is fabricated, high alignment accuracy of a flexible substrate is not required. It is thus easy to attach the flexible substrate.

As described above, in this embodiment, the formation substrate can be peeled with the use of a resin layer having a high visible-light-transmitting property. Therefore, a display device with high light extraction efficiency can be fabricated without removal of the resin layer. Furthermore, a thin resin layer can be used, which enables fabricating a highly flexible display device.

Note that when the surfaces of the resin layers 123a and 123b of the light-emitting device or the display device described in this embodiment are analyzed, the metal contained in the metal compound layers 105a and 105b is sometimes detected.

[Example of Stack Fabrication Apparatus]

Next, an example of a stack fabrication apparatus will be described with reference to FIG. 21. With the stack fabrication apparatus illustrated in FIG. 21, a functional layer can be peeled from a formation substrate by the peeling method of one embodiment of the present invention and transferred to another substrate. With the use of the stack fabrication apparatus illustrated in FIG. 21, a stack such as a semiconductor device or a display device can be fabricated.

Figure 21:
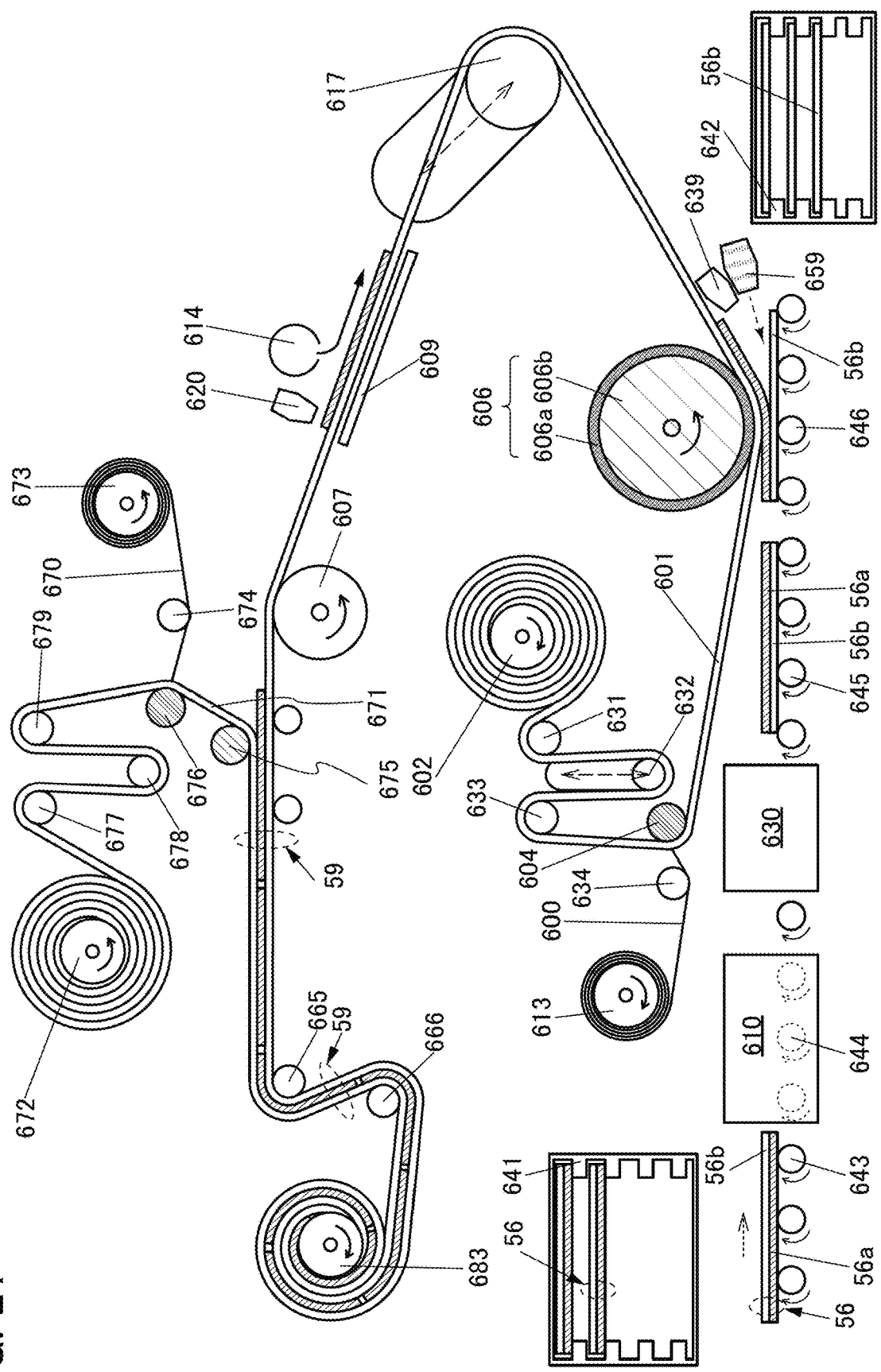
FIG. 21 is a drawing illustrating an example of a stack fabrication apparatus.

The stack fabrication apparatus illustrated in FIG. 21 includes a laser irradiation unit 610, a substrate reversing unit 630, a plurality of transfer rollers (e.g., transfer rollers 643, 644, 645, and 646), a tape reel 602, a wind-up reel 683, a direction changing roller 604, and a press roller 606.

A stack 56 that can be treated with the stack fabrication apparatus illustrated in FIG. 21 has, for example, a structure in which a member 56a to be peeled and a support 56b are stacked. In the stack 56, peeling occurs between the member 56a to be peeled and the support 56b. The member 56a to be peeled includes a resin layer and the support 56b includes a formation substrate, for example.

The stack fabrication apparatus illustrated in FIG. 21 attaches a support 601 to the stack 56 and pulls the support 601, so that the member 56a to be peeled is peeled from the stack 56. Since the stack 56 can be automatically divided with the use of the support 601, the processing time can be shortened and the manufacturing yield of products can be improved.

The member 56a to be peeled that is separated from the support 56b is bonded to a support 671 with an adhesive. As a result, a stack 59 in which the support 601, the member 56a to be peeled, and the support 671 are stacked in this order can be fabricated.

The plurality of transfer rollers can transfer the stack 56. The transfer mechanism that transfers the stack 56 is not limited to a transfer roller and may be a conveyor belt, a transfer robot, or the like. Furthermore, the stack 56 may be placed over a stage over the transfer mechanism.

The transfer roller 643, the transfer roller 644, the transfer roller 645, and the transfer roller 646, each of which is one of the plurality of transfer rollers that are lined up, are provided at predetermined intervals and rotationally driven in the direction in which the stack 56, the member 56a to be peeled, or the support 56b is sent (the clockwise direction as indicated by solid arrows). The plurality of lined-up transfer rollers are each rotationally driven by a driving portion (e.g., a motor), which is not illustrated.

The laser irradiation unit 610 is a unit for irradiating the stack 56 with laser light. As a laser, for example, an excimer laser that emits ultraviolet light with a wavelength of 308 nm can be used. Furthermore, a high-pressure mercury lamp, a UV-LED, or the like may be used.

As illustrated in FIG. 21, the stack 56 is transferred to the laser irradiation unit 610 with the support 56b positioned on the upper side.

The excimer laser is a pulsed laser with high output, which can shape a beam into a linear form with an optical system. The substrate is moved at an irradiation position of a linear laser light beam, so that the whole or necessary portion of the substrate can be irradiated with laser light. Note that when the length of a linear beam is longer than or equal to one side of the substrate used, moving the substrate only in one direction enables the whole substrate to be irradiated with laser light. The oscillation frequency of the pulsed laser is preferably greater than or equal to 1 Hz and less than or equal to 300 Hz, further preferably around 60 Hz.

As an excimer laser apparatus, besides an apparatus on which one laser oscillator is mounted, an apparatus on which two or more laser oscillators are mounted can also be used. In the apparatus on which a plurality of laser oscillators are mounted, laser light that is output in synchronization from the laser oscillators is synthesized (superimposed) with an optical system, so that laser light with high energy density can be obtained. Thus, in the application according to this embodiment, a glass substrate whose size is larger than or equal to the 3.5th generation (600 mm×720 mm), larger than or equal to the 6th generation (1500 mm×1850 mm), larger than or equal to the 7th generation (1870 mm×2200 mm), or larger than or equal to the 8th generation (2160 mm×2460 mm) can also be treated. Furthermore, in the apparatus on which a plurality of laser oscillators are mounted, the output variations of laser light emitted from the laser oscillators compensate for each other, so that a variation in intensity per pulse is reduced, and high-yield treatment can be performed. Note that instead of a plurality of oscillators, a plurality of excimer laser apparatuses may be used.

Figure 22A:
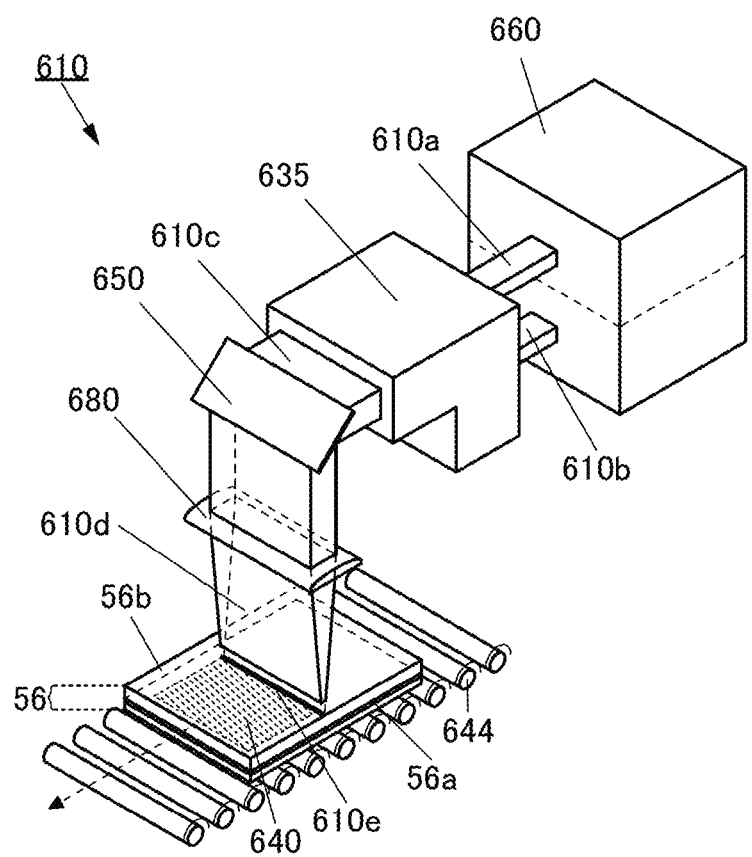
FIGS. 22A and 22B are drawings illustrating an example of a laser irradiation unit.

FIG. 22(A) illustrates an example of the laser irradiation unit 610 using an excimer laser. Laser light 610a and laser light 610b emitted from an excimer laser apparatus 660 having two laser oscillators are synthesized by an optical system 635. Moreover, laser light 610c that is extended horizontally by the optical system 635 is incident on a lens 680 via a mirror 650. Laser light 610d transmitted through the lens 680 is reduced compared with the laser light 610c. At this time, a processing region 640 included in the stack 56 is irradiated with the laser light 610d through the support 56b (e.g., a glass substrate). Hereinafter, part of the laser light 610d with which the processing region 640 is irradiated is referred to as a linear beam 610e.

Note that although the example including two laser oscillators is described here, the structure including one laser oscillator may be used, in which case the apparatus can be simplified. Furthermore, the structure including three or more laser oscillators may be used, in which case the intensity of the linear beam 610e can be increased.

By moving the stack 56 by the transfer roller 644 in a direction indicated by an arrow in the drawing, the processing region 640 can be irradiated with the linear beam 610e.

The irradiation with the linear beam 610e is performed while the stack 56 is transferred by the transfer roller 644 at a certain speed as illustrated in FIG. 22(A); thus, the processing time can be shortened. Note that the stack 56 may be placed on a stage that is movable at least in one direction, and the irradiation with the linear beam 610e may be performed while the stage is moved. Note that in the case of using a stage, the stage is preferably movable in a lateral direction with respect to a travelling direction and a height direction and is preferably capable of adjusting the position or the depth of the focus of the linear beam 610e. Note that although FIG. 22(A) illustrates an example where the irradiation with the linear beam 610e is performed by moving the stack 56, one embodiment of the present invention is not limited thereto. For example, the stack 56 may be irradiated with the linear beam 610e by fixing the stack 56 and moving the excimer laser apparatus 660 or the like.

In the example illustrated in FIG. 22(A), the processing region 640 that is irradiated with the linear beam 610e is located inward from an end portion of the stack 56. Thus, a region outside the processing region 640 maintains a strong adhesion state, which can prevent peeling during transfer. Note that the width of the linear beam 610e may be the same as that of the stack 56 or larger than that of the stack 56. In that case, the whole stack 56 can be irradiated with the linear beam 610e.

Figure 22B:
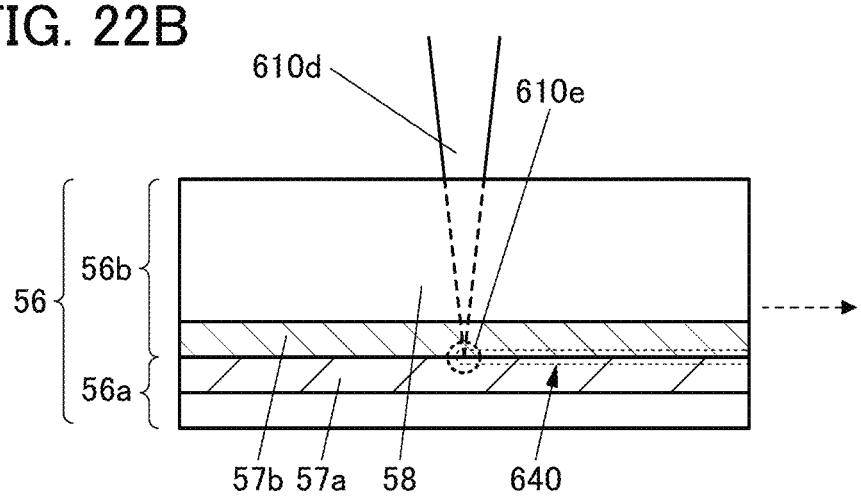

FIG. 22(B) illustrates a state where the processing region 640 of the stack 56 is irradiated with the linear beam 610e. The stack 56 includes a formation substrate 58, a first layer 57a, and a second layer 57b. Here, a portion including the formation substrate 58 and the second layer 57b corresponds to the support 56b, and a portion including the first layer 57a corresponds to the member 56a to be peeled.

For example, the first layer 57a corresponds to the resin layer 123 and the second layer 57b corresponds to the metal compound layer 105.

It is preferable that the laser light 610d pass through the formation substrate 58 and an interface between the first layer 57a and the second layer 57b or the vicinity thereof be irradiated with the linear beam 610e. It is particularly preferable that the focus of the linear beam 610e be positioned at the interface between the first layer 57a and the second layer 57b or the vicinity thereof.

Furthermore, when the focus of the linear beam 610e is positioned at the interface between the first layer 57a and the second layer 57b, water which might exist at the interface between the first layer 57a and the second layer 57b is vaporized and the volume of the water rapidly increases in some cases. In that case, a peeling phenomenon is assumed to occur at the interface between the first layer 57a and the second layer 57b or the vicinity thereof owing to the increase in the volume of the water.

Note that there is a technique of crystallizing an amorphous silicon film by irradiation of the amorphous silicon film with laser light. In the case of the technique, the laser light is focused on the inside of the amorphous silicon film. However, in one embodiment of the present invention, as illustrated in FIG. 22(B), the focus of the laser light (here, the linear beam 610e) is at the interface between the first layer 57a and the second layer 57b or the vicinity thereof. In this manner, one embodiment of the present invention is different from the technique of crystallizing an amorphous silicon film in the focus position of laser light.

Furthermore, in the case where the depth of the focus of the linear beam 610e is sufficiently large (deep), the focus of the linear beam 610e is positioned not only at the interface between the first layer 57a and the second layer 57b or in the vicinity thereof but also across the entire first layer 57a in the thickness direction, the entire second layer 57b in the thickness direction, or both the entire first layer 57a and the entire second layer 57b in the thickness directions in some cases.

Note that as the excimer laser, a laser having a wavelength of 308 nm or longer is preferably used. When the wavelength is 308 nm or longer, the laser light that is necessary for processing can be sufficiently transmitted even when a glass substrate is used for the support 56b.

The substrate reversing unit 630 illustrated in FIG. 21 is a unit for turning the stack 56 upside down. For example, the substrate reversing unit 630 can include transfer rollers between which the stack 56 is sandwiched from above and below and the transfer rollers can include a rotatable mechanism. Note that the structure of the substrate reversing unit 630 is not limited thereto, and the transfer rollers between which the stack 56 is sandwiched from above and below may be placed in a spiral, or the substrate reversing unit 630 may include a transfer arm which is capable of reversing.

In the stack 56 after passing through the substrate reversing unit 630, the member 56a to be peeled is positioned on the upper side as illustrated in FIG. 21.

The tape reel 602 can unreel the support 601 in a rolled sheet form. The speed at which the support 601 is unreeled is preferably adjustable. When the speed is set relatively low, for example, failure in peeling of the stack or a crack in a peeled member can be inhibited.

The wind-up reel 683 can wind up the stack 59.

The tape reel 602 and the wind-up reel 683 can apply tension to the support 601.

The support 601 is unreeled continuously or intermittently. It is preferable to unreel the support 601 continuously because peeling can be performed at a uniform speed and with a uniform force. In a peeling process, the peeling preferably proceeds successively without a stop in the middle, and further preferably, the peeling proceeds at a constant speed. When the peeling stops in the middle of the process and then the peeling resumes from the same region, distortion or the like occurs in the region, unlike in the case where the peeling successively proceeds. Thus, a minute structure of the region or the characteristics of an electronic device or the like in the region is/are changed, which might influence display of a display device, for example.

As the support 601, a film in a rolled sheet form made of an organic resin, a metal, an alloy, glass, or the like can be used.

In FIG. 21, the support 601 is a member that constitutes a device to be fabricated (e.g., a flexible device) together with the member 56a to be peeled, which is typified by a flexible substrate. The support 601 may be a member that does not constitute the device to be fabricated, which is typified by a carrier tape.

The delivery direction of the support 601 can be changed by the direction changing roller 604. In the example illustrated in FIG. 21, the direction changing roller 604 is positioned between the tape reel 602 and the press roller 606.

The support 601 is bonded to the stack 56 (the member 56a to be peeled) by the press roller 606 and the transfer roller 646.

In the structure illustrated in FIG. 21, the support 601 can be prevented from being in contact with the stack 56 before reaching the press roller 606. Accordingly, air bubbles can be inhibited from being included between the support 601 and the stack 56.

The press roller 606 is rotated by a driving portion (e.g., a motor) which is not illustrated. When the press roller 606 rotates, the force of peeling the member 56a to be peeled is applied to the stack 56; thus, the member 56a to be peeled is peeled. At this time, preferably, a peeling trigger has been formed in the stack 56. Peeling of the member 56a to be peeled starts from the peeling trigger. As a result, the stack 56 is divided into the member 56a to be peeled and the support 56b.

The mechanism that peels the member 56a to be peeled from the stack 56 is not limited to the press roller 606, and a structure body having a convex surface (or a convex curved surface or a convex-shaped curved surface) can be used. For example, a cylindrical (including circular cylindrical, right circular cylindrical, elliptic cylindrical, parabolic cylindrical, and the like) or spherical structure body can be used. A roller such as a drum-shaped roller can be used, for example. Examples of the shape of the structure body include a column with a bottom surface constituted by a curved line (e.g., a cylinder with a perfect circle-shaped bottom surface or an elliptic cylinder with an ellipse-shaped bottom surface), and a column with a bottom surface constituted by a curved line and a straight line (e.g., a column with a semicircular bottom surface or a semi-elliptical bottom surface). When the shape of the structure body is any of such columns, the convex surface corresponds to a curved surface of the column.

As a material for the structure body, a metal, an alloy, an organic resin, rubber, and the like can be given. The structure body may have a space or a hollow inside. As the rubber, natural rubber, urethane rubber, nitrile rubber, neoprene rubber, and the like can be given. In the case of using rubber, it is preferable to use a material unlikely to be charged by friction or peeling or to take countermeasures to prevent static electricity. For example, the press roller 606 illustrated in FIG. 21 includes a hollow cylinder 606a formed using rubber or an organic resin and a circular cylinder 606b formed using a metal or an alloy and positioned inside the cylinder 606a.

The rotation speed of the press roller 606 is preferably adjustable. By adjusting the rotation speed of the press roller 606, the yield of peeling can be further increased.

The press roller 606 and the plurality of transfer rollers may be movable in at least one direction (e.g., vertically, horizontally, or back and forth). The distance between the convex surface of the press roller 606 and a supporting surface of the transfer roller is preferably adjustable because peeling can be performed on stacks with a variety of thicknesses.

There is no particular limitation on an angle at which the press roller 606 bends back the support 601. FIG. 21 illustrates an example where the press roller 606 bends back the support 601 at an obtuse angle.

The stack fabrication apparatus illustrated in FIG. 21 further includes a roller 617. The roller 617 can deliver the support 601 from the press roller 606 to the wind-up reel 683 along the convex surface.

The roller 617 is movable in one or more directions.

The roller 617 can apply tension to the support 601 by moving the shaft of the roller 617. That is, the roller 617 is also referred to as a tension roller. Specifically, the support 601 can be pulled in the delivery direction changed with the press roller 606.

Moving the shaft of the roller 617 enables the roller 617 to control the angle at which the press roller 606 bends back the support 601.

The roller 617 can bend back the support 601 to change the delivery direction of the support 601. For example, the delivery direction of the support 601 may be changed to the horizontal direction. Alternatively, after the roller 617 bends back the support 601 to change the delivery direction of the support 601, the delivery direction of the support 601 may be further changed to the horizontal direction by a direction changing roller 607 located between the roller 617 and the wind-up reel 683.

The stack fabrication apparatus illustrated in FIG. 21 further includes guide rollers (e.g., guide rollers 631, 632, and 633), a wind-up reel 613, a liquid feeding mechanism 659, a drying mechanism 614, and ionizers (ionizers 639 and 620).

The stack fabrication apparatus may include a guide roller that guides the support 601 to the wind-up reel 683. One guide roller may be used, or a plurality of guide rollers may be used. Like the guide roller 632, the guide roller may be capable of applying tension to the support 601.

A tape 600 (also called separate film) may be bonded to at least one surface of the support 601. In this case, the stack fabrication apparatus preferably includes a reel that can wind up the tape 600 bonded to one surface of the support 601. FIG. 21 illustrates an example in which the wind-up reel 613 is positioned between the tape reel 602 and the press roller 606. Furthermore, the stack fabrication apparatus may include a guide roller 634. The guide roller 634 can guide the tape 600 to the wind-up reel 613.

The stack fabrication apparatus may include the drying mechanism 614. Since a functional element (e.g., a transistor or a thin film integrated circuit) included in the member 56a to be peeled is vulnerable to static electricity, it is preferable that a liquid be fed to an interface between the member 56a to be peeled and the support 56b before peeling or that the peeling be performed while a liquid is fed to the interface. Furthermore, the presence of the liquid in the portion where the peeling proceeds can decrease the force required for the peeling. The peeling can be performed while a liquid is fed to the interface with the use of the liquid feeding mechanism 659. Since a watermark might be formed if the liquid is vaporized while being adhered to the member 56a to be peeled, the liquid is preferably removed immediately after the peeling. Thus, blowing is preferably performed on the member 56a to be peeled including a functional element to remove a droplet left on the member 56a to be peeled. Therefore, watermark generation can be suppressed. Furthermore, a carrier plate 609 may be provided to prevent slack in the support 601.

It is preferable that an air flow downward along the inclination of the support 601 so that the droplet drips down while the support 601 is transferred in an oblique direction relative to the horizontal plane.

Although the transfer direction of the support 601 can also be perpendicular to the horizontal plane, the transfer direction that is oblique to the horizontal plane enables higher stability and less shaking of the support 601 during the transfer.

During the process, a static eliminator included in the stack fabrication apparatus is preferably used at a position where static electricity might be generated. There is no particular limitation on the static eliminator, and for example, a corona discharge ionizer, a soft X-ray ionizer, or an ultraviolet ionizer can be used.

For example, it is preferable that the stack fabrication apparatus be provided with an ionizer and static elimination be performed by spraying the member 56a to be peeled with air, a nitrogen gas, or the like from the ionizer to reduce the influence of static electricity on the functional element. It is particularly preferable to use the ionizer in a step of bonding two members to each other and a step of dividing one member.

For example, the stack 56 is preferably divided into the member 56a to be peeled and the support 56b while the vicinity of the interface between the member 56a to be peeled and the support 56b is irradiated with ions using the ionizer 639 to remove static electricity.

The stack fabrication apparatus may include a substrate load cassette 641 and a substrate unload cassette 642. For example, the stack 56 can be supplied to the substrate load cassette 641. The substrate load cassette 641 can supply the stack 56 to the transfer mechanism or the like. Furthermore, the support 56b can be supplied to the substrate unload cassette 642.

A tape reel 672 can unreel the support 671 in a rolled sheet form. For the support 671, a material similar to that for the support 601 can be used.

The tape reel 672 and the wind-up reel 683 can apply tension to the support 671.

The stack fabrication apparatus may include guide rollers 677, 678, and 679 that guide the support 671 to the wind-up reel 683.

The delivery direction of the support 671 can be changed by the direction changing roller 676.

A press roller 675 can bond the member 56a to be peeled to the support 671 that is unreeled by the tape reel 672 while applying pressure to them. Accordingly, inclusion of air bubbles between the support 671 and the member 56a to be peeled can be inhibited.

A separation tape 670 may be bonded to at least one surface of the support 671. A reel 673 can wind up the separation tape 670. A guide roller 674 can guide the separation tape 670 to the reel 673.

The fabricated stack 59 may be wound up or cut. FIG. 21 illustrates an example in which the wind-up reel 683 winds up the stack 59. A guide roller guiding the stack 59 to the wind-up reel 683, such as guide rollers 665 and 666, may be provided.

In the stack fabrication apparatus illustrated in FIG. 21, the member 56a to be peeled is peeled from the stack 56 by the press roller 606 and the member 56a to be peeled can be transferred to the support 671 by the press roller 675.

This embodiment can be combined with the other embodiments and examples as appropriate.

Embodiment 4

Described in this embodiment is a metal oxide applicable to a transistor disclosed in one embodiment of the present invention. In particular, details about a metal oxide and a cloud-aligned composite (CAC)-OS are described below.

A CAC-OS or a CAC-metal oxide has a conducting function in a part of the material and has an insulating function in a part of the material; as a whole, the CAC-OS or the CAC-metal oxide has a function of a semiconductor. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC-metal oxide can have a switching function (On/Off function). In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, a high on-state current and high field-effect mobility.

In other words, the CAC-OS or the CAC-metal oxide can also be called a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. It is particularly preferable that the metal oxide contain indium and zinc. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a c-axis aligned crystal (CAAC) structure. Note that the CAAC structure is a crystal structure in which a plurality of IGZO nanocrystals have c-axis alignment and are connected on the a-b plane without alignment.

On the other hand, the CAC-OS relates to the material composition of a metal oxide. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a film formation gas. Furthermore, the ratio of the flow rate of an oxygen gas to the total flow rate of the film formation gas at the time of film formation is preferably as low as possible, and for example, the flow rate ratio of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

In contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions containing $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

Moreover, a semiconductor element using the CAC-OS has high reliability. Thus, the CAC-OS is most suitable for a variety of semiconductor devices such as displays.

This embodiment can be combined with the other embodiments and examples as appropriate.

Embodiment 5

In this embodiment, electronic devices of one embodiment of the present invention will be described with reference to FIG. 23 and FIG. 24.

A thin, lightweight, and highly reliable electronic device can be fabricated according to one embodiment of the present invention. A highly reliable electronic device with a curved surface can be fabricated according to one embodiment of the present invention. In addition, a flexible and highly reliable electronic device can be fabricated according to one embodiment of the present invention.

Examples of electronic devices include a digital camera, a digital video camera, a digital photo frame, a mobile phone, a portable game console, a portable information terminal, and an audio reproducing device in addition to electronic devices provided with a comparatively large screen, such as a television device, a desktop or laptop personal computer, a monitor for a computer and the like, digital signage, and a large game machine such as a pachinko machine.

The electronic device of this embodiment can be incorporated along a curved surface of an inside wall or an outside wall of a house or a building or the interior or the exterior of a car.

The electronic device of this embodiment may include an antenna. When a signal is received by the antenna, an image, information, or the like can be displayed on the display portion. Moreover, when the electronic device includes an antenna and a secondary battery, the antenna may be used for contactless power transmission.

The electronic device of this embodiment may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radioactive rays, flow rate, humidity, gradient, oscillation, smell, or infrared rays).

The electronic device of this embodiment can have a variety of functions. For example, the electronic device can have a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 23A:
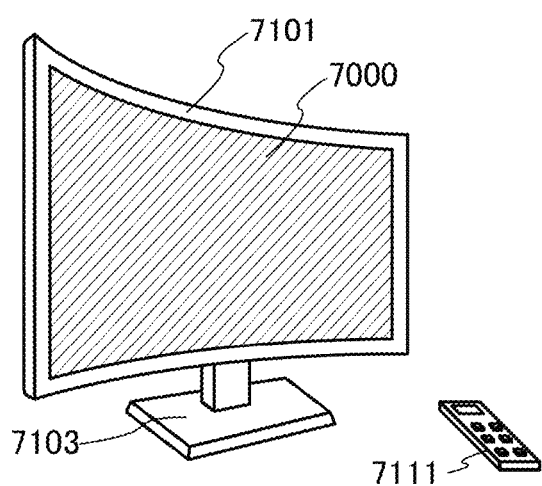
FIGS. 23A-23D are drawings illustrating examples of electronic devices.

FIG. 23(A) illustrates an example of a television device. In a television device 7100, a display portion 7000 is incorporated into a housing 7101. Here, a structure where the housing 7101 is supported by a stand 7103 is shown.

The display device of one embodiment of the present invention can be used for the display portion 7000.

The television device 7100 illustrated in FIG. 23(A) can be operated with an operation switch provided in the housing 7101 or a separate remote controller 7111. Alternatively, the display portion 7000 may include a touch sensor, in which case the television device 7100 can be operated by touch on the display portion 7000 with a finger or the like. The remote controller 7111 may include a display portion that displays information to be output from the remote controller 7111. With operation keys or a touch panel included in the remote controller 7111, channels and volume can be controlled and images displayed on the display portion 7000 can be controlled.

Note that the television device 7100 is configured to include a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) information communication can also be performed.

Figure 23B:
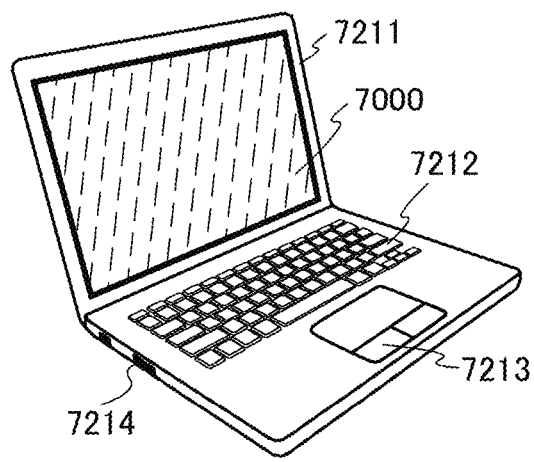

FIG. 23(B) illustrates an example of a laptop personal computer. A laptop personal computer 7200 includes a housing 7211, a keyboard 7212, a pointing device 7213, an external connection port 7214, and the like. The display portion 7000 is incorporated into the housing 7211.

The display device of one embodiment of the present invention can be used for the display portion 7000.

Figure 23C:
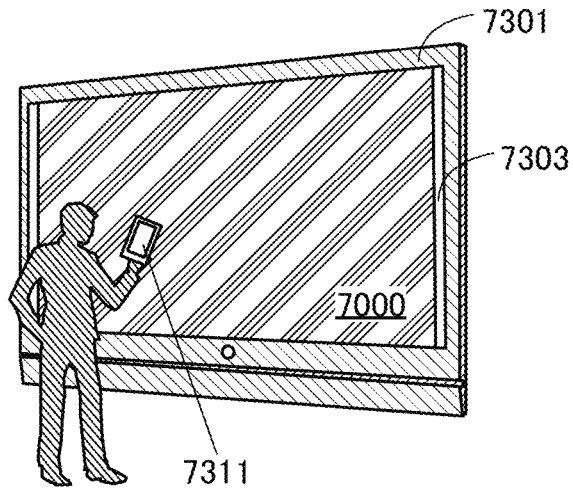
Figure 23D:
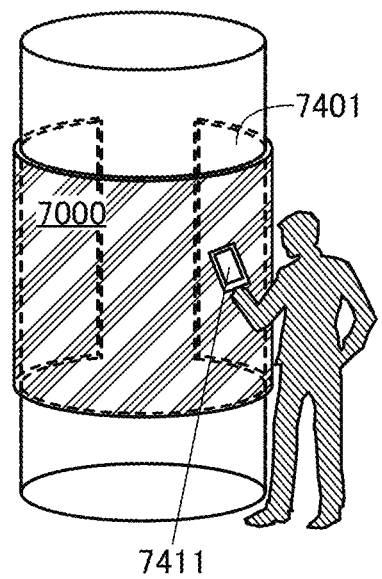

FIGS. 23(C) and 23(D) illustrate examples of digital signage.

Digital signage 7300 illustrated in FIG. 23(C) includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 23(D) illustrates digital signage 7400 mounted on a cylindrical pillar 7401. The digital signage 7400 includes the display portion 7000 provided along a curved surface of the pillar 7401.

In FIGS. 23(C) and 23(D), the display device of one embodiment of the present invention can be used for the display portion 7000.

The larger display portion 7000 can increase the amount of information that can be provided at a time. In addition, the larger display portion 7000 attracts more attention, and for example, the effectiveness of the advertisement can be increased.

It is preferable to use a touch panel in the display portion 7000, in which case intuitive operation by a user in addition to display of an image or a moving image on the display portion 7000 is possible. Moreover, for an application for providing information such as route information or traffic information, usability can be enhanced by intuitive operation.

Furthermore, as illustrated in FIGS. 23(C) and 23(D), it is preferred that the digital signage 7300 or the digital signage 7400 be capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. Moreover, display on the display portion 7000 can be switched by operating the information terminal 7311 or the information terminal 7411.

It is also possible to make the digital signage 7300 or the digital signage 7400 execute a game with the use of the screen of the information terminal 7311 or the information terminal 7411 as an operation means (a controller). Thus, an unspecified number of people can join in and enjoy the game concurrently.

FIGS. 24(A) to 24(E) illustrate electronic devices. These electronic devices include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device fabricated using one embodiment of the present invention can be favorably used for the display portion 9001. Thus, the electronic devices can be fabricated with a high yield.

The electronic devices illustrated in FIGS. 24(A) to 24(E) can have a variety of functions. For example, they can have a function of displaying a variety of information (e.g., a still image, a moving image, and a text image) on the display portion, a touch panel function, a function of displaying a calendar, date, time, or the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a memory medium and displaying it on the display portion. Note that the functions which the electronic devices illustrated in FIGS. 24(A) to 24(E) have are not limited to these, and they may have other functions.

Figure 24A:
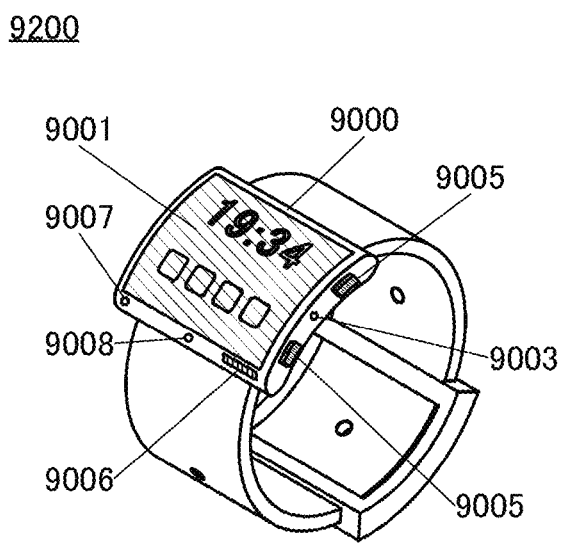
FIGS. 24A-24E are drawings illustrating examples of electronic devices.
Figure 24B:
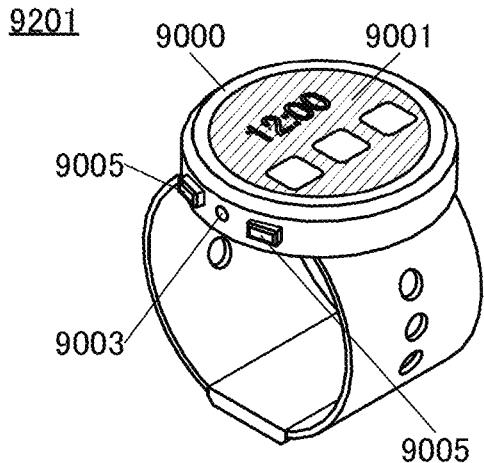

FIG. 24(A) and FIG. 24(B) are perspective views illustrating a wristwatch-type portable information terminal 9200 and a wristwatch-type portable information terminal 9201, respectively.

The portable information terminal 9200 illustrated in FIG. 24(A) is capable of executing a variety of applications such as mobile phone calls, e-mailing, text viewing and writing, music reproduction, Internet communication, and computer games. In addition, the display portion 9001 is provided such that its display surface is curved, and display can be performed along the curved display surface. Moreover, the portable information terminal 9200 can perform standards-based near field communication. For example, mutual communication with a headset capable of wireless communication enables hands-free calling. Furthermore, the portable information terminal 9200 includes the connection terminal 9006 and can exchange data directly with another information terminal through a connector. Power charging through the connection terminal 9006 is also possible. Note that the charging operation may be performed by wireless power feeding without through the connection terminal 9006.

Unlike in the portable information terminal illustrated in FIG. 24(A), the display surface of the display portion 9001 is not curved in the portable information terminal 9201 illustrated in FIG. 24(B). Furthermore, the external shape of the display portion of the portable information terminal 9201 is a non-rectangular shape (a circular shape in FIG. 24(B)).

Figure 24C:
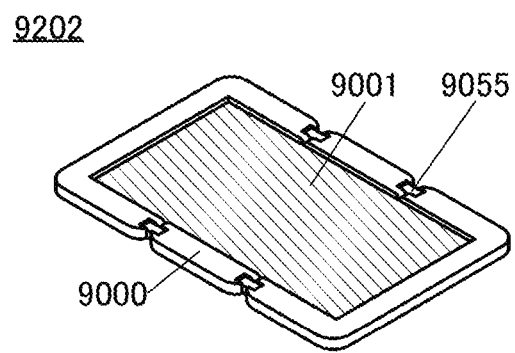
Figure 24D:
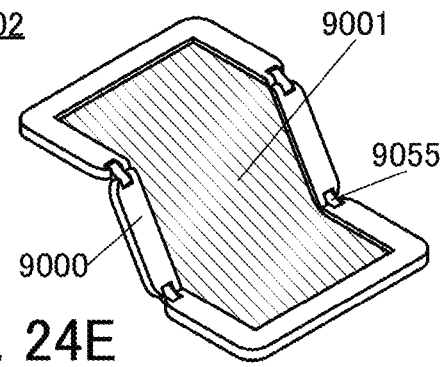
Figure 24E:
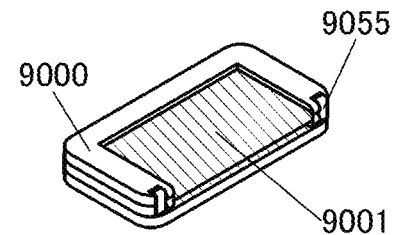

FIGS. 24(C) to 24(E) are perspective views illustrating a foldable portable information terminal 9202. Note that FIG. 24(C) is a perspective view of the portable information terminal 9202 in an open state; FIG. 24(D) is a perspective view of the portable information terminal 9202 that is being changed from one of an open state and a folded state to the other; and FIG. 24(E) is a perspective view of the portable information terminal 9202 in a folded state.

The portable information terminal 9202 is highly portable in a folded state and has high display browsability due to a seamless large display region in an open state. The display portion 9001 included in the portable information terminal 9202 is supported by three housings 9000 joined with hinges 9055. By being bent between two housings 9000 with the hinges 9055, the portable information terminal 9202 can be reversibly changed in shape from an open state to a folded state. For example, the portable information terminal 9202 can be bent with a radius of curvature greater than or equal to 1 mm and less than or equal to 150 mm.

This embodiment can be combined with the other embodiments and examples as appropriate.

Example 1

In this example, results of peeling a functional layer from a formation substrate by the peeling method of one embodiment of the present invention will be described.

<Sample Fabrication>

First, steps before formation of a functional layer over a formation substrate will be described with reference to FIG. 4, and then, the step of forming the functional layer over the formation substrate and the subsequent steps will be described with reference to FIG. 2.

In this example, two kinds of samples (Sample A1 and Sample A2) which were different in the thickness of a metal layer formed over the formation substrate were fabricated. Three of each of Samples A1 and Samples A2 were fabricated; one was used for cross-sectional observation before peeling, another was used for XPS analysis after peeling, and the other was used for cross-sectional observation after peeling.

First, as illustrated in FIG. 4(A), the metal layer 102 was formed over the formation substrate 101.

As the formation substrate 101, an approximately 0.7-mm-thick glass substrate was used. As the metal layer 102, a titanium film was formed by a sputtering method. At the time of the formation of the titanium film, an argon gas with a flow rate of 100 sccm was used as the process gas, the pressure was 0.3 Pa, and the power was 58 kW. The thickness of the titanium film of Sample A1 was approximately 35 nm, and the thickness of the titanium film of Sample A2 was approximately 20 nm.

Next, $H_2O$ plasma treatment was performed on a surface of the metal layer 102 (FIG. 4(B)) to form the layer 103 containing a metal oxide (FIG. 4(C)). In the $H_2O$ plasma treatment, the bias power was 4500 W, the ICP power was 0 W, the pressure was 15 Pa, the treatment time was 600 sec, and water vapor with a flow rate of 250 sccm was used as the process gas. In this example, the $H_2O$ plasma treatment oxidized the surface side of the metal layer 102. Thus, a stacked-layer structure of the titanium film over the formation substrate 101 and the titanium oxide film over the titanium film was formed as the layer 103 containing a metal oxide.

Next, as illustrated in FIG. 4(D), the first layer 122 was formed over the layer 103 containing a metal oxide.

The first layer 122 was formed using a photosensitive material containing a polyimide resin precursor. The material was applied to a thickness of approximately 3 μm.

Next, the layer 103 containing a metal oxide and the first layer 122 were subjected to baking in a nitrogen-containing atmosphere (while a nitrogen gas was supplied) at 450° C. for one hour, whereby the metal compound layer 105 and the resin layer 123 were formed (FIG. 4(E1)).

Next, as illustrated in FIG. 2(A), the functional layer 135 was formed over the resin layer 123, and a UV-peeling tape (corresponding to the adhesive layer 145 and the substrate 146 in FIG. 2(A)) was bonded onto the functional layer 135.

As the functional layer 135, a stacked-layer structure including a silicon oxynitride film and a silicon nitride film was formed. The thickness of the stacked-layer structure was approximately 650 nm.

<Cross-Sectional Observation of Sample Before Peeling>

Next, the results of cross-sectional STEM observation of Sample A1 and Sample A2 before peeling will be described. Note that the results of each sample are those of cross-sectional observation after the formation of the metal compound layer 105 and the resin layer 123. Specifically, cross-sectional STEM observation of Sample A1 was performed after the formation of the functional layer 135, and cross-sectional STEM observation of Sample A2 was performed after the formation of the resin layer 123.

Figure 25A:
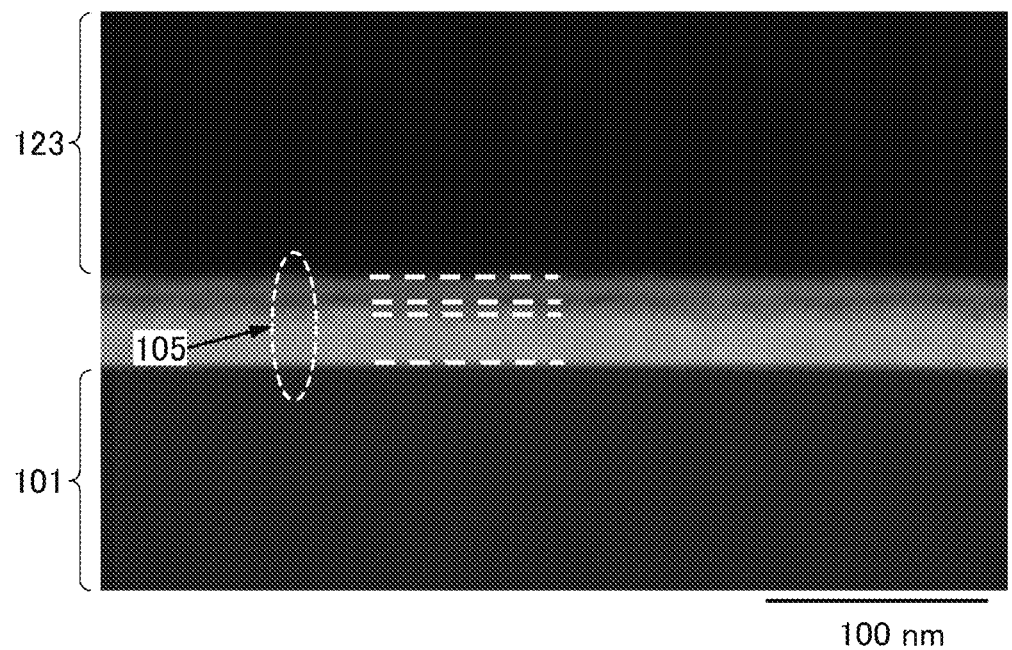
FIGS. 25A and 25B are observation photographs of cross sections of samples in Example 1.

FIG. 25(A) shows results of the cross-sectional observation of Sample A1. The metal compound layer 105 appeared to be divided into three layers, and it was suggested that the metal compound layer 105 had a three-layer structure as shown in FIG. 4(E2). The metal compound layer 105 had a thickness of approximately 45 nm, the first compound layer 111 had a thickness of approximately 13 nm, the second compound layer 112 had a thickness of approximately 8 nm, and the third compound layer 113 had a thickness of approximately 24 nm. Note that the thicknesses of the layers were obtained by using a length measuring function of the STEM in each example.

Figure 25B:
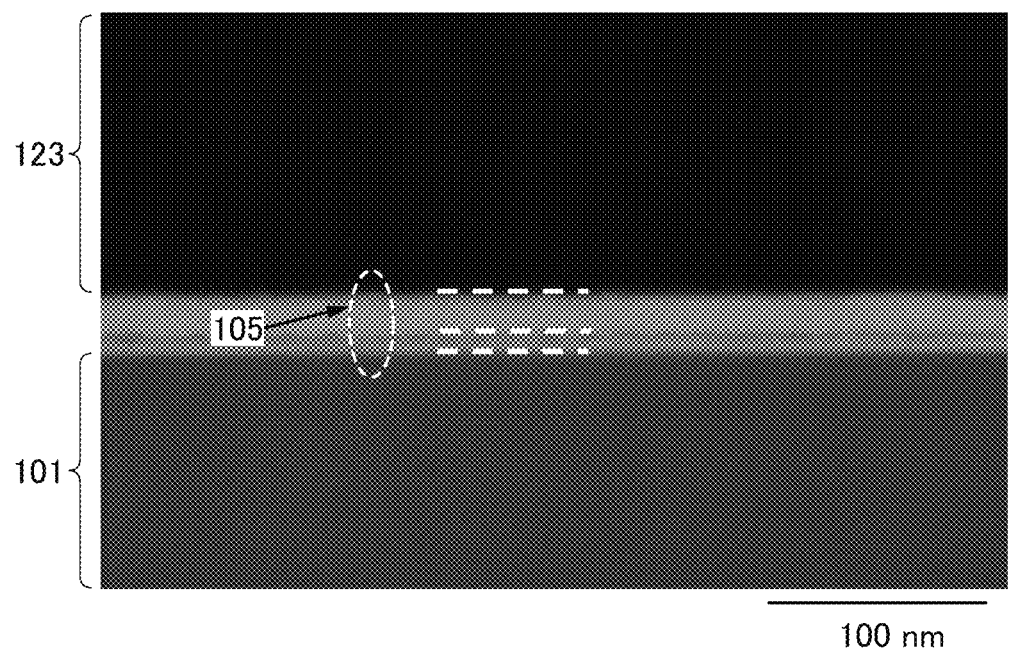

FIG. 25(B) shows results of the cross-sectional observation of Sample A2. The metal compound layer 105 appeared to be divided into two layers, and it was suggested that the metal compound layer 105 had a two-layer structure as shown in FIG. 4(E3). The metal compound layer 105 had a thickness of approximately 30 nm, the first compound layer 111 had a thickness of approximately 21 nm, and the second compound layer 112 had a thickness of approximately 9 nm.

<Peeling>

Next, as illustrated in FIG. 2(B), irradiation with the laser light 155 was performed from the formation substrate 101 side. Then, the resin layer 123 was peeled from the formation substrate 101.

As a laser oscillator for the laser light, a XeCl excimer laser with a wavelength of 308 nm was used. The short-axis light-condensing width of the beam was 625 µm, the number of shots was 10, the repetition rate was 60 Hz, the scanning speed was 3.75 mm/second, and the energy density was approximately 360 mJ/cm$^2$.

Note that the absorptance of light with a wavelength of 308 nm by the glass substrate used as the formation substrate 101 was approximately 51%. The absorptance of light with a wavelength of 308 nm by the stacked-layer structure of the formation substrate 101 and the metal compound layer 105 was approximately 87% in the case of Sample A1 (the thickness of the metal compound layer 105 was approximately 45 nm), and was approximately 85% in the case of Sample A2 (the thickness of the metal compound layer 105 was approximately 30 nm). Thus, all of the interface between the metal compound layer 105 and the resin layer 123, the inside of the metal compound layer 105, and the inside of the resin layer 123 were presumably irradiated with the laser light.

In each of Sample A1 and Sample A2, the functional layer 135 was favorably peeled. In particular, the force required for peeling was smaller in Sample A1 than in Sample A2.

<Cross-Sectional Observation of Sample after Peeling>

Figure 26A:
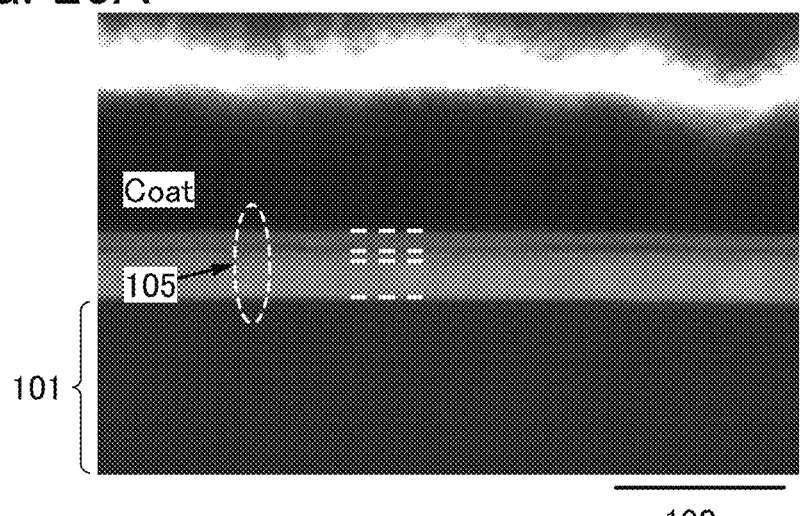
FIGS. 26A-26C are observation photographs of cross sections of a sample in Example 1.
Figure 26B:
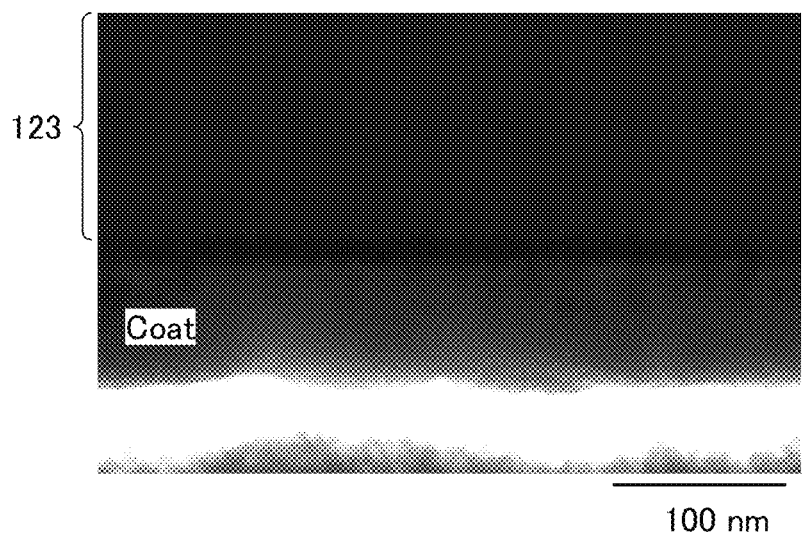

Next, cross-sectional STEM observation of Sample A1 and Sample A2 after peeling was performed. FIG. 26(A) shows cross-sectional observation results of the formation substrate 101 side of Sample A1; FIG. 26(B) shows cross-sectional observation results of the substrate 146 side of Sample A1; and FIG. 26(C) shows cross-sectional observation results of the formation substrate 101 side of Sample A2.

Figure 26C:
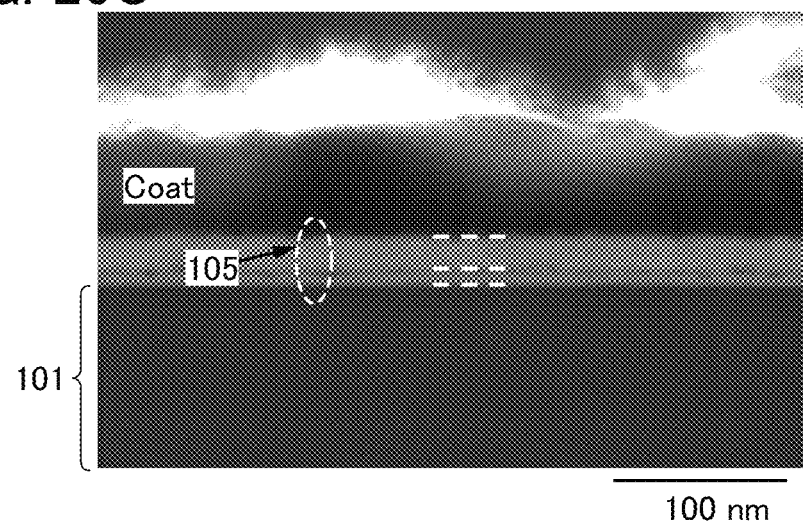

From the results in FIGS. 25(A) and 25(B) and FIGS. 26(A) and 26(C), no significant difference was observed in the structure and thickness of the metal compound layer 105 before and after the peeling. In FIG. 26(A), the metal compound layer 105 had a thickness of approximately 42 nm, the first compound layer 111 had a thickness of approximately 12 nm, the second compound layer 112 had a thickness of approximately 6 nm, and the third compound layer 113 had a thickness of approximately 24 nm. In FIG. 26(C), the metal compound layer 105 had a thickness of approximately 32 nm, the first compound layer 111 had a thickness of approximately 23 nm, and the second compound layer 112 had a thickness of approximately 9 nm.

As shown in FIGS. 26(A) and 26(C), the resin layer 123 was not observed between the metal compound layer 105 and a coat layer (Coat) that was formed for observation in either Sample A1 or Sample A2. As shown in FIG. 26(B), in Sample A1, the metal compound layer 105 was not observed between the resin layer 123 and the coat layer that was formed for observation. Thus, separation probably occurred between the metal compound layer 105 and the resin layer 123 as illustrated in FIG. 2(C1). Note that the black portion seen between the resin layer 123 and the coat layer in FIG. 26(B) is film separation due to damage at the time of the cross-sectional observation.

<Depth-Direction Analysis of Sample after Peeling>

Next, XPS analysis was conducted on Sample A1 and Sample A2 after peeling to obtain the proportions of oxygen atoms (O), titanium atoms (Ti), nitrogen atoms (N), and silicon atoms (Si) in the metal compound layer 105 in the depth direction. Here, sputtering and measurement were performed from the surface side of the metal compound layer 105 that was exposed by peeling.

Figure 27A:
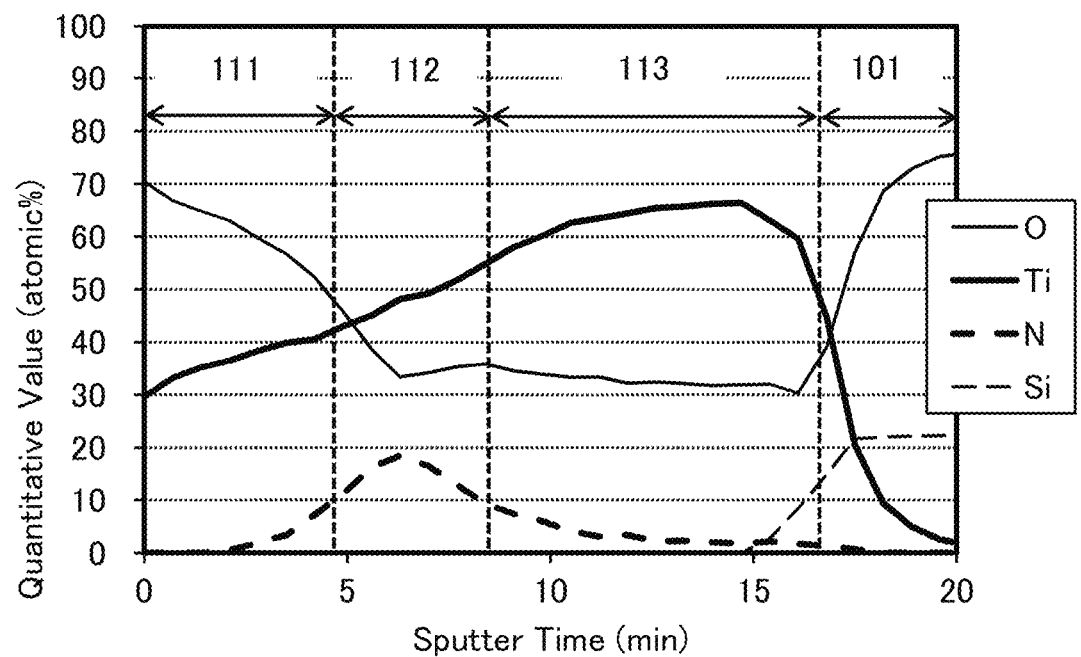
FIGS. 27A and 27B are XPS analysis results of samples in Example 1.
Figure 27B:
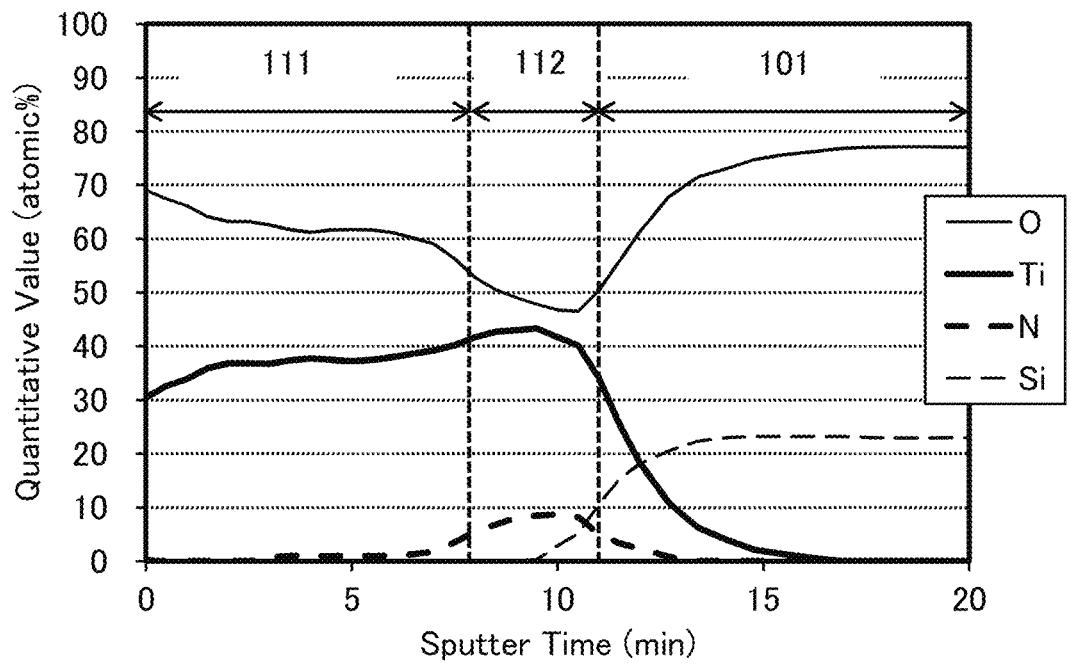

FIG. 27(A) shows the XPS analysis results of Sample A1, and FIG. 27(B) shows the XPS analysis results of Sample A2. In FIGS. 27(A) and 27(B), the horizontal axis represents the sputtering time (Sputter Time) (min), and the vertical axis represents the quantitative value (atomic %).

From the XPS analysis results, it was checked that the metal compound layer 105 of Sample A1 had a three-layer structure as illustrated in FIG. 4(E2) and the metal compound layer 105 of Sample A2 had a two-layer structure as illustrated in FIG. 4(E3).

Note that in the XPS analysis described in this specification and the like, the boundary between the first layer and the second layer and the boundary between the second layer and the third layer in the metal compound layer 105 were determined with the half value of the peak area of an N1s spectrum. The boundary between the formation substrate 101 and the metal compound layer 105 was determined with the half value of the peak area of a Ti2p spectrum. However, for convenience of drawing a diagram, the shown boundaries might be deviated from the determined positions.

From FIGS. 27(A) and 27(B), it was found that a layer which had the highest oxygen content among the layers included in the metal compound layer 105 was the first compound layer 111. The first compound layer 111 contained oxygen more than titanium. As shown in FIG. 27(A), the proportion of oxygen contained in the first compound layer 111 of Sample A1 was approximately greater than or equal to 40 atomic % and less than or equal to 70 atomic %. As shown in FIG. 27(B), the proportion of oxygen contained in the first compound layer 111 of Sample A2 was approximately greater than or equal to 50 atomic % and less than or equal to 70 atomic %. The proportion of titanium contained in the first compound layer 111 of each sample was approximately greater than or equal to 30 atomic % and less than or equal to 45 atomic %.

From FIGS. 27(A) and 27(B), it was found that a layer which had the highest nitrogen content among the layers included in the metal compound layer 105 was the second compound layer 112. As shown in FIG. 27(A), the proportion of nitrogen contained in the second compound layer 112 of Sample A1 was approximately greater than or equal to 10 atomic % and less than or equal to 20 atomic %. As shown in FIG. 27(B), the proportion of nitrogen contained in the second compound layer 112 of Sample A2 was approximately greater than or equal to 5 atomic % and less than or equal to 10 atomic %.

As shown in FIG. 27(A), the metal compound layer 105 included the third compound layer 113 in Sample A1. The proportion of oxygen contained in the third compound layer 113 of Sample A1 was approximately greater than or equal to 30 atomic % and less than or equal to 40 atomic %.

In addition, the metal compound layer 105 contained almost no silicon; specifically, the proportion of silicon contained in the first compound layer 111 was approximately less than or equal to 5 atomic %.

The results of the XPS analysis revealed that the first compound layer 111 contained titanium oxide (TiO$_a$ (a>1)), the second compound layer 112 contained titanium oxynitride (TiO$_b$N$_c$ (b>0, c>0)), and the third compound layer 113 contained titanium oxide (TiO$_e$ (0<e<a)).

It was checked from the results in this example that the formation substrate 101 can be peeled at the interface between the metal compound layer 105 and the resin layer 123 by the peeling method of one embodiment of the present invention.

In this example, the force required for peeling was smaller in Sample A1, in which the metal layer 102 was formed to be thick, than in Sample A2. The cross-sectional observation and the XPS analysis before and after peeling showed a difference in the structure of the metal compound layer 105 between the two samples. Specifically, it was suggested that the peelability was affected by a difference between the two-layer structure and the three-layer structure, a difference in the amount of nitrogen contained in the second compound layer 112, and the like.

Example 2

In this example, results of peeling a functional layer from a formation substrate by the peeling method of one embodiment of the present invention will be described.
<Sample Fabrication>

First, steps before formation of a functional layer over a formation substrate will be described with reference to FIG. 1 and FIG. 5, and then, the step of forming the functional layer over the formation substrate and the subsequent steps will be described with reference to FIG. 2.

In this example, two kinds of samples (Sample B1 and Sample B2) which were different in a formation method of the metal compound layer 105 were fabricated. Two of each of Samples B1 and Samples B2 were fabricated; one was used for cross-sectional observation and the other was used for XPS analysis.

First, as illustrated in FIG. 1(A) and FIG. 5(A), the metal layer 102 was formed over the formation substrate 101. In Sample B1, the metal nitride layer 104 was formed over the metal layer 102 (FIG. 5(A)).

As the formation substrate 101, an approximately 0.7-mm-thick glass substrate was used. As the metal layer 102, an approximately 20-nm-thick titanium film was formed by a sputtering method. At the time of the formation of the titanium film, an argon gas with a flow rate of 100 sccm was used as the process gas, the pressure was 0.3 Pa, and the power was 58 kW. As the metal nitride layer 104, an approximately 10-nm-thick titanium nitride film was formed by a sputtering method. At the time of the formation of the titanium nitride film, a nitrogen gas with a flow rate of 210 sccm was used as the process gas, the pressure was 0.4 Pa, and the power was 10 kW.

Next, H$_2$O plasma treatment was performed on a surface of the metal layer 102 or a surface of the metal nitride layer 104 (not shown). In the H$_2$O plasma treatment, the bias power was 4500 W, the ICP power was 0 W, the pressure was 15 Pa, the treatment time was 120 sec (Sample B1) or 600 sec (Sample B2), and water vapor with a flow rate of 250 sccm was used as the process gas. In this example, the H$_2$O plasma treatment oxidized the surface side of the metal layer 102 or the surface side of the metal nitride layer 104 to form a layer containing a metal oxide. Thus, in Sample B1, as the layer containing a metal oxide, a stacked-layer structure of a titanium film over the formation substrate 101, a titanium nitride film over the titanium film, and a titanium oxide film over the titanium nitride film was formed. In Sample B2, as the layer containing a metal oxide, a stacked-layer structure of a titanium film over the formation substrate 101 and a titanium oxide film over the titanium film was formed.

Next, the first layer 122 was formed over the layer containing a metal oxide (FIG. 1(B) and FIG. 5(B)).

The first layer 122 was formed using a photosensitive material containing a polyimide resin precursor. The material was applied to a thickness of approximately 3 µm.

Next, the layer containing a metal oxide and the first layer 122 were subjected to baking in a nitrogen-containing atmosphere (while a nitrogen gas was supplied) at 450° C. for two hours, whereby the metal compound layer 105 and the resin layer 123 were formed (FIG. 1(C1) and FIG. 5(C1)).

Next, as illustrated in FIG. 2(A), the functional layer 135 was formed over the resin layer 123, and a UV-peeling tape (corresponding to the adhesive layer 145 and the substrate 146 in FIG. 2(A)) was bonded onto the functional layer 135.

As the functional layer 135, a stacked-layer structure including a silicon oxynitride film and a silicon nitride film was formed. The thickness of the stacked-layer structure was approximately 650 nm.
<Cross-Sectional Observation of Sample>

Next, the results of cross-sectional STEM observation of Sample B1 and Sample B2 will be described. Note that the results of each sample are those of cross-sectional observation after the formation of the metal compound layer 105 and the resin layer 123.

Figure 28A:
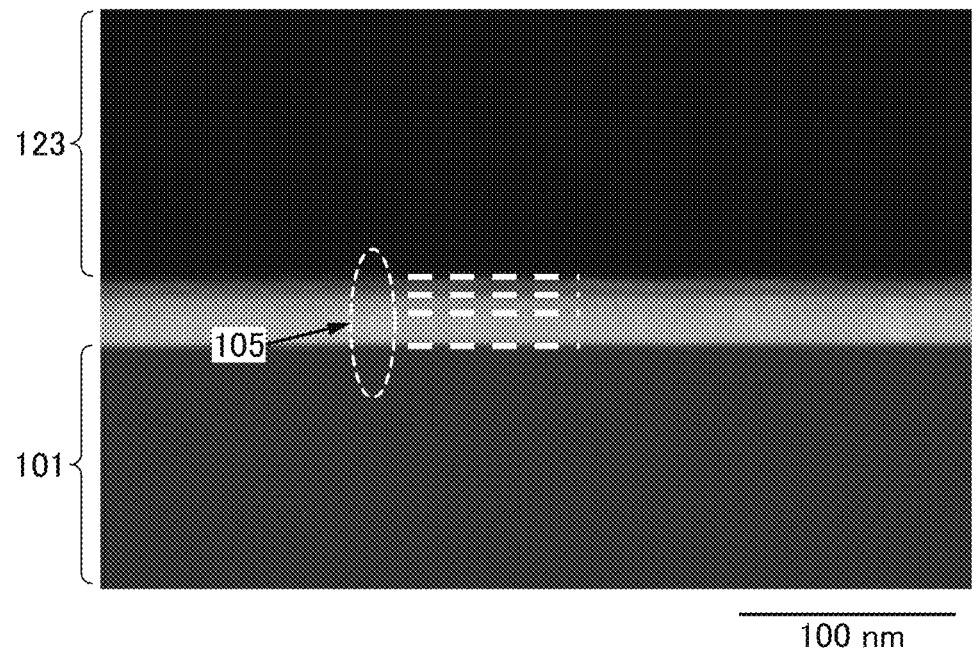
FIGS. 28A and 28B are observation photographs of cross sections of samples in Example 2.

FIG. 28(A) shows results of the cross-sectional observation of Sample B1. The metal compound layer 105 appeared to be divided into three layers, and it was suggested that the metal compound layer 105 had a three-layer structure as shown in FIG. 5(C2). The metal compound layer 105 had a thickness of approximately 35 nm, the first compound layer 111 had a thickness of approximately 9 nm, the second compound layer 112 had a thickness of approximately 11 nm, and the third compound layer 113 had a thickness of approximately 15 nm.

Figure 28B:
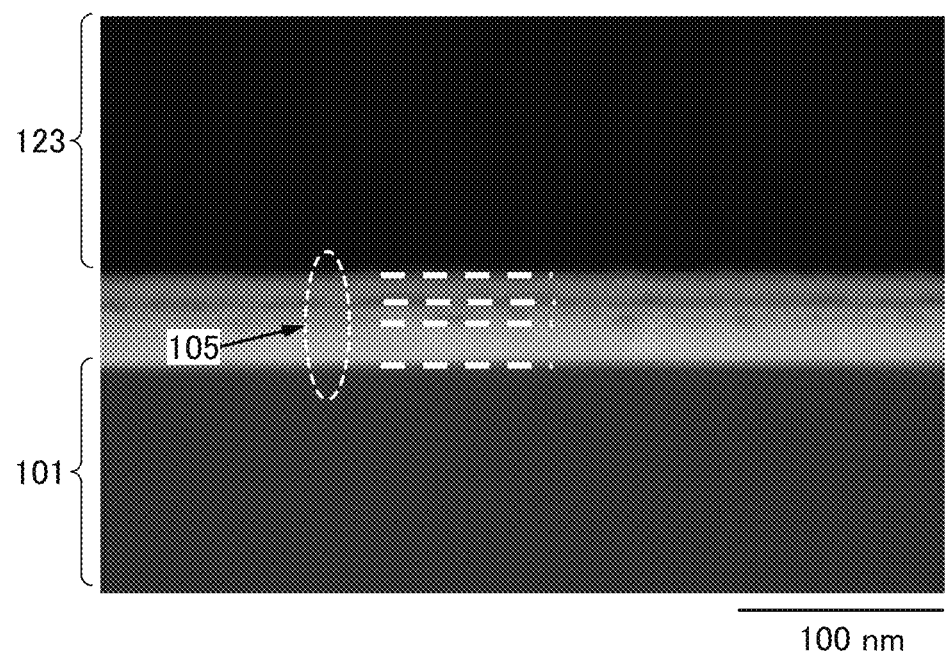

FIG. 28(B) shows results of the cross-sectional observation of Sample B2. The metal compound layer 105 appeared to be divided into three layers, and it was suggested that the metal compound layer 105 had a three-layer structure as shown in FIG. 1(C2). The metal compound layer 105 had a thickness of approximately 45 nm, the first compound layer 111 had a thickness of approximately 15 nm, the second compound layer 112 had a thickness of approximately 9 nm, and the third compound layer 113 had a thickness of approximately 21 nm.

<Peeling>

Next, as illustrated in FIG. 2(B), irradiation with the laser light 155 was performed from the formation substrate 101 side. Then, the resin layer 123 was peeled from the formation substrate 101.

As a laser oscillator emitting the laser light 155, a XeCl excimer laser with a wavelength of 308 nm was used. The short-axis light-condensing width of the beam was 625 μm, the number of shots was 10, the repetition rate was 60 Hz, the scanning speed was 3.75 mm/second, and the energy density was approximately 350 mJ/cm$^2$.

Note that water was fed to the peeling interface in the peeling.

In each of Sample B1 and Sample B2, the functional layer 135 was favorably peeled.

<Depth-Direction Analysis of Sample>

Next, XPS analysis was conducted on Sample B1 and Sample B2 to obtain the proportions of oxygen atoms (O), titanium atoms (Ti), nitrogen atoms (N), and silicon atoms (Si) in the metal compound layer 105 in the depth direction. Here, sputtering and measurement were performed from the surface side of the metal compound layer 105.

Figure 29A:
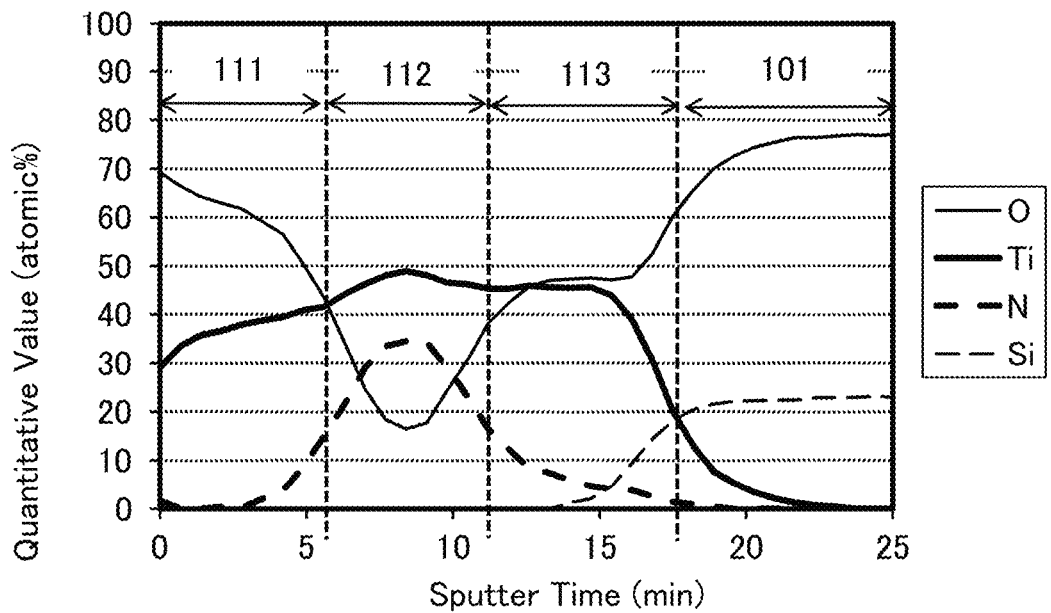
FIGS. 29A and 29B are XPS analysis results of samples in Example 2.
Figure 29B:
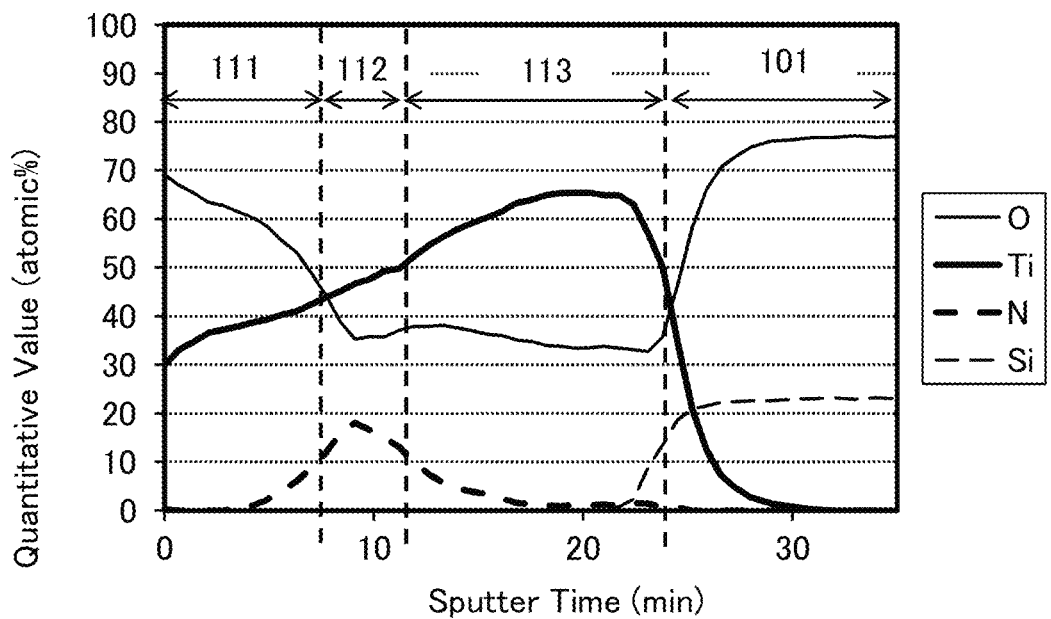

FIG. 29(A) shows the XPS analysis results of Sample B 1, and FIG. 29(B) shows the XPS analysis results of Sample B2. In FIGS. 29(A) and 29(B), the horizontal axis represents the sputtering time (min), and the vertical axis represents the quantitative value (atomic %).

From the XPS analysis results, it was checked that the metal compound layer 105 of each of Sample B1 and Sample B2 had a three-layer structure as illustrated in FIG. 1(C2) and FIG. 5(C2).

From FIGS. 29(A) and 29(B), it was found that a layer which had the highest oxygen content among the layers included in the metal compound layer 105 was the first compound layer 111. The first compound layer 111 contained oxygen more than titanium. As shown in FIGS. 29(A) and 29(B), the proportion of oxygen contained in the first compound layer 111 of each of Sample B1 and Sample B2 was approximately greater than or equal to 40 atomic % and less than or equal to 70 atomic %. The proportion of titanium contained in the first compound layer 111 of each of Sample B1 and Sample B2 was approximately greater than or equal to 30 atomic % and less than or equal to 45 atomic %.

From FIGS. 29(A) and 29(B), it was found that a layer which had the highest nitrogen content among the layers included in the metal compound layer 105 was the second compound layer 112. As shown in FIG. 29(A), the proportion of nitrogen contained in the second compound layer 112 of Sample B1 was approximately greater than or equal to 20 atomic % and less than or equal to 40 atomic %. As shown in FIG. 29(B), the proportion of nitrogen contained in the second compound layer 112 of Sample B2 was approximately greater than or equal to 10 atomic % and less than or equal to 20 atomic %.

As shown in FIG. 29(A), the proportion of oxygen contained in the third compound layer 113 of Sample B1 was approximately greater than or equal to 30 atomic % and less than or equal to 70 atomic %. As shown in FIG. 29(B), the proportion of oxygen contained in the third compound layer 113 of Sample B2 was approximately greater than or equal to 30 atomic % and less than or equal to 40 atomic %.

In addition, the metal compound layer 105 contained almost no silicon; specifically, the proportion of silicon contained in the first compound layer 111 was approximately less than or equal to 5 atomic %.

The results of the XPS analysis revealed that the first compound layer 111 contained titanium oxide (TiO$_a$ (a>1)), the second compound layer 112 contained titanium oxynitride (TiO$_b$N$_e$ (b>0, c>0)), and the third compound layer 113 contained titanium oxide (TiO$_e$ (0<e<a)).

It was checked from the results in this example that the formation substrate 101 can be peeled at the interface between the metal compound layer 105 and the resin layer 123 by the peeling method of one embodiment of the present invention.

In this example, the functional layer 135 was favorably peeled in each of the two samples that were different in the fabrication method of the metal compound layer 105. The cross-sectional observation and the XPS analysis showed that the two samples had commonalities in the structure of the metal compound layer 105. Specifically, it was suggested that the peelability was affected by the use of the three-layer structure, the sufficient amount of nitrogen contained in the second compound layer 112, and the like.

Example 3

In Example 1 and Example 2, it was checked by the XPS analysis that nitrogen was contained in the metal compound layer 105. In this example, in which step the nitrogen enters the metal film or the metal compound film was examined.

Two possible supply sources of nitrogen are the resin layer 123 and the nitrogen-containing atmosphere in baking. In this example, whether or not nitrogen enters the metal film or the metal compound film by performing baking in a nitrogen-containing atmosphere on the metal film and the metal compound film without forming the resin layer 123 was examined.

<Sample Fabrication>

A method for fabricating samples of this example is described with reference to FIGS. 6(A), 6(B1), and 6(B2). In this example, two kinds of samples (Sample C1 and Sample C2) were fabricated. Two of Samples C1 were formed; one was used for cross-sectional observation and the other was used for XPS analysis. One Sample C2 was formed to be used for XPS analysis.

Sample C1 and Sample C2 were formed in such a manner that the metal layer 102 was formed over the formation substrate 101, baking was performed in a nitrogen-containing atmosphere without forming the first layer 122, and then, the metal compound layer 105 was formed.

In Sample C1, the metal layer 102 was formed over the formation substrate 101, the metal layer 102 was subjected to H$_2$O plasma treatment, and then, baking in a nitrogen-containing atmosphere was performed to form the metal compound layer 105. In other words, in Sample C1, the metal compound layer 105 was formed by performing baking on the layer containing a metal oxide in a nitrogen-containing atmosphere. On the other hand, in Sample C2, H$_2$O plasma treatment was not performed on the metal layer 102. In Sample C2, the metal compound layer 105 was formed by performing baking on the metal layer 102 in a nitrogen-containing atmosphere. Detailed fabrication conditions will be described below.

First, as illustrated in FIG. 6(A), the metal layer 102 was formed over the formation substrate 101.

As the formation substrate 101, an approximately 0.7-mm-thick glass substrate was used. As the metal layer 102, an approximately 35-nm-thick titanium film was formed by a sputtering method. At the time of the formation of the titanium film, an argon gas with a flow rate of 100 sccm was used as the process gas, the pressure was 0.3 Pa, and the power was 58 kW.

Next, in Sample C1, H$_2$O plasma treatment was performed on a surface of the metal layer 102 to form the layer containing a metal oxide. In Sample C2, the plasma treatment was not performed. In the H$_2$O plasma treatment, the bias power was 4500 W, the ICP power was 0 W, the pressure was 15 Pa, the treatment time was 600 sec, and water vapor with a flow rate of 250 sccm was used as the process gas. In this example, the H$_2$O plasma treatment oxidized the surface side of the metal layer 102. Thus, a stacked-layer structure of the titanium film over the formation substrate 101 and the titanium oxide film over the titanium film was formed as the layer containing a metal oxide.

Next, in Sample C1, the layer containing a metal oxide was subjected to baking in a nitrogen-containing atmosphere (while a nitrogen gas was supplied) at 450° C. for one hour, whereby the metal compound layer 105 was formed. In Sample C2, the metal layer 102 was subjected to baking in a nitrogen-containing atmosphere (while a nitrogen gas was supplied) at 450° C. for one hour, whereby the metal compound layer 105 was formed (FIG. 6(B1)).

In this manner, Sample C1 and Sample C2 were formed.

<Cross-Sectional Observation of Sample>

Next, the results of cross-sectional STEM observation of Sample C1 will be described.

Figure 30:
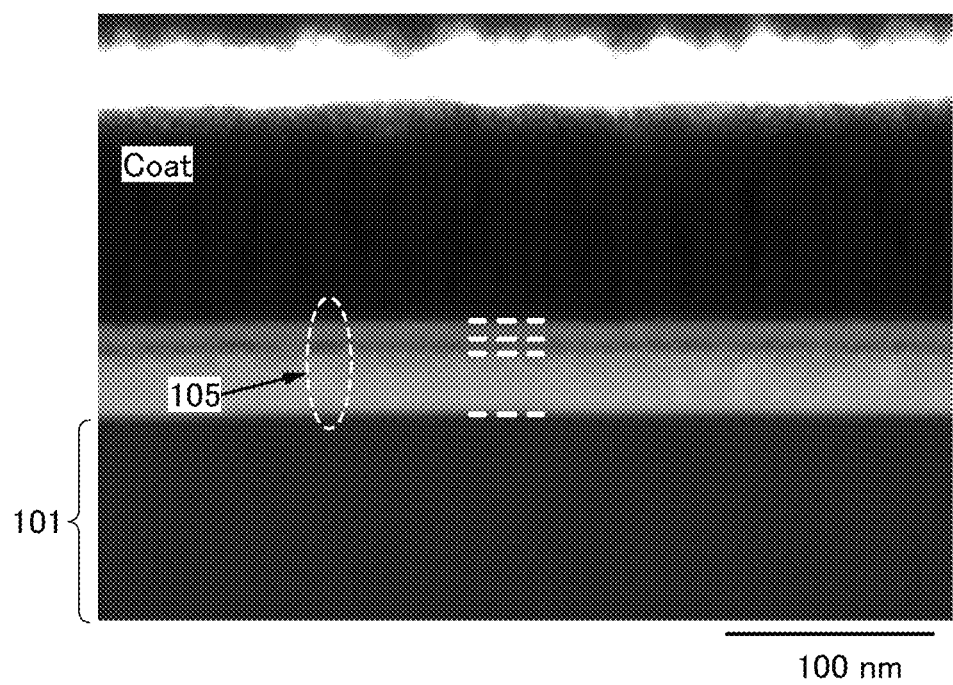
FIG. 30 is an observation photograph of a cross section of a sample in Example 3.

FIG. 30 shows results of the cross-sectional observation of Sample C1. The metal compound layer 105 appeared to be divided into three layers, and it was suggested that the metal compound layer 105 had a three-layer structure as shown in FIG. 6(B2). The metal compound layer 105 had a thickness of approximately 45 nm, the first compound layer 111 had a thickness of approximately 13 nm, the second compound layer 112 had a thickness of approximately 7 nm, and the third compound layer 113 had a thickness of approximately 25 nm.

<Depth-Direction Analysis of Sample>

Next, XPS analysis was conducted on Sample C1 and Sample C2 to obtain the proportions of oxygen atoms (O), titanium atoms (Ti), nitrogen atoms (N), and silicon atoms (Si) in the metal compound layer 105 in the depth direction. Here, sputtering and measurement were performed from the surface side of the metal compound layer 105.

Figure 31A:
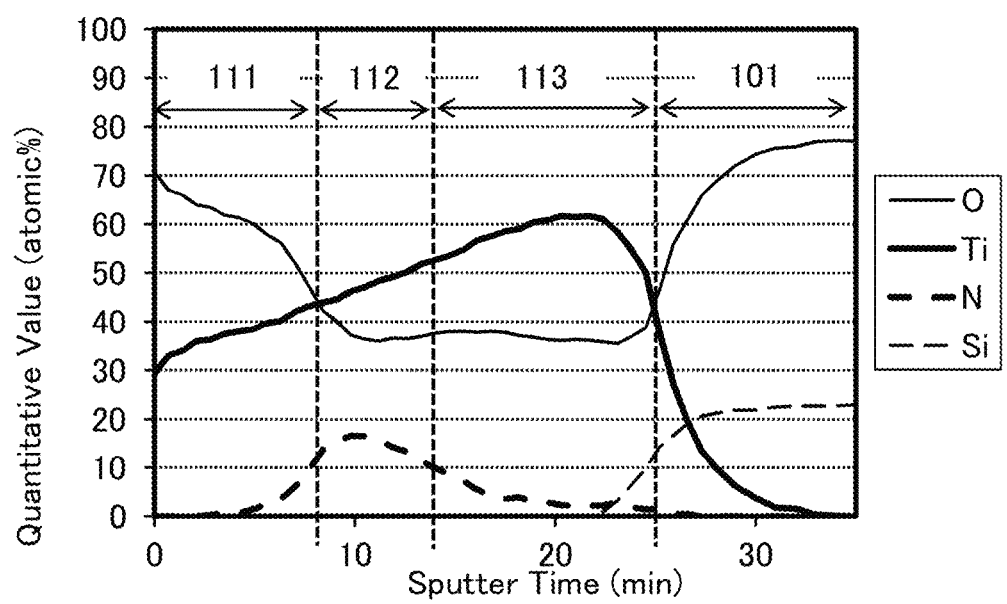
FIGS. 31A and 31B are XPS analysis results of samples in Example 3.
Figure 31B:
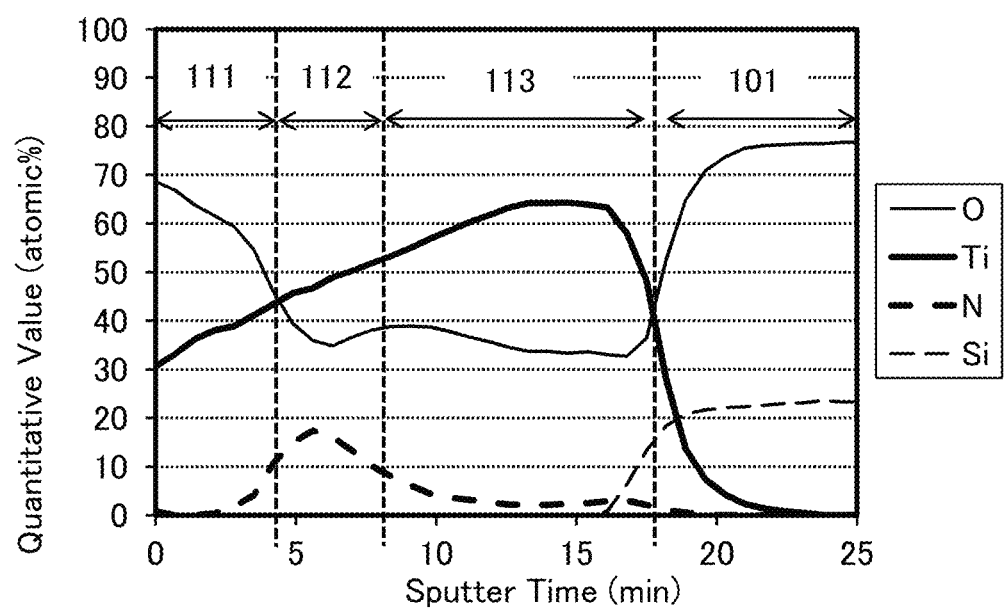

FIG. 31(A) shows the XPS analysis results of Sample C1, and FIG. 31(B) shows the XPS analysis results of Sample C2. In FIGS. 31(A) and 31(B), the horizontal axis represents the sputtering time (min), and the vertical axis represents the quantitative value (atomic %).

From the XPS analysis results, it was checked that the metal compound layer 105 of each of Sample C1 and Sample C2 had a three-layer structure as illustrated in FIG. 6(B2).

From FIGS. 31(A) and 31(B), it was found that a layer which had the highest oxygen content among the layers included in the metal compound layer 105 was the first compound layer 111. The first compound layer 111 contained oxygen more than titanium. As shown in FIGS. 31(A) and 31(B), the proportion of oxygen contained in the first compound layer 111 of each sample was approximately greater than or equal to 40 atomic % and less than or equal to 70 atomic %. The proportion of titanium contained in the first compound layer 111 of each sample was approximately greater than or equal to 30 atomic % and less than or equal to 45 atomic %.

From FIGS. 31(A) and 31(B), it was found that a layer which had the highest nitrogen content among the layers included in the metal compound layer 105 was the second compound layer 112. As shown in FIGS. 31(A) and 31(B), the proportion of nitrogen contained in the second compound layer 112 of each sample was approximately greater than or equal to 10 atomic % and less than or equal to 20 atomic %.

As shown in FIGS. 31(A) and 31(B), the proportion of oxygen contained in the third compound layer 113 of each sample was approximately greater than or equal to 30 atomic % and less than or equal to 40 atomic %.

In addition, the metal compound layer 105 contained almost no silicon; specifically, the proportion of silicon contained in the first compound layer 111 was approximately less than or equal to 5 atomic %.

In this example, the metal compound layer 105 containing nitrogen was formed by performing baking in a nitrogen-containing atmosphere even without formation of a film to be a resin layer over the metal layer 102 or the layer containing a metal oxide. It is thus presumable that nitrogen entered the metal layer 102 or the layer containing a metal oxide from the atmosphere during the baking. Furthermore, since the metal compound layer 105 contained oxygen regardless of whether the H$_2$O plasma treatment was performed, it is presumable that oxygen was contained in the atmosphere during the baking.

A sample was fabricated in such a manner that the baking in a nitrogen-containing atmosphere at 450° C. for one hour in Sample A1 in Example 1 was changed into baking in a mixed atmosphere of nitrogen and oxygen (oxygen concentration: 20%) at 450° C. for one hour, in which case the peelability was poorer than that in Sample A1 in Example 1. From the results of the cross-sectional STEM observation and the XPS analysis, it was checked that the metal compound layer 105 of this sample was a single layer of titanium oxide and hardly contained nitrogen. It is thus presumable that nitrogen entered the sample from the atmosphere during the baking. In addition, the formation of the metal compound layer 105 containing nitrogen probably can reduce the force required for peeling.

Example 4

In this example, results of peeling a resin layer from a formation substrate by the peeling method of one embodiment of the present invention will be described.

<Sample Fabrication>

The results in Example 3 suggested that the nitrogen contained in the metal compound layer 105 is supplied at the timing of the baking in a nitrogen-containing atmosphere. In view of the above, in Sample D of this example, baking was performed on the metal layer 102 in a nitrogen-containing atmosphere before the first layer 122 to be the resin layer 123 was formed, to form the metal compound layer 105. Furthermore, an acrylic resin having lower heat resistance than the polyimide resin used in Example 1 was used as a material for the resin layer 123, and baking at the time of the formation of the resin layer 123 was performed at a temperature lower than that in Example 1. Such a Sample D was formed and peelability was evaluated. Three of Samples D were fabricated; one was used for cross-sectional observation before peeling, another was used for XPS analysis after peeling, and the other was used for cross-sectional observation after peeling.

First, steps up to the step of forming the resin layer 123 over the formation substrate will be described with reference to FIG. 6, and then, the steps after the formation of the resin layer 123 over the formation substrate will be described with reference to FIG. 2.

First, as illustrated in FIG. 6(A), the metal layer 102 was formed over the formation substrate 101.

As the formation substrate 101, an approximately 0.7-mm-thick glass substrate was used. As the metal layer 102, an approximately 35-nm-thick titanium film was formed by a sputtering method. At the time of the formation of the titanium film, an argon gas with a flow rate of 100 sccm was used as the process gas, the pressure was 0.3 Pa, and the power was 58 kW.

Next, $H_2O$ plasma treatment was performed on a surface of the metal layer 102 to form a layer containing a metal oxide. In the $H_2O$ plasma treatment, the bias power was 4500 W, the ICP power was 0 W, the pressure was 15 Pa, the treatment time was 120 sec, and water vapor with a flow rate of 250 sccm was used as the process gas. In this example, the $H_2O$ plasma treatment oxidized the surface side of the metal layer 102. Thus, a stacked-layer structure of the titanium film over the formation substrate 101 and the titanium oxide film over the titanium film was formed as the layer containing a metal oxide.

Next, the layer containing a metal oxide was subjected to baking in a nitrogen-containing atmosphere (while a nitrogen gas was supplied) at 450° C. for one hour, whereby the metal compound layer 105 was formed (FIG. 6(B1)).

Next, as illustrated in FIG. 6(C), the first layer 122 was formed over the metal compound layer 105.

The first layer 122 was formed using a photosensitive material containing an acrylic resin. The material was applied to a thickness of approximately 2 μm.

Next, the metal compound layer 105 and the first layer 122 were subjected to baking in a nitrogen-containing atmosphere (while a nitrogen gas was supplied) at 300° C. for one hour, whereby the metal compound layer 105 and the resin layer 123 were formed (FIG. 6(D1)).

Next, as illustrated in FIG. 2(A), a UV-peeling tape (corresponding to the adhesive layer 145 and the substrate 146 in FIG. 2(A)) was bonded onto the resin layer 123. Note that the functional layer 135 illustrated in FIG. 2(A) was not formed in this example.

<Cross-Sectional Observation of Sample Before Peeling>

Next, the results of cross-sectional STEM observation of Sample D before peeling will be described.

Figure 32A:
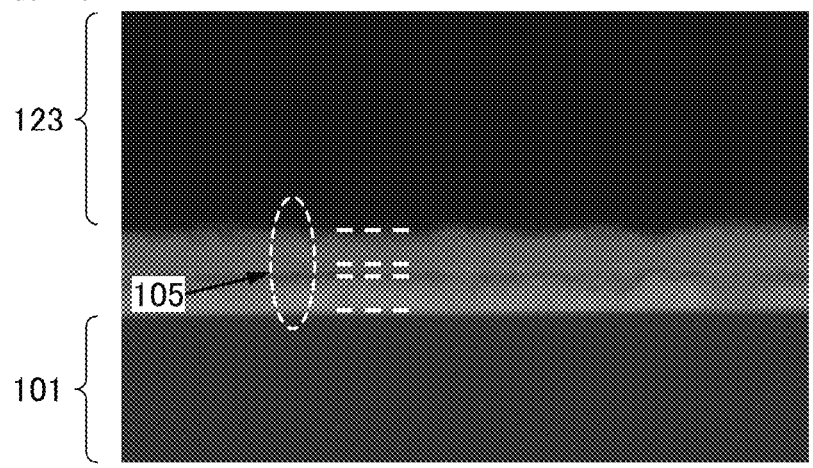
FIGS. 32A-32C are observation photographs of cross sections of a sample in Example 4.

As shown in FIG. 32(A), it was found that the metal compound layer 105 had a three-layer structure as shown in FIG. 6(D2). The metal compound layer 105 had a thickness of approximately 54 nm, the first compound layer 111 had a thickness of approximately 24 nm, the second compound layer 112 had a thickness of approximately 5 nm, and the third compound layer 113 had a thickness of approximately 25 nm.

<Peeling>

Next, as illustrated in FIG. 2(B), irradiation with the laser light 155 was performed from the formation substrate 101 side. Then, the resin layer 123 was peeled from the formation substrate 101.

As a laser oscillator for the laser light, a XeCl excimer laser with a wavelength of 308 nm was used. The short-axis light-condensing width of the beam was 625 μm, the number of shots was 10, the repetition rate was 60 Hz, the scanning speed was 3.75 mm/second, and the energy density was approximately 352 $mJ/cm^2$.

In Sample D, the resin layer 123 was peeled favorably. Note that peeling was performed favorably in both the case where water was supplied from an end portion of the sample D before peeling and the case where it was not.

<Cross-Sectional Observation of Sample after Peeling>

Figure 32B:
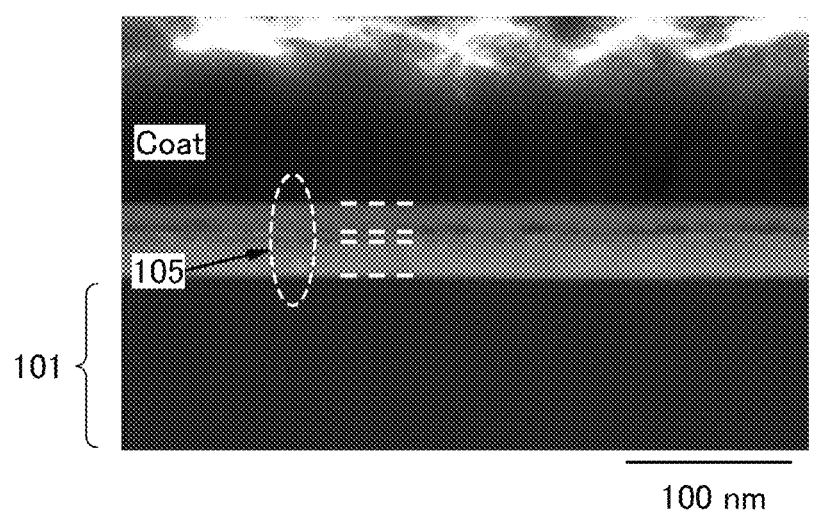
Figure 32C:
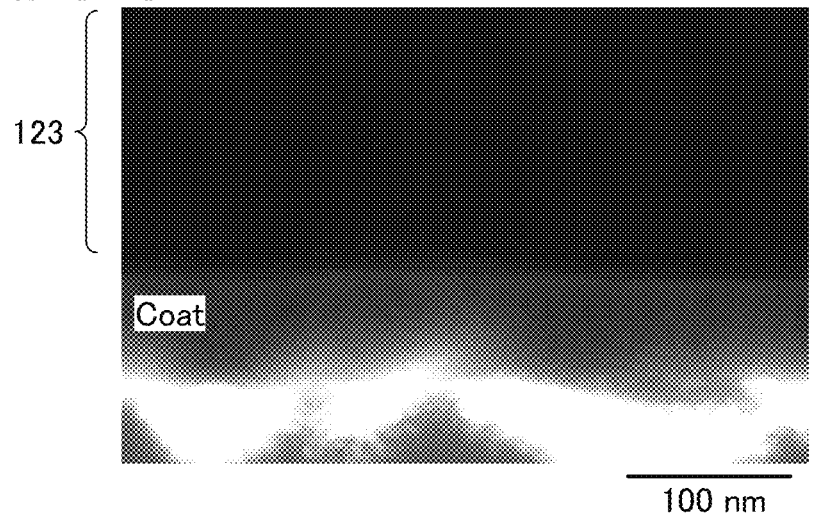

Next, cross-sectional observation STEM of Sample D after peeling was performed. FIG. 32(B) shows cross-sectional observation results of the formation substrate 101 side of Sample D, and FIG. 32(C) shows cross-sectional observation results of the substrate 146 side of Sample D.

From the results in FIGS. 32(A) and 32(B), no significant difference was found in the structure and thickness of the metal compound layer 105 before and after the peeling. In FIG. 32(B), the metal compound layer 105 had a thickness of approximately 47 nm, the first compound layer 111 had a thickness of approximately 18 nm, the second compound layer 112 had a thickness of approximately 6 nm, and the third compound layer 113 had a thickness of approximately 23 nm.

As shown in FIG. 32(B), in Sample D, the resin layer 123 was not observed between the metal compound layer 105 and a coat layer that was formed for observation. As shown in FIG. 32(C), the metal compound layer 105 was not observed between the resin layer 123 and the coat layer that was formed for observation. Thus, separation probably occurred between the metal compound layer 105 and the resin layer 123 as illustrated in FIG. 2(C1).

<Depth-Direction Analysis of Sample after Peeling>

Next, XPS analysis was conducted on Sample D after peeling to obtain the proportions of oxygen atoms (O), titanium atoms (Ti), nitrogen atoms (N), and silicon atoms (Si) in the metal compound layer 105 in the depth direction. Here, sputtering and measurement were performed from the surface side of the metal compound layer 105 that was exposed by peeling.

Figure 33:
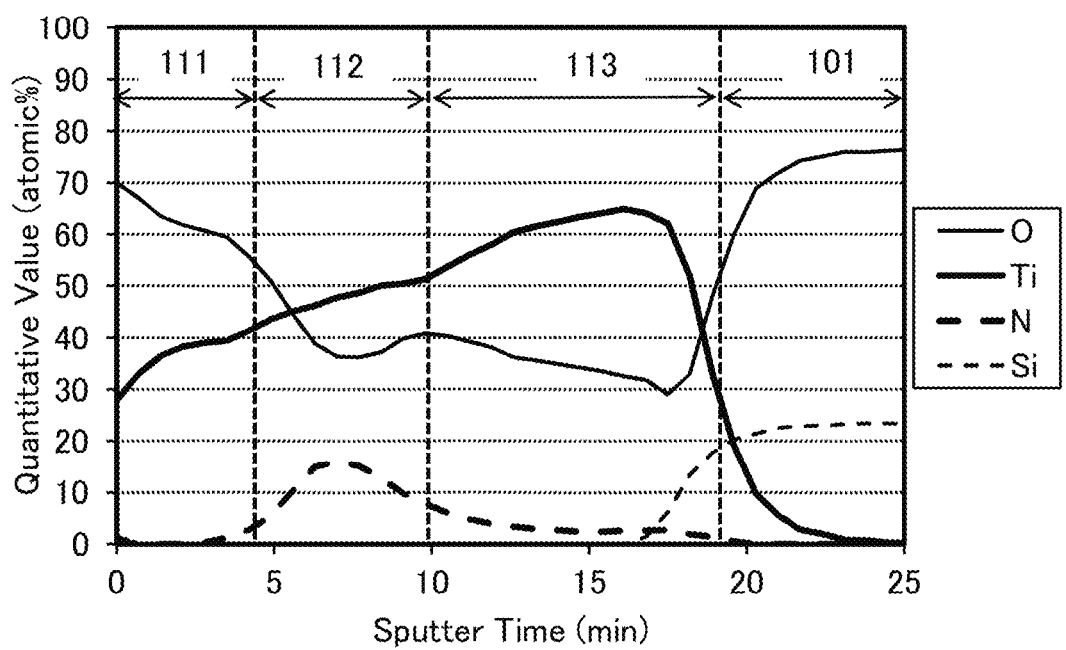
FIG. 33 is XPS analysis results of a sample in Example 4.

FIG. 33 shows the XPS analysis results of Sample D. In FIG. 33, the horizontal axis represents the sputtering time (min), and the vertical axis represents the quantitative value (atomic %).

From the XPS analysis results, it was checked that the metal compound layer 105 of Sample D had a three-layer structure as illustrated in FIG. 6(D2).

From FIG. 33, it was found that a layer which had the highest oxygen content among the layers included in the metal compound layer 105 was the first compound layer 111. The first compound layer 111 contained oxygen more than titanium. As shown in FIG. 33, the proportion of oxygen contained in the first compound layer 111 of Sample D was approximately greater than or equal to 50 atomic % and less than or equal to 70 atomic %. The proportion of titanium contained in the first compound layer 111 of Sample D was approximately greater than or equal to 30 atomic % and less than or equal to 45 atomic %.

From FIG. 33, it was found that a layer which had the highest nitrogen content among the layers included in the metal compound layer 105 was the second compound layer 112. As shown in FIG. 33, the proportion of nitrogen contained in the second compound layer 112 of Sample D was approximately greater than or equal to 10 atomic % and less than or equal to 20 atomic %.

As shown in FIG. 33, the proportion of oxygen contained in the third compound layer 113 of Sample D was approximately greater than or equal to 30 atomic % and less than or equal to 40 atomic %.

In addition, the metal compound layer 105 contained almost no silicon; specifically, the proportion of silicon contained in the first compound layer 111 was approximately less than or equal to 5 atomic %.

The results of the XPS analysis revealed that the first compound layer 111 contained titanium oxide ($TiO_a$ (a>1)), the second compound layer 112 contained titanium oxynitride (TiO$_b$N$_c$ (b>0, c>0)), and the third compound layer 113 contained titanium oxide (TiO$_e$ (0<e<a)).

It was checked from the results in this example that the formation substrate 101 can be peeled at the interface between the metal compound layer 105 and the resin layer 123 by the peeling method of one embodiment of the present invention.

In the sample of this example, favorable separation was performed between the metal compound layer 105 and the resin layer 123. Before the first layer 122 to be the resin layer 123 was formed, baking was performed on the metal layer 102 in a nitrogen-containing atmosphere, so that the metal compound layer 105 which is similar to those in Sample A1 in Example 1 and Samples B1 and B2 in Example 2 was formed. Specifically, the cross-sectional observation and the XPS analysis showed that the metal compound layer 105 had a three-layer structure and the second compound layer 112 contained nitrogen sufficiently. Moreover, it was found that favorable peelability was achieved even when the temperature applied to the resin layer 123 was lowered.

A sample was fabricated without performing the baking in a nitrogen-containing atmosphere at 450° C. for one hour, which was performed for Sample D, in which case the peelability was poorer than that in Sample D. From the results of the XPS analysis, it was checked that the metal compound layer 105 of this sample hardly contained nitrogen. Accordingly, it is presumable that by baking the layer containing a metal oxide in a nitrogen-containing atmosphere to form the metal compound layer 105 containing nitrogen, the force required for peeling can be reduced.

Example 5

In this example, results of peeling a functional layer from a formation substrate by the peeling method of one embodiment of the present invention will be described.
<Sample Fabrication>

First, steps before formation of a functional layer over a formation substrate will be described with reference to FIG. 7, and then, the step of forming the functional layer over the formation substrate and the subsequent steps will be described with reference to FIG. 2.

In this example, the metal compound layer 105 and the resin layer 123 were formed to have an island-like shape. In this example, two kinds of samples (Sample E1 and Sample E2) which were different in the timing of processing a film to be the metal compound layer 105 into an island-like shape were fabricated.

First, as illustrated in FIGS. 7(A1) and 7(B1), the metal layer 102 was formed over the formation substrate 101.

As the formation substrate 101, an approximately 0.7-mm-thick glass substrate was used. As the metal layer 102, an approximately 35-nm-thick titanium film was formed by a sputtering method. At the time of the formation of the titanium film, an argon gas with a flow rate of 100 sccm was used as the process gas, the pressure was 0.3 Pa, and the power was 58 kW.

Next, in Sample E1, H$_2$O plasma treatment was performed on a surface of the metal layer 102 (FIG. 7(B1)) to form the layer 103 containing a metal oxide (FIG. 7(C1)). In the H$_2$O plasma treatment, the bias power was 4500 W, the ICP power was 0 W, the pressure was 15 Pa, the treatment time was 600 sec, and water vapor with a flow rate of 250 sccm was used as the process gas. In this example, the H$_2$O plasma treatment oxidized the surface side of the metal layer 102. Thus, a stacked-layer structure of the titanium film over the formation substrate 101 and the titanium oxide film over the titanium film was formed as the layer 103 containing a metal oxide. Furthermore, a resist mask was formed over the layer 103 containing a metal oxide, the layer 103 containing a metal oxide was etched by a dry etching method, and then, the resist mask was removed, whereby the layer 103 containing a metal oxide was processed into an island-like shape (FIG. 7(D1)).

In contrast, in Sample E2, the metal layer 102 was first processed into an island-like shape by a dry etching method (FIG. 7(B2)). After that, H$_2$O plasma treatment was performed on a surface of the island-shaped metal layer 102 (FIG. 7(C2)) to form the island-shaped layer 103 containing a metal oxide (FIG. 7(D2)). Note that the conditions of the plasma treatment were similar to those of Sample E1.

Next, as illustrated in FIG. 7(E), the first layer 122 was formed over the layer 103 containing a metal oxide.

The first layer 122 was formed using a photosensitive material containing a polyimide resin precursor. The thickness at the time of application of the material was approximately 3 μm.

Next, the layer 103 containing a metal oxide and the first layer 122 were subjected to baking in a nitrogen-containing atmosphere (while a nitrogen gas was supplied) at 450° C. for two hours, whereby the metal compound layer 105 and the resin layer 123 were formed (FIG. 7(F)).

The subsequent steps will be described with reference to FIG. 2. Note that the samples in this example are different from the stacked-layer structure of FIG. 2 in that the metal compound layer 105 and the resin layer 123 are formed in an island-like shape.

Next, as illustrated in FIG. 2(A), the functional layer 135 was formed over the resin layer 123, and a UV-peeling tape (corresponding to the adhesive layer 145 and the substrate 146 in FIG. 2(A)) was bonded onto the functional layer 135.

As the functional layer 135, a stacked-layer structure including a silicon oxynitride film and a silicon nitride film was formed. The thickness of the stacked-layer structure was approximately 650 nm.
<Peeling>

Next, as illustrated in FIG. 2(B), irradiation with the laser light 155 was performed from the formation substrate 101 side. Then, the resin layer 123 was peeled from the formation substrate 101.

As a laser oscillator for the laser light, a XeCl excimer laser with a wavelength of 308 nm was used. The short-axis light-condensing width of the beam was 625 μm, the number of shots was 10, the repetition rate was 60 Hz, the scanning speed was 3.75 mm/second, and the energy density was approximately 440 mJ/cm$^2$.

Before the peeling, water was supplied from an end portion of the sample.

In each of Sample E1 and Sample E2, the functional layer 135 was favorably peeled. In particular, the force required for peeling was smaller in Sample E1 than in Sample E2. Accordingly, it was found that the force required for peeling can be smaller in the case where the H$_2$O plasma treatment is performed to form the metal compound layer 105 and then the metal compound layer 105 is processed than in the case where the H$_2$O plasma treatment is performed on the island-shaped metal layer 102 to form the metal compound layer 105. This is probably because the discharging conditions during the plasma treatment are different between before and after the processing of the metal layer 102 into an island-like shape, leading to a difference in the oxidation state of the surface of the metal layer 102. In other words, it is presumable that the metal layer 102 can be oxidized more uniformly and the force required for peeling can be smaller in the case where the metal layer 102 is oxidized before the metal layer 102 is processed into an island-like shape (in a state before the metal layer 102 is patterned).

<Cross-Sectional Observation of Sample after Peeling>

Figure 34A:
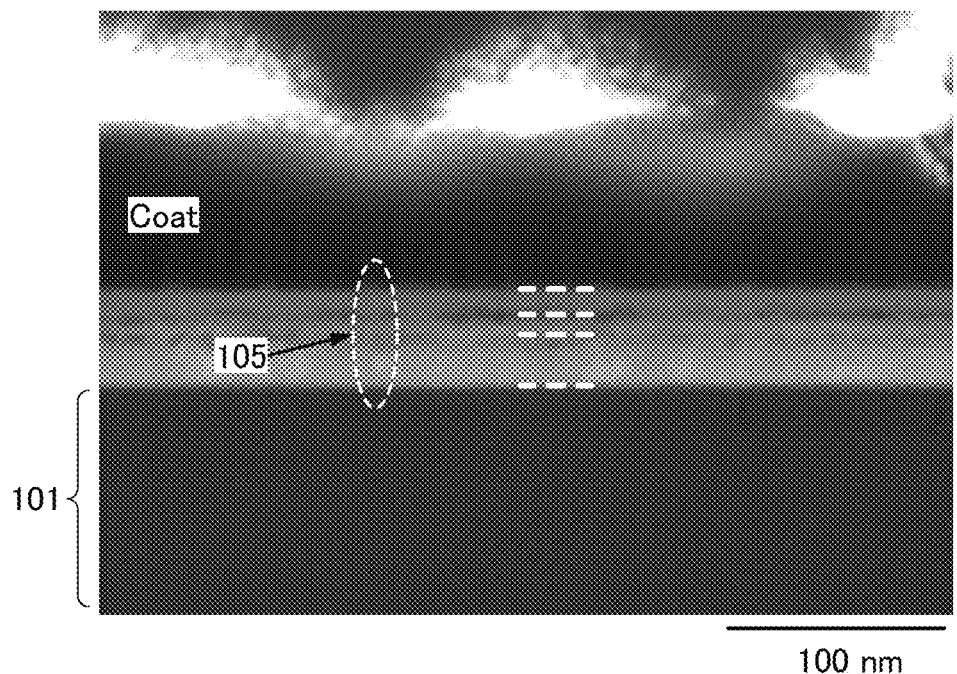
FIGS. 34A and 34B are observation photographs of cross sections of samples in Example 5.

Next, cross-sectional STEM observation of Sample E1 and Sample E2 after peeling was performed. FIG. 34(A) shows cross-sectional observation results of the formation substrate 101 side of Sample E1; and FIG. 34(B) shows cross-sectional observation results of the formation substrate 101 side of Sample E2.

Figure 34B:
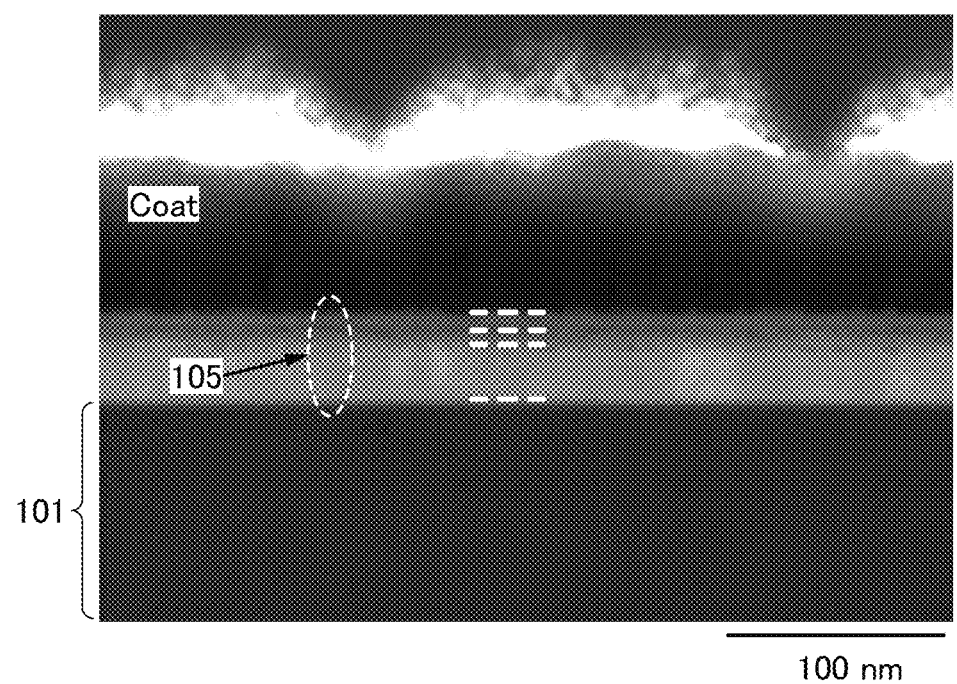

As shown in FIGS. 34(A) and 34(B), it was found that the metal compound layer 105 had a three-layer structure as shown in FIG. 4(E2). The metal compound layer 105 of Sample E1 had a thickness of approximately 48 nm, the first compound layer 111 had a thickness of approximately 16 nm, the second compound layer 112 had a thickness of approximately 9 nm, and the third compound layer 113 had a thickness of approximately 23 nm. The metal compound layer 105 of Sample E2 had a thickness of approximately 43 nm, the first compound layer 111 had a thickness of approximately 10 nm, the second compound layer 112 had a thickness of approximately 7 nm, and the third compound layer 113 had a thickness of approximately 26 nm.

As a result of the cross-sectional observation, the resin layer 123 was not observed between the metal compound layer 105 and the coat layer that was formed for observation, in either Sample E1 or Sample E2. Thus, separation probably occurred between the metal compound layer 105 and the resin layer 123 as illustrated in FIG. 2(C1).

It was checked from the results in this example that the formation substrate 101 can be peeled at the interface between the metal compound layer 105 and the resin layer 123 by the peeling method of one embodiment of the present invention.

Example 6

In this example, results of peeling a functional layer from a formation substrate by the peeling method of one embodiment of the present invention will be described.

<Sample Fabrication>

First, steps before formation of a functional layer over a formation substrate in Sample F in this example will be described with reference to FIG. 4, and then, the step of forming the functional layer over the formation substrate and the subsequent steps will be described with reference to FIG. 2.

First, as illustrated in FIG. 4(A), the metal layer 102 was formed over the formation substrate 101.

As the formation substrate 101, an approximately 0.7-mm-thick glass substrate was used. As the metal layer 102, a titanium film was formed by a sputtering method. At the time of the formation of the titanium film, an argon gas with a flow rate of 100 sccm was used as the process gas, the pressure was 0.3 Pa, and the power was 58 kW. The thickness of the titanium film of Sample F was approximately 35 nm.

Next, $H_2O$ plasma treatment was performed on a surface of the metal layer 102 (FIG. 4(B)) to form the layer 103 containing a metal oxide (FIG. 4(C)). In the $H_2O$ plasma treatment, the bias power was 4500 W, the ICP power was 0 W, the pressure was 15 Pa, the treatment time was 600 sec, and water vapor with a flow rate of 250 sccm was used as the process gas. In this example, the $H_2O$ plasma treatment oxidized the surface side of the metal layer 102. Thus, a stacked-layer structure of the titanium film over the formation substrate 101 and the titanium oxide film over the titanium film was formed as the layer 103 containing a metal oxide.

Next, as illustrated in FIG. 4(D), the first layer 122 was formed over the layer 103 containing a metal oxide.

The first layer 122 was formed using a photosensitive material containing a polyimide resin precursor. The material was applied to a thickness of approximately 3 μm.

Next, the layer 103 containing a metal oxide and the first layer 122 were subjected to baking in a nitrogen-containing atmosphere (while a nitrogen gas was supplied) at 450° C. for two hours, whereby the metal compound layer 105 and the resin layer 123 were formed (FIG. 4(E1)).

Next, as illustrated in FIG. 2(A), the functional layer 135 was formed over the resin layer 123, and a resin film (corresponding to the substrate 146 in FIG. 2(A)) was bonded onto the functional layer 135 with the use of the adhesive layer 145.

As the functional layer 135, a stacked-layer structure including an inorganic insulating film and a transistor was formed. A metal oxide was used for a semiconductor layer of the transistor.

Next, as illustrated in FIG. 2(B), irradiation with the laser light 155 was performed from the formation substrate 101 side. Then, the resin layer 123 was peeled from the formation substrate 101.

As a laser oscillator for the laser light, a XeCl excimer laser with a wavelength of 308 nm was used. The short-axis light-condensing width of the beam was 625 μm, the number of shots was 10, the repetition rate was 60 Hz, the scanning speed was 3.75 mm/second, and the energy density was approximately 440 $mJ/cm^2$.

Note that water was fed to the peeling interface in the peeling.

In Sample F in this example, the functional layer 135 was favorably peeled.

<ToF-SIMS Analysis of Sample after Peeling>

Figure 35:
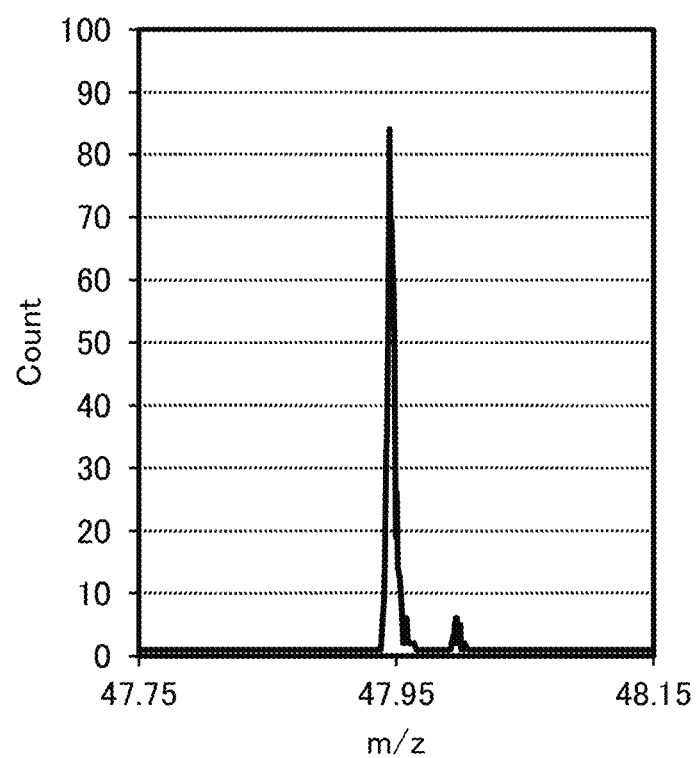
FIG. 35 is ToF-SIMS measurement results of a sample in Example 6.

Next, Sample F after peeling was analyzed by ToF-SIMS. Here, whether or not a peak attributed to titanium (Ti) is detected from a surface of the resin layer 123 exposed by peeling was checked. FIG. 35 shows results of measurement by ToF-SIMS (the vertical axis: Count, the horizontal axis: m/z). The size of the measurement area was 200 μm×200 μm.

As shown in FIG. 35, a peak attributed to Ti was detected from the surface of the resin layer 123.

Through the cross-sectional observation of Sample F which was subjected to peeling by the peeling method of one embodiment of the present invention, no residue of the metal compound layer 105 was observed on the surface of the resin layer 123; however, it was found that the residue of the metal compound layer 105 can be observed by analysis of the surface of the resin layer 123.

Example 7

In this example, results of peeling a functional layer from a formation substrate by the peeling method of one embodiment of the present invention will be described.

First of all, a display device of a comparative example was fabricated and the display state thereof was observed. First, a resin layer (a polyimide film) was formed over and in contact with a formation substrate (a glass substrate), and a layer to be peeled (including a transistor and a display element) was formed over the resin layer. Then, a step in which the layer to be peeled was peeled from the formation substrate by irradiation of the resin layer with laser light through the formation substrate was performed, so that the display device was fabricated.

It was found from the results that when the energy density of the laser light was too high, soot (an object like powder obtained by carbonization of the resin) was likely to be generated.

It was also found that although generation of soot can be inhibited at a low energy density, a residue of the resin layer (the polyimide film) is generated over the formation substrate (the glass substrate), which leads to a reduction in the yield of peeling.

In the case where the resin layer is formed over and in contact with the formation substrate as described above, the favorable range of laser light irradiation conditions is narrow and is difficult to control in some cases.

In view of this, in this example, Sample G1 in which the resin layer was formed over the formation substrate with the metal compound layer therebetween and Comparative sample G2 in which no metal compound layer was formed and the resin layer was formed over and in contact with the formation substrate were fabricated, and surface observation of the surfaces that were exposed by peeling was performed.

<Sample Fabrication>

A method for fabricating Sample G1 will be described with reference to FIGS. 36(A1), 36(B1), 36(C1), 36(D1), and 36(E1). A method for fabricating Comparative sample G2 will be described with reference to FIGS. 36(A2), 36(B2), 36(C2), 36(D2), and 36(E2).

First, as illustrated in FIG. 36(A1), the layer 103 containing a metal oxide was formed over the formation substrate 101 of Sample G1, and the first layer 122 was formed over the layer 103 containing a metal oxide. In contrast, in Comparative sample G2, the layer 103 containing a metal oxide was not formed, and as illustrated in FIG. 36(A2), the first layer 122 was formed in contact with the formation substrate 101.

As the formation substrate 101, an approximately 0.7-mm-thick glass substrate was used.

The layer 103 containing a metal oxide of Sample G1 was formed in such a manner that the metal layer 102 was formed and H$_2$O plasma treatment was performed on a surface of the metal layer 102.

As the metal layer 102, a titanium film was formed by a sputtering method. At the time of the formation of the titanium film, an argon gas with a flow rate of 100 sccm was used as the process gas, the pressure was 0.3 Pa, and the power was 58 kW. The thickness of the titanium film of Sample G1 was approximately 35 nm.

In the H$_2$O plasma treatment, the bias power was 4500 W, the ICP power was 0 W, the pressure was 15 Pa, the treatment time was 120 sec, and water vapor with a flow rate of 250 sccm was used as the process gas.

The first layer 122 was formed using a photosensitive material containing a polyimide resin precursor. The material was applied to a thickness of approximately 2 μm.

Next, the layer 103 containing a metal oxide and the first layer 122 in Sample G1 were subjected to baking in a nitrogen-containing atmosphere (while a nitrogen gas was supplied) at 450° C. for two hours, whereby the metal compound layer 105 and the resin layer 123 were formed (FIG. 36(B1)). In a similar manner, the first layer 122 in Comparative sample G2 was subjected to baking in a nitrogen-containing atmosphere (while a nitrogen gas was supplied) at 450° C. for two hours, whereby the resin layer 123 was formed (FIG. 36(B2)).

Next, as illustrated in FIGS. 36(C1) and 36(C2), the functional layer 135 was formed over the resin layer 123, and the substrate 146 was bonded onto the functional layer 135 with the use of the adhesive layer 145.

As the functional layer 135, a four-layer structure in which 200-nm-thick silicon oxynitride films and 100-nm-thick titanium films were alternately stacked was formed. Note that the silicon oxynitride film was provided over the entire surface of a peeling region, and the titanium film was provided in a layout intended for a wiring. The thickness of the four-layer structure was approximately 600 nm.

A resin film was used as the substrate 146.

<Peeling>

Next, as illustrated in FIGS. 36(D1) and 36(D2), irradiation with the laser light 155 was performed from the formation substrate 101 side.

As a laser oscillator for the laser light, a XeCl excimer laser with a wavelength of 308 nm was used. The short-axis light-condensing width of the beam was 625 μm, the number of shots was 10, the repetition rate was 60 Hz, the scanning speed was 3.75 mm/second, and the energy density was approximately 352 mJ/cm$^2$.

In the case of Sample G1, both the metal compound layer 105 and the resin layer 123 were irradiated with the laser light 155 (see a processing region 156 in FIG. 36(D1)). In the case of Comparative sample G2, the resin layer 123 was irradiated with the laser light 155 (see the processing region 156 in FIG. 36(D2)).

Then, the functional layer 135 was peeled from the formation substrate 101 as illustrated in FIGS. 36(E1) and 36(E2). Water was fed to the peeling interface in the peeling.

As illustrated in FIG. 36(E1), separation occurred at the interface between the metal compound layer 105 and the resin layer 123 in Sample G1. As illustrated in FIG. 36(E2), separation occurred in the resin layer 123 in Comparative sample G2.

<Surface Observation of Sample after Peeling>

Figure 37A:
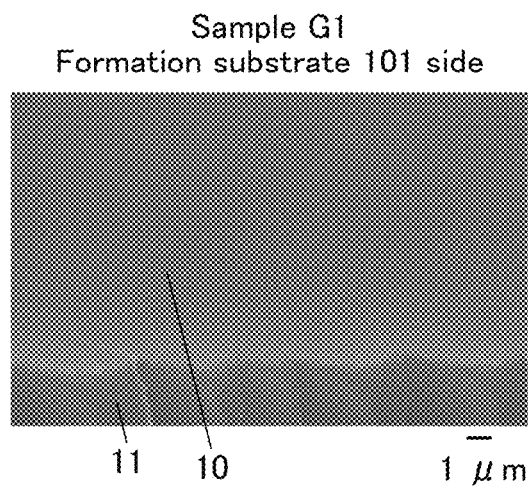
FIGS. 37A-37D are SEM photographs of samples in Example 7.
Figure 37B:
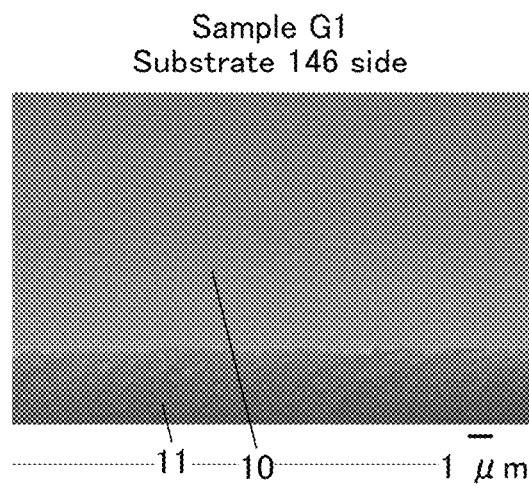
Figure 37C:
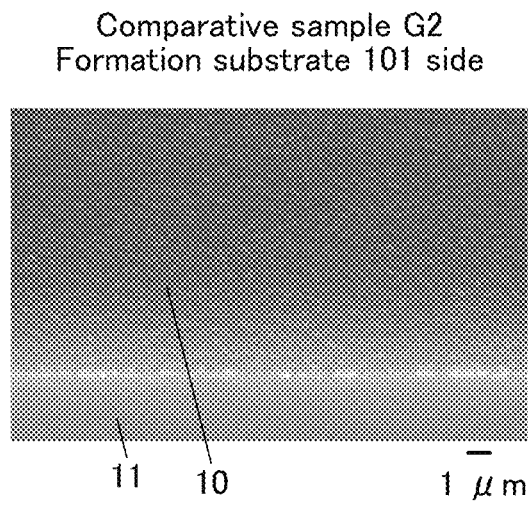
Figure 37D:
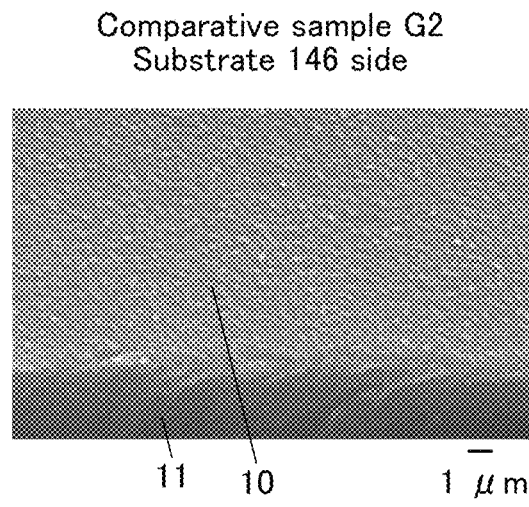

Next, surface observation of the surface exposed by peeling in each sample (hereinafter also referred to as a peeling surface) was performed with a scanning electron microscope (SEM). FIG. 37 shows SEM photographs of the peeling surfaces (Formation substrate 101 side and Substrate 146 side) of the samples (Sample G1 and Comparative sample G2). FIG. 37(A) is the SEM photograph of the peeling surface of Sample G1 on the formation substrate 101 side. FIG. 37(B) is the SEM photograph of the peeling surface of Sample G1 on the substrate 146 side. FIG. 37(C) is the SEM photograph of the peeling surface of Comparative sample G2 on the formation substrate 101 side. FIG. 37(D) is the SEM photograph of the peeling surface of Comparative sample G2 on the substrate 146 side.

At the time of the SEM observation, each sample was placed with the peeling surface facing upward, and the observation was performed under a condition where the stage tilt angle was 30°.

Note that in each diagram, an upper region 10 is a surface exposed by peeling, and a lower region 11 is a cut surface (partly including a crack) at the time of fabricating the sample for the SEM observation.

A comparison between the regions 10 in FIGS. 37(A) and 37(B) and the regions 10 in FIGS. 37(C) and 37(D) showed that the peeling surface of Sample G1 was less uneven than the peeling surface of Comparative sample G2, with regard to each of the peeling surface on the formation substrate 101 side and the peeling surface on the substrate 146 side.

Soot was not observed through optical microscope observation of Comparative sample G2 but unevenness on the peeling surface observed through the SEM observation probably originated from finer soot.

When the peeling surface on the substrate 146 side has much unevenness and moreover, soot is generated, for example, display quality sometimes decreases in the case where the peeling surface is positioned on the display surface side of a display device. In addition, when the peeling surface on the formation substrate 101 side has much unevenness and moreover, soot is generated, the reuse of the formation substrate 101 is difficult in some cases.

The above results suggested that when peeling is performed using the metal compound layer as in Sample G1, unevenness on the peeling surface and generation of soot can be inhibited and a reduction in display quality of the display device can be inhibited. In addition, it was suggested that peeling using the metal compound layer facilitates the reuse of the formation substrate.

Example 8

In this example, results of fabrication of transistors with the use of one embodiment of the present invention and evaluation of the $I_d$-$V_g$ characteristics and the reliability will be described.

First, a method for fabricating the transistor and results of the evaluation of the $I_d$-$V_g$ characteristics of the transistor will be described. Next, a method for fabricating a transistor and results of the evaluation of the reliability of the transistor will be described.

<Fabrication 1 of Transistor>

A method for fabricating the transistor of this example will be described with reference to FIGS. 36(A1), 36(B1), 36(C1), 36(D1), and 36(E1).

First, as illustrated in FIG. 36(A1), the layer 103 containing a metal oxide was formed over the formation substrate 101, and the first layer 122 was formed over the layer 103 containing a metal oxide.

As the formation substrate 101, an approximately 0.7-mm-thick glass substrate was used.

The layer 103 containing a metal oxide was formed in such a manner that the metal layer 102 was formed and $H_2O$ plasma treatment was performed on a surface of the metal layer 102.

As the metal layer 102, a titanium film was formed by a sputtering method. At the time of the formation of the titanium film, an argon gas with a flow rate of 100 sccm was used as the process gas, the pressure was 0.3 Pa, and the power was 58 kW. The thickness of the titanium film was approximately 35 nm.

In the $H_2O$ plasma treatment, the bias power was 4500 W, the ICP power was 0 W, the pressure was 15 Pa, the treatment time was 600 sec, and water vapor with a flow rate of 250 sccm was used as the process gas.

The first layer 122 was formed using a photosensitive material containing a polyimide resin precursor. The material was applied to a thickness of approximately 3 μm.

Next, the layer 103 containing a metal oxide and the first layer 122 were subjected to baking in a nitrogen-containing atmosphere (while a nitrogen gas was supplied) at 450° C. for two hours, whereby the metal compound layer 105 and the resin layer 123 were formed (FIG. 36(B1)).

Next, as illustrated in FIG. 36(C1), the functional layer 135 was formed over the resin layer 123, and the substrate 146 was bonded onto the functional layer 135 with the use of the adhesive layer 145.

As the functional layer 135, the insulating layer 141 and the transistor over the insulating layer 141 were formed. The transistor is of a top-gate self-aligned (TGSA) type, like the transistor 210 illustrated in FIG. 16(A), and includes the conductive layer 201 functioning as a back gate in addition to the conductive layer 205 functioning as a gate. A CAC-IGZO was used for a semiconductor layer. The channel length of the transistor was 2 μm and the channel width thereof was 2 μm.

A resin film was used as the substrate 146.

Next, as illustrated in FIG. 36(D1), irradiation with the laser light 155 was performed from the formation substrate 101 side. Then, the functional layer 135 was peeled from the formation substrate 101 as illustrated in FIG. 36(E1). Water was fed to the peeling interface in the peeling.

As a laser oscillator for the laser light, a XeCl excimer laser with a wavelength of 308 nm was used. The short-axis light-condensing width of the beam was 625 μm, the number of shots was 10, the repetition rate was 60 Hz, the scanning speed was 3.75 mm/second, and the energy density was approximately 352 mJ/cm².

<$I_d$-$V_g$ Characteristics of Transistor>

Figure 38:
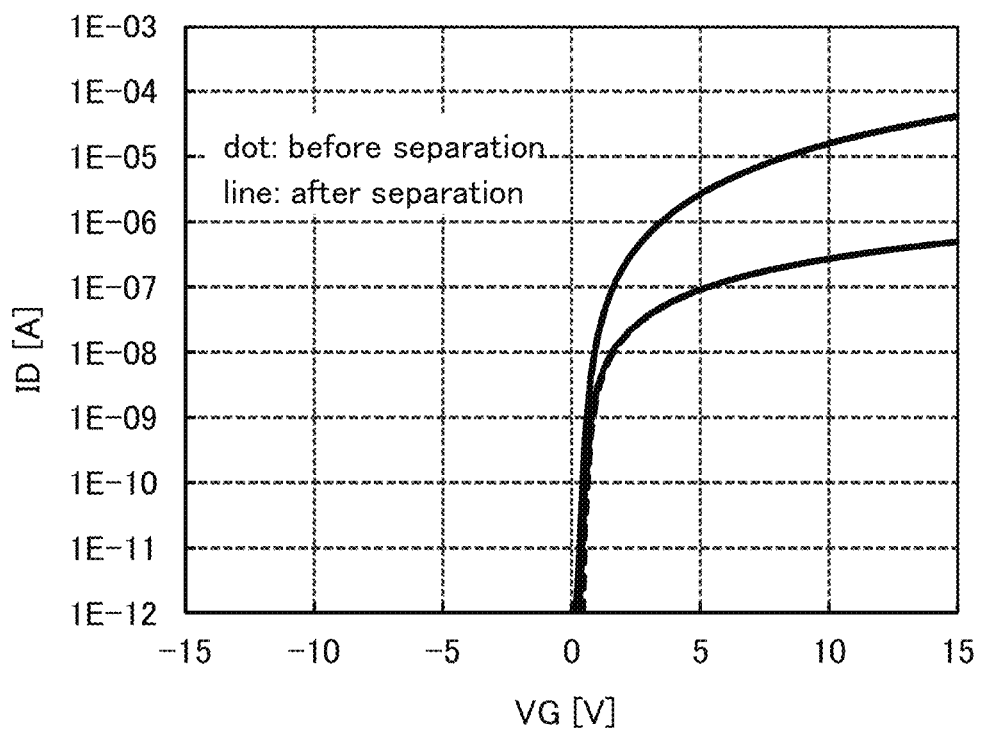
FIG. 38 is $I_d$-$V_g$ characteristics of a transistor in Example 8.

FIG. 38 shows the $I_d$-$V_g$ characteristics of the transistor before and after the peeling by the laser light irradiation. FIG. 38 shows the results at $V_d$=0.1 V and $V_d$=10 V. In FIG. 38, a dotted line (dot) shows the results before the peeling (before separation) and a solid line (line) shows the results after the peeling (after separation). In FIG. 38, the $I_d$-$V_g$ characteristics before and after the peeling substantially overlap with each other. As shown in FIG. 38, no significant change between before and after the peeling was observed, and normally-off characteristics were exhibited even with a channel length of 2 μm.

<Fabrication 2 of Transistor>

A method for fabricating the transistor of this example will be described with reference to FIGS. 36(A1), 36(B1), 36(C1), 36(D1), and 36(E1).

First, as illustrated in FIG. 36(A1), the layer 103 containing a metal oxide was formed over the formation substrate 101 and the first layer 122 was formed over the layer 103 containing a metal oxide.

As the formation substrate 101, an approximately 0.7-mm-thick glass substrate was used.

The layer 103 containing a metal oxide was formed in such a manner that the metal layer 102 was formed and $H_2O$ plasma treatment was performed on a surface of the metal layer 102.

As the metal layer 102, a titanium film was formed by a sputtering method. At the time of the formation of the titanium film, an argon gas with a flow rate of 100 sccm was used as the process gas, the pressure was 0.3 Pa, and the power was 58 kW. The thickness of the titanium film was approximately 35 nm.

In the $H_2O$ plasma treatment, the bias power was 4500 W, the ICP power was 0 W, the pressure was 15 Pa, the treatment time was 120 sec, and water vapor with a flow rate of 250 sccm was used as the process gas.

The first layer 122 was formed using a photosensitive material containing a polyimide resin precursor. The material was applied to a thickness of approximately 2 μm.

Next, the layer 103 containing a metal oxide and the first layer 122 were subjected to baking in a nitrogen-containing atmosphere (while a nitrogen gas was supplied) at 450° C. for two hours, whereby the metal compound layer 105 and the resin layer 123 were formed (FIG. 36(B1)).

Next, as illustrated in FIG. 36(C1), the functional layer 135 was formed over the resin layer 123, and the substrate 146 was bonded onto the functional layer 135 with the use of the adhesive layer 145.

Figure 39:
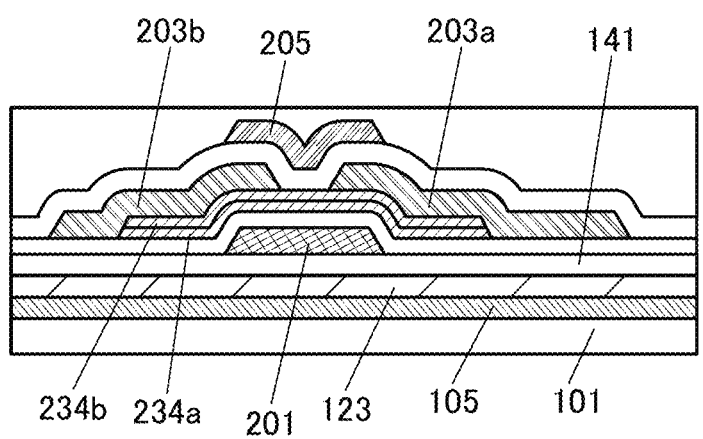
FIG. 39 is a cross-sectional view illustrating a transistor in Example 8.

As the functional layer 135, the insulating layer 141 and the transistor over the insulating layer 141 were formed (see FIG. 39). The transistor is of a channel-etched type and has a dual-gate structure including the conductive layer 201 functioning as a gate and the conductive layer 205 functioning as a back gate. A metal oxide layer 234a includes CAC-IGZO, and a metal oxide layer 234b includes CAAC-IGZO. The channel length of the transistor was 3 μm and the channel width thereof was 50 μm.

A water-soluble resin was used for the adhesive layer 145 and a UV-peeling tape was used for the substrate 146.

Next, as illustrated in FIG. 36(D1), irradiation with the laser light 155 was performed from the formation substrate 101 side. Then, the functional layer 135 was peeled from the formation substrate 101 as illustrated in FIG. 36(E1). Water was fed to the peeling interface in the peeling.

As a laser oscillator for the laser light, a XeCl excimer laser with a wavelength of 308 nm was used. The short-axis light-condensing width of the beam was 625 μm, the number of shots was 10, the repetition rate was 60 Hz, the scanning speed was 3.75 mm/second, and the energy density was approximately 360 mJ/cm$^2$.

After the peeling, the exposed resin layer 123 and the resin film were bonded to each other with the use of an adhesive. Next, ultraviolet light irradiation was performed from the substrate 146 side and the substrate 146 was peeled. Then, the adhesive layer 145 was removed by washing with water.

<Gate Bias-Temperature Stress Test>

Next, a stress test was performed on the transistor after the peeling. As the stress test, a gate bias temperature (GBT) stress test was used. A GBT stress test is a kind of an accelerated test and can evaluate a change in transistor characteristics due to long-term use in a short time. Here, in the GBT stress test, a substrate over which the transistor was formed was held at 60° C., a voltage of 0 V was applied to a source and a drain of the transistor, and a voltage of 30 V or −30 V was applied to a gate; this state was held for one hour. In this case, a test in which a positive voltage is applied to the gate is referred to as PBTS, and a test in which a negative voltage is applied to the gate is referred to as NBTS. A voltage of 30 V or −30 V was applied to the gate under light irradiation with a white LED at 10000 1x; this state was held for one hour. In this case, a test in which a positive voltage is applied to the gate is referred to as PBITS, and a test in which a negative voltage is applied to the gate is referred to as NBITS.

Figure 40:
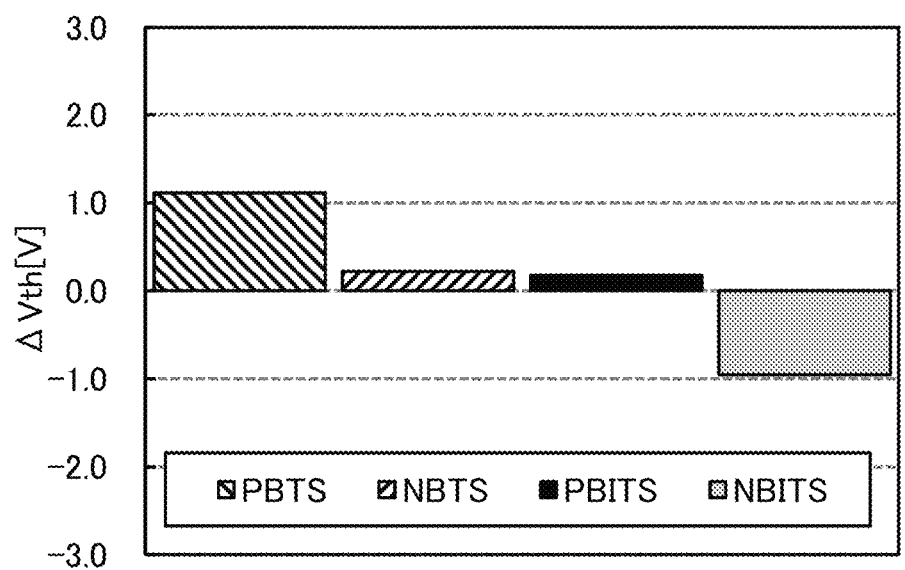
FIG. 40 is GBT stress test results of a transistor in Example 8.

FIG. 40 shows the results of the GBT stress test. FIG. 40 shows that favorable results were obtained in which the amount of change in threshold value (ΔVth) was approximately smaller than or equal to ±1 V. This showed that a transistor having favorable characteristics can be fabricated even when a peeling process is performed using one embodiment of the present invention.

Note that a factor of the favorable results obtained in the GBT stress test is presumably as follows, for example: that the transistor includes, as the metal oxide film, a stack of the CAC-OS film and the CAAC-OS film and thus a buried channel is formed, and that an influence of defects and damage at an interface between the metal oxide film and the insulating film at the back channel is reduced.

Example 9

In this example, results of fabrication of a flexible OLED display using one embodiment of the present invention will be described.

<Fabrication of Flexible OLED Display>

A flexible OLED display fabricated in this example is an active matrix organic EL display that has a display region with a diagonal of 8.67 inches, 1080×1920 effective pixels, a resolution of 254 ppi, and an aperture ratio of 46.0%. The flexible OLED display includes a scan driver and is externally provided with a source driver by COF.

A channel-etched transistor using a CAC-OS was used as a transistor.

As a light-emitting element, a tandem (stacked-layer) organic EL element emitting white light was used. The light-emitting element has a top-emission structure, and light from the light-emitting element is extracted to the outside of the display through a color filter.

The flexible OLED display of this example was fabricated using Fabrication method example 2 in Embodiment 3. Specifically, a formation substrate over which the transistor and the like were formed and a formation substrate over which the color filter and the like were formed were bonded to each other and a peeling process was performed twice, so that the transistor, the color filter, and the like were transferred to a film substrate.

A polyimide resin was used for the resin layer formed over the formation substrate where the transistor and the like were formed. The use of a polyimide resin having higher heat resistance than an acrylic resin allows the transistor to be formed at a relatively high temperature and can improve the transistor characteristics.

An acrylic resin was used for the resin layer formed over the formation substrate where the color filter and the like were formed. The use of an acrylic resin having a higher visible-light-transmitting property than a polyimide resin enables high light extraction efficiency even when the resin layer remains.

Components on the formation substrate side where the color filter and the like were formed will be described with reference to FIG. 42(A). Unlike in the structure illustrated in FIG. 15(A), the coloring layer 197 and the light-blocking layer 198 were formed over and in contact with the resin layer 123a in this example. The coloring layer 197 and the light-blocking layer 198 were covered with an overcoat 196, and the insulating layer 191 was provided over the overcoat 196. In this example, an acrylic resin was used as the material for the overcoat 196, and a silicon nitride film was formed as the insulating layer 191.

Figure 42A:
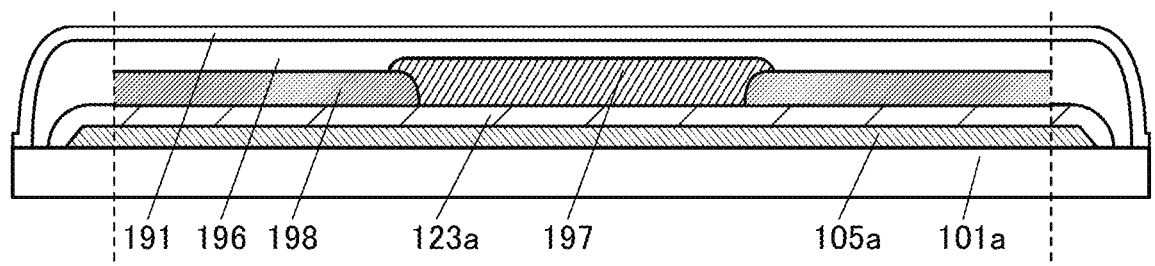
FIG. 42(A) A drawing illustrating a structure of a display in Example 9.

The insulating layer 191 is positioned closer to the neutral plane of the flexible OLED display in the structure of FIG. 42(A) than in the structure of FIG. 15(A). Therefore, generation of a display defect or the like due to bending can be inhibited. Meanwhile, in the structure of FIG. 15(A), the insulating layer 191 can be formed at high temperatures regardless of the heat resistance of materials (e.g., a resin) used for the coloring layer 197, the light-blocking layer 198, the overcoat, and the like. Thus, depending on the materials for the layers, the insulating layer 191 having a high barrier property might be more easily obtained in the structure of FIG. 15(A) than in the structure of FIG. 42(A).

Figure 41A:
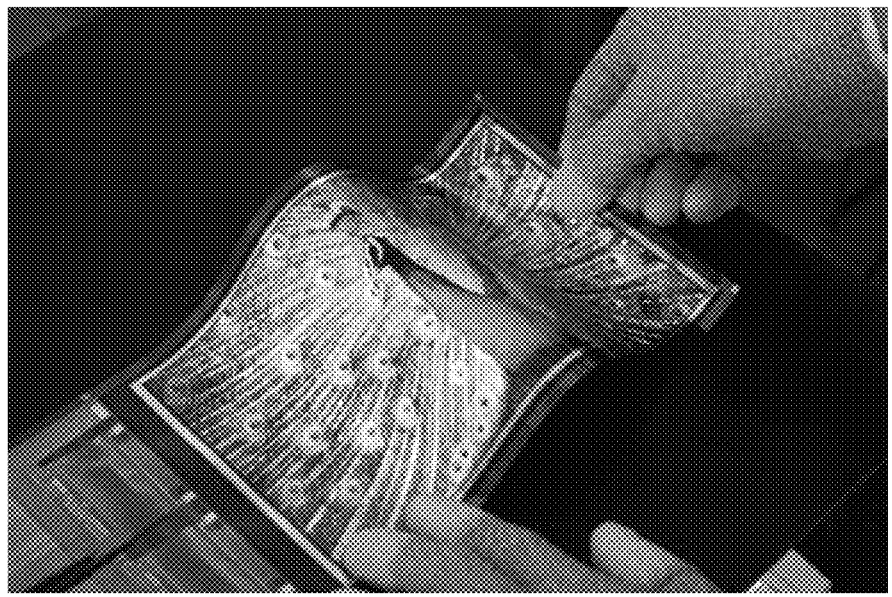
FIGS. 41A-41D are display photographs of a display in Example 9.

FIG. 41(A) shows display results of the flexible OLED display fabricated in this example. As shown in FIG. 41(A), display defects due to peeling by laser irradiation were not found, and normal light emission was observed.

<Repeated Bending Test>

Figure 41B:
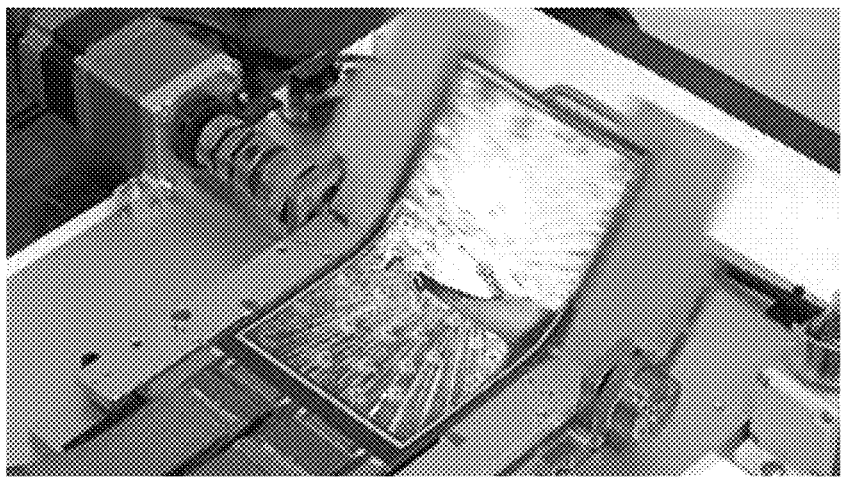

Next, the flexible OLED display was subjected to a repeated bending test. The repeated bending test was performed with the use of a book-type repeated bend tester illustrated in FIGS. 42(B) and 42(C). FIG. 41(B) shows the state in which the bending test was performed.

Figure 42B:
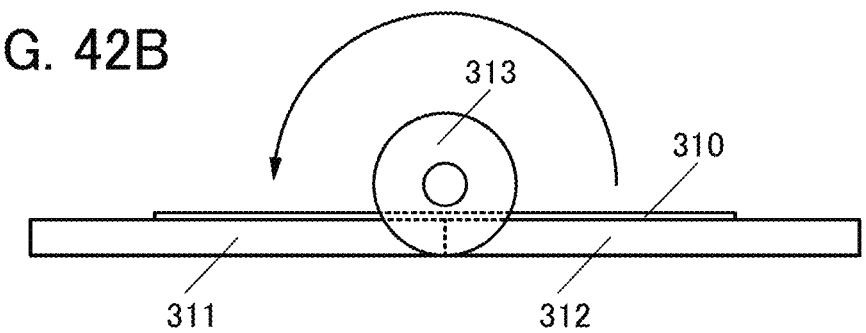
FIG. 42(B) and FIG. 42(C) Drawings illustrating a bend tester in Example 9.
Figure 42C:
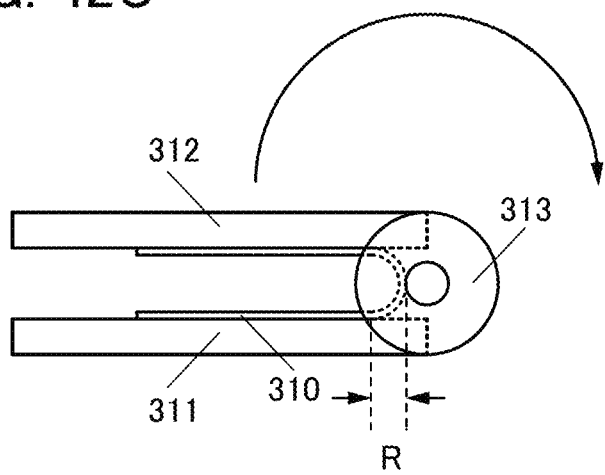

The tester illustrated in FIGS. 42(B) and 42(C) includes a stage 311, a stage 312, and a rotation axis 313. The stage 311 and the stage 312 are connected by the rotation axis 313. A display panel 310 is positioned over the stage 311 and the stage 312. With a rotating mechanism of the rotation axis 313, the stage 312 turns 180° from the state of FIG. 42(B) to the state of FIG. 42(C). Thus, the display panel 310 is bent with a radius of curvature R. Furthermore, the stage 312 turns 180° from the state of FIG. 42(C) to the state of FIG. 42(B) with the rotating mechanism. Thus, the display panel 310 is returned from the bent state to a flat shape. The repeated bending test is performed by repeating the state of FIG. 42(B) and the state of FIG. 42(C). The rate of the bending test was 2 seconds/time.

In this example, an outward bending test in which the display panel was bent such that the display surface of the display panel faced outward and an inward bending test in which the display panel was bent such that the display surface of the display panel faced inward were performed. Two radii of curvature R were set: 2.0 mm and 3.0 mm. The number of times of repeating bending in one test was 100000.

Figure 41C:
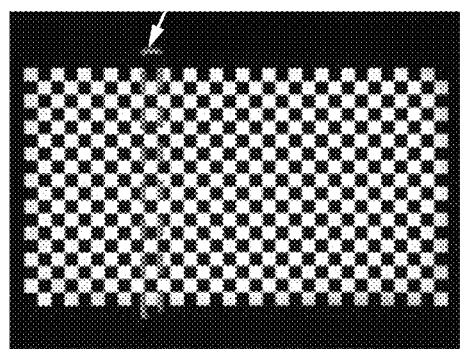
Figure 41D:
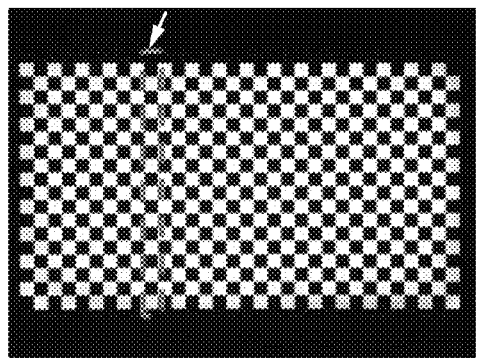

FIG. 41(C) shows a display photograph before the repeated bending test (Before bending test), and FIG. 41(D) shows a display photograph after the repeated bending test (After bending test). As shown in FIGS. 41(C) and 41(D), the Bended portion includes a display region. Even after bending was repeated 100000 times with a radius of curvature of 2 mm, display defects due to bending were not found and normal light emission was observed. [Example 10]

In this example, results of fabrication of a flexible OLED display using one embodiment of the present invention will be described.

<Fabrication of Flexible OLED Display>

A flexible OLED display fabricated in this example is an active matrix organic EL display that has a display region with a diagonal of 8.34 inches, 7680×4320 effective pixels (8K4K), a resolution of 1058 ppi, and a pixel size of 24 μm×24 μm. The flexible OLED display includes a scan driver and is externally provided with a source driver IC.

A top gate self align (TGSA) transistor using a CAC-OS was used as a transistor.

As a light-emitting element, a tandem (stacked-layer) organic EL element emitting white light was used. The light-emitting element has a top-emission structure, and light from the light-emitting element is extracted to the outside of the display through a color filter.

In the fabrication method of the flexible OLED display of this example, a formation substrate over which the transistor and the like were formed and a formation substrate over which the color filter and the like were formed were bonded to each other and a peeling process was performed twice, so that the transistor, the color filter, and the like were transferred to a film substrate. In this example, one embodiment of the present invention was applied to the peeling process of the formation substrate over which the transistor and the like were formed. Specifically, the transistor, the light-emitting element, and the like were formed over the formation substrate with a metal compound layer and a resin layer (a polyimide film) provided therebetween. Meanwhile, in the peeling process of the formation substrate over which the color filter and the like were formed, an inorganic peeling layer (a tungsten oxide film) was used.

Figure 43:
FIG. 43 is a display photograph of a display in Example 10.

FIG. 43 shows display results of the flexible OLED display fabricated in this example. As shown in FIG. 43, display defects due to peeling by laser irradiation were not found, and normal light emission was observed.

DESCRIPTION OF NUMERALS 10 region
11 region
14 formation substrate
20 metal compound layer
23 resin layer
26 linear beam
27 processing region
55 laser light
56 stack
56a member to be peeled
56b support
57a first layer
57b second layer
58 formation substrate
59 stack
101 formation substrate
101a formation substrate
101b formation substrate
102 metal layer
102a metal layer
103 layer containing metal oxide
103a layer containing metal oxide
104 metal nitride layer
105 metal compound layer
105a metal compound layer
105b metal compound layer
110 plasma
111 first compound layer
111a first compound layer
112 second compound layer
112a second compound layer
113 third compound layer
113a third compound layer
122 first layer
122a first layer
123 resin layer
123a resin layer
123b resin layer
135 functional layer
141 insulating layer
145 adhesive layer
146 substrate
153 instrument
154 region
155 laser light
156 processing region
157 liquid feeding mechanism
158 foreign matter
159 region
160 light-emitting element
161 first electrode
162 EL layer
163 second electrode
165 insulating layer
167 insulating layer
171 conductive layer
172 auxiliary wiring
173 conductive layer
174 adhesive layer
175 substrate
176 adhesive layer
177 substrate
178 insulating layer
181 conductive layer
182 conductive layer 183 conductive layer
184 insulating layer
185 insulating layer
191 insulating layer
195 adhesive layer
196 overcoat
197 coloring layer
198 light-blocking layer
201 conductive layer
202 insulating layer
203a conductive layer
203b conductive layer
204 semiconductor layer
204a channel region
204b low-resistance region
205 conductive layer
206 insulating layer
207 insulating layer
208 insulating layer
209 insulating layer
210 transistor
211 insulating layer
212 insulating layer
213 insulating layer
214a channel region
214b low-resistance region
214c LDD region
220 transistor
224 semiconductor layer
225 impurity semiconductor layer
226 insulating layer
230 transistor
240 transistor
600 tape
601 support
602 tape reel
604 direction changing roller
606 press roller
606a hollow cylinder
606b circular cylinder
607 direction changing roller
609 carrier plate
610 laser irradiation unit
610a laser light
610b laser light
610c laser light
610d laser light
610e linear beam
613 reel
614 drying mechanism
617 roller
620 ionizer
630 substrate reversing unit
631 guide roller
632 guide roller
633 guide roller
634 guide roller
635 optical system
639 ionizer
640 processing region
641 substrate load cassette
642 substrate unload cassette
643 transfer roller
644 transfer roller
645 transfer roller
646 transfer roller
650 mirror
659 liquid feeding mechanism
660 excimer laser apparatus
665 guide roller
666 guide roller
670 separation tape
671 support
672 tape reel
673 reel
674 guide roller
675 press roller
676 direction changing roller
677 guide roller
678 guide roller
679 guide roller
680 lens
683 reel
7000 display portion
7100 television device
7101 housing
7103 stand
7111 remote controller
7200 laptop personal computer
7211 housing
7212 keyboard
7213 pointing device
7214 external connection port
7300 digital signage
7301 housing
7303 speaker
7311 information terminal
7400 digital signage
7401 pillar
7411 information terminal
9000 housing
9001 display portion
9003 speaker
9005 operation key
9006 connection terminal
9007 sensor
9008 microphone
9055 hinge
9200 portable information terminal
9201 portable information terminal
9202 portable information terminal This application is based on Japanese Patent Application Serial No. 2017-050894 filed with Japan Patent Office on Mar. 16, 2017 and Japanese Patent Application Serial No. 2017-098999 filed with Japan Patent Office on May 18, 2017, the entire contents of which are hereby incorporated herein by reference.

What is claimed is:
1. A light-emitting device comprising:
a flexible substrate;
an adhesive layer over the flexible substrate;
a resin layer containing titanium over the adhesive layer;
a first insulator over the resin layer;
a first conductor over the first insulator;
a second insulator over the first conductor;
a semiconductor layer over the second insulator;
a third insulator over the semiconductor layer;
a second conductor over the third insulator;
a first electrode over the second conductor;
an EL layer over the first electrode; and
a second electrode over the EL layer.

2. The light-emitting device according to claim 1,
wherein the semiconductor layer comprises a metal oxide, and
wherein the resin layer comprises a polyimide resin.

3. The light-emitting device according to claim 1,
wherein the semiconductor layer comprises hydrogenated amorphous silicon, and
wherein the resin layer comprises an acrylic resin.

4. The light-emitting device according to claim 1,
wherein the semiconductor layer comprises polysilicon, and
wherein the resin layer comprises a polyimide resin.

5. The light-emitting device according to claim 1,
wherein the resin layer comprises a region with a thickness of greater than or equal to 0.1 µm and less than or equal to 5 µm.

6. The light-emitting device according to claim 1,
wherein the resin layer has an average transmittance of light in a wavelength range of greater than or equal to 450 nm and less than or equal to 700 nm of 70% or higher.

7. The light-emitting device according to claim 1,
wherein titanium is detected in surface analysis of a surface of the resin layer on an adhesive layer side, and
wherein the surface analysis is performed by time-of-flight secondary ion mass spectrometry.

8. A light-emitting device comprising:
a first flexible substrate;
a first adhesive layer over the first flexible substrate;
a first resin layer containing titanium over the first adhesive layer;
a first insulator over the first resin layer;
a first conductor over the first insulator;
a second insulator over the first conductor;
a semiconductor layer over the second insulator;
a third insulator over the semiconductor layer;
a second conductor over the third insulator;
a first electrode over the second conductor;
an EL layer over the first electrode;
a second electrode over the EL layer;
a second adhesive layer over the second electrode;
a coloring layer over the second adhesive layer;
a second resin layer over the coloring layer;
a third adhesive layer over the second resin layer; and
a second flexible substrate.

9. The light-emitting device according to claim 8,
wherein the semiconductor layer comprises a metal oxide, and
wherein the first resin layer comprises a polyimide resin.

10. The light-emitting device according to claim 8,
wherein the semiconductor layer comprises hydrogenated amorphous silicon, and
wherein the first resin layer comprises an acrylic resin.

11. The light-emitting device according to claim 8,
wherein the semiconductor layer comprises polysilicon, and
wherein the first resin layer comprises a polyimide resin.

12. The light-emitting device according to claim 8,
wherein the first resin layer comprises a region with a thickness of greater than or equal to 0.1 µm and less than or equal to 5 µm.

13. The light-emitting device according to claim 8,
wherein the first resin layer has an average transmittance of light in a wavelength range of greater than or equal to 450 nm and less than or equal to 700 nm of 70% or higher.

14. The light-emitting device according to claim 8,
wherein titanium is detected in surface analysis of a surface of the first resin layer on an adhesive layer side, and
wherein the surface analysis is performed by time-of-flight secondary ion mass spectrometry.

* * * * *